US009978980B2

(12) United States Patent
Goushi et al.

(10) Patent No.: US 9,978,980 B2
(45) Date of Patent: May 22, 2018

(54) ORGANIC ELECTROLUMINESCENT DEVICE

(71) Applicant: KYUSHU UNIVERSITY, NATIONAL UNIVERSITY CORPORATION, Fukuoka-shi, Fukuoka (JP)

(72) Inventors: Kenichi Goushi, Fukuoka (JP); Yuta Hirayama, Fukuoka (JP); Chihaya Adachi, Fukuoka (JP)

(73) Assignee: KYULUX, INC., Fukuoka (JP)

( * ) Notice: Subject to any disclaimer, the term of this patent is extended or adjusted under 35 U.S.C. 154(b) by 0 days. days.

(21) Appl. No.: 15/022,244

(22) PCT Filed: Sep. 12, 2014

(86) PCT No.: PCT/JP2014/074174
§ 371 (c)(1),
(2) Date: Mar. 16, 2016

(87) PCT Pub. No.: WO2015/041157
PCT Pub. Date: Mar. 26, 2015

(65) Prior Publication Data
US 2016/0248036 A1    Aug. 25, 2016

(30) Foreign Application Priority Data
Sep. 17, 2013 (JP) .................. 2013-192357

(51) Int. Cl.
*H01L 51/50* (2006.01)
*H01L 51/00* (2006.01)

(52) U.S. Cl.
CPC ...... *H01L 51/5096* (2013.01); *H01L 51/0071* (2013.01); *H01L 51/0074* (2013.01);
(Continued)

(58) Field of Classification Search
CPC ............. H01L 51/5096; H01L 51/5024; H01L 51/5016; H01L 51/0071; H01L 51/5012;
(Continued)

(56) References Cited

U.S. PATENT DOCUMENTS 7,768,194 B2 * 8/2010 Forrest ............... H01L 51/0072
313/504
8,525,159 B2 * 9/2013 Terao ................. H01L 51/5004
257/40
(Continued)

FOREIGN PATENT DOCUMENTS

CN     102113414        6/2011
CN     102648268 A      8/2012
(Continued)

OTHER PUBLICATIONS

Jie Li, Tetsuya Nakagawa, James MacDonald, Qisheng Zhang, Hiroko Nomura, Hiroshi Miyazaki and Chihaya Adachi, "Highly Efficient Organic Light-Emitting Diode Based on a Hidden Thermally Activated Delayed Fluorescence Channel in a Heptazine Derivatiive", Advanced Materials, Jun. 20, 2013, Wiley-VCH Verlag GmbH & Co., pp. 3319-3323.*

(Continued)

*Primary Examiner* — William Coleman
(74) *Attorney, Agent, or Firm* — Browdy and Neimark, P.L.L.C.

(57) ABSTRACT

An organic electroluminescent device comprising at least two organic layers including a light emitting layer (5) and a delayed fluorescent exciplex layer (7) containing a donor compound and an acceptor compound, between a pair of electrodes (2, 9) is highly efficient in formation of a singlet excited state and enables high light emission efficiency.

8 Claims, 7 Drawing Sheets

(52) U.S. Cl.
CPC ...... *H01L 51/5012* (2013.01); *H01L 51/5016* (2013.01); *H01L 51/5024* (2013.01); *H01L 51/006* (2013.01); *H01L 51/0058* (2013.01); *H01L 51/0059* (2013.01); *H01L 51/0072* (2013.01); *H01L 2251/55* (2013.01)

(58) Field of Classification Search
CPC .............. H01L 51/0058; H01L 51/0072; H01L 51/006
See application file for complete search history.

(56) References Cited

U.S. PATENT DOCUMENTS

| | | |
|---|---|---|
| 2012/0217869 A1 | 8/2012 | Adachi et al. |
| 2012/0235127 A1 | 9/2012 | Takasu et al. |
| 2012/0242219 A1 | 9/2012 | Seo et al. |
| 2014/0034927 A1 | 2/2014 | Seo et al. |
| 2014/0034930 A1 | 2/2014 | Seo et al. |

FOREIGN PATENT DOCUMENTS

| | | |
|---|---|---|
| CN | 102683615 A | 9/2012 |
| CN | 104471735 A | 3/2015 |
| JP | 2008-516440 A | 5/2008 |
| JP | 2011-249698 A | 8/2011 |
| JP | 2012-193352 A | 10/2012 |
| JP | 2012-195517 A | 10/2012 |
| JP | 2014-044942 A | 3/2014 |
| JP | 2014-045179 A | 3/2014 |
| JP | 2014-220450 A | 11/2014 |
| TW | 504943 | 10/2002 |
| TW | 566054 | 12/2003 |
| TW | 200950172 | 12/2009 |
| WO | 2006038020 A1 | 4/2006 |
| WO | 2006/130883 | 12/2006 |
| WO | 2012/099241 A1 | 7/2012 |

OTHER PUBLICATIONS

Kenichi Goushi et al., Efficient organic light-emitting diodes through up-conversion from triplet to singlet excited states of exciplexes, Applied Physics Letters, 101:023306-1-4 (2012).

Takuya Kawata et al., SID Symposium Digest of Technical Papers, 44(1):685-688 (2013).

Japanese and English language of International Preliminary Report on Patentability of Chapter I, i.e., International Search Opinion, dated Dec. 17, 2014, in corresponding International PCT Application No. PCT/JP2014/074174.

European search report from Application No. 14846505.7 dated Mar. 22, 2017.

First Office Action issued in corresponding Chinese Application No. 201480051330.1, dated Nov. 3, 2016, with English Machine Translation.

Taiwanese office action dated Dec. 27, 2017 for Taiwanese patent application No. 103131977.

\* cited by examiner (a)

(b)

(c)

ORGANIC ELECTROLUMINESCENT DEVICE

TECHNICAL FIELD

The present invention relates to an organic electroluminescent device capable of providing a high light emission efficiency.

BACKGROUND ART

Studies are being made for increasing the light emission efficiency of an organic electroluminescent device (organic EL device). In particular, various studies have been made for enhancing the light emission efficiency by developing and combining organic layers having various functions constituting the organic electroluminescent device. Among the studies, there are studies relating to an organic electroluminescent device that utilizes energy transfer from the organic layer to the light emitting layer by providing an organic layer for forming excitons.

For example, Patent Document 1 describes an organic electroluminescent device having a light emitting region held between a pair of electrodes, in which the light emitting region has a fluorescent light emitting layer, a phosphorescent light emitting layer, and an exciton forming layer disposed between the fluorescent light emitting layer and the phosphorescent light emitting layer, and describes an example using CBP (4,4'-bis(carbazol-9-yl)biphenyl) as a material of the exciton forming layer. The organic electroluminescent device has an energy barrier interface of the carrier between the fluorescent light emitting layer and the exciton forming layer, and the carrier is accumulated in the barrier interface on the side of the exciton forming layer, thereby forming excitons. Among the excitons thus formed, singlet excitons undergo energy transfer to the fluorescent material of the fluorescent light emitting layer through the Foerster mechanism, and cause fluorescent light emission through excitation of the fluorescent singlet. On the other hand, triplet excitons enter the phosphorescent light emitting layer through energy transfer of the Dexter mechanism, and cause phosphorescent light emission through excitation of the phosphorescent triplet. The formation probability of the excitons formed through the recombination of the carrier is 25% for the singlet excitons and 75% for the triplet excitons, and it is stated that in the organic electroluminescent device, both the singlet excitons and the triplet excitons thus formed can be efficiently made to contribute to the light emission due to the aforementioned constitution.

CITATION LIST

Patent Literature

Patent Document 1: JP-A-2011-249698

SUMMARY OF INVENTION

Technical Problem

However, the triplet exciton has a longer lifetime than the singlet exciton, and is liable to suffer saturation of the excited state and energy deactivation due to the interaction with another triplet exciton. Accordingly, there is a general tendency that the quantum yield of phosphorescence is lower than the quantum yield of fluorescence. Therefore, the organic electroluminescent device described in Patent Document 1, which utilizes both the fluorescent light emission by singlet excitons and the phosphorescent light emission by triplet excitons, has a problem that the light emission efficiency cannot be largely enhanced although the device exhibits a higher light emission efficiency than a constitution utilizing any one of singlet excitons and triplet excitons.

For solving the problem associated with the related art, the present inventors have made earnest investigations for an object of providing an organic electroluminescent device that has a high formation efficiency of the singlet excited state and is capable of providing a high light emission efficiency.

Solution to Problem

As a result of the earnest investigations for solving the problem, the inventors have found that by providing a delayed fluorescent exciplex layer between the light emitting layer and the electrode, the singlet excited state is efficiently formed in the fluorescent exciplex layer, and the singlet excitation energy is transferred to the light emitting material of the light emitting layer, whereby the light emitting material efficiently emits fluorescent light. Specifically, the invention provides the following embodiments.

(1) An organic electroluminescent device containing at least two organic layers including a light emitting layer and a delayed fluorescent exciplex layer containing a donor compound and an acceptor compound, between a pair of electrodes.

(2) The organic electroluminescent device according to the item (1), wherein the light emitting layer contains a host compound and a guest compound as a light emitting material, and the host compound, the guest compound, the donor compound, and the acceptor compound satisfy the condition shown by the following expression (1):

$$ES_1 > ES_1^G \text{ and } ES_1^H > ES_1^G \tag{1}$$

wherein in the expression (1), $ES_1$ represents a lowest singlet excitation energy level of an exciplex formed with the donor compound and the acceptor compound; $ES_1^H$ represents a lowest singlet excitation energy level of the host compound; and $ES_1^G$ represents a lowest singlet excitation energy level of the guest compound.

(3) The organic electroluminescent device according to the item (1) or (2), wherein the organic layers include a triplet exciton blocking layer that suppresses transfer of triplet excitation energy from the delayed fluorescent exciplex layer to the light emitting layer, between the light emitting layer and the delayed fluorescent exciplex layer.

(4) The organic electroluminescent device according to the item (3), wherein the triplet exciton blocking layer contains a blocking compound that satisfies the condition shown by the following expression (2) with respect to the host compound, the guest compound, the donor compound, and the acceptor compound:

$$ET_1^B > ET_1 > ET_1^H > ET_1^G \tag{2}$$

wherein in the expression (2), $ET_1^B$ represents a lowest triplet excitation energy level of the blocking compound; $ET_1$ represents a lowest triplet excitation energy level of an exciplex formed with the donor compound and the acceptor compound; $ET_1^H$ represents a lowest triplet excitation energy level of the host compound; and $ET_1^G$ represents a lowest triplet excitation energy level of the guest compound.

(5) The organic electroluminescent device according to the item (3) or (4), wherein the triplet exciton blocking layer has a thickness of 2 nm or more.

(6) The organic electroluminescent device according to any one of the items (3) to (5), wherein the triplet exciton blocking layer has a thickness of from 2 to 8 nm.

(7) The organic electroluminescent device according to any one of the items (3) to (6), wherein the triplet exciton blocking layer has a thickness of from 3.5 to 4.5 nm.

(8) The organic electroluminescent device according to any one of the items (2) to (7), wherein the guest compound contained in the light emitting layer is a fluorescent material.

Advantageous Effects of Invention

According to the organic electroluminescent device of the invention, due to the presence of the delayed fluorescent exciplex layer between the light emitting layer and the electrode, the singlet excited state is efficiently formed in the fluorescent exciplex layer, and the singlet excitation energy is transferred to the light emitting material of the light emitting layer through the Foerster mechanism, whereby the light emitting material efficiently emits fluorescent light. Thus, the organic electroluminescent device can provide a high light emission efficiency.

DESCRIPTION OF EMBODIMENTS

The contents of the invention will be described in detail below. The constitutional elements may be described below with reference to representative embodiments and specific examples of the invention, but the invention is not limited to the embodiments and the examples. In the description, a numerical range expressed with reference to an upper limit and/or a lower limit means a range that includes the upper limit and/or the lower limit. In the invention, the hydrogen atom that is present in a molecule in the compound used in the invention is not particularly limited in isotope species, and for example, all the hydrogen atoms in the molecule may be $^1$H, and all or a part of them may be $^2$H (deuterium (D)).

Layer Structure of Organic Electroluminescent Device

The organic electroluminescent device of the invention contains an anode, a cathode, and organic layers provided between the anode and the cathode. The organic layers include at least two layers, i.e., alight emitting layer and a delayed fluorescent exciplex layer, and one of the features of the invention is the presence of the delayed fluorescent exciplex layer. The feature will be described in detail later.

Figure 1:
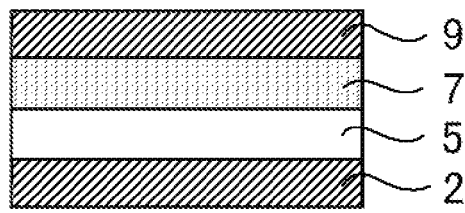
FIG. 1 shows a schematic cross sectional diagram showing examples of the layer structure of the organic electroluminescent device.
Figure 1:
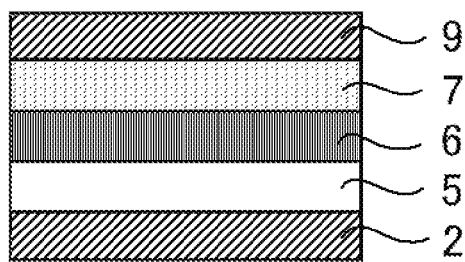
Figure 1:
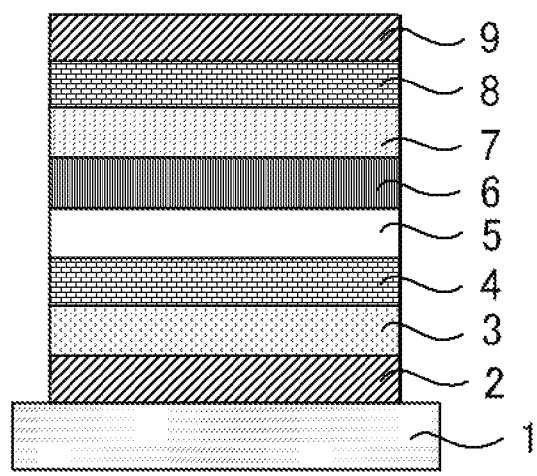

One of typical examples of the structure of the organic electroluminescent device of the invention is shown in FIG. 1. In FIG. 1, numeral 1 denotes a substrate, 2 denotes an anode, 3 denotes a hole injection layer, 4 denotes a hole transporting layer, 5 denotes a light emitting layer, 6 denotes a triplet exciton blocking layer, 7 denotes a delayed fluorescent exciplex layer, 8 denotes an electron transporting layer, and 9 denotes a cathode. The organic layers may include only a light emitting layer and a delayed fluorescent exciplex layer as shown in FIG. 1(a), and may have one or more additional organic layers as shown in FIGS. 1(b) and 1(c). Examples of the additional organic layers include a triplet exciton blocking layer, a hole transporting layer, a hole injection layer, an electron barrier layer, a hole barrier layer, an electron injection layer, an electron transporting layer, and an exciton barrier layer. The hole transporting layer may be a hole injection and transporting layer having a hole injection function, and the electron transporting layer may be an electron injection and transporting layer having an electron injection function.

The members and the layers constituting the organic electroluminescent device will be described below.

Delayed Fluorescent Exciplex Layer

The delayed fluorescent exciplex layer contains a donor compound and an acceptor compound, in which an excited state is formed with the donner compound and the acceptor compound through recombination of holes and electrons injected from the anode and the cathode respectively, and in the excited state, inverse intersystem crossing from the triplet excited state to the singlet excited state occurs in the layer.

In the invention, the excited state formed with the donner compound and the acceptor compound is referred to as an exciplex.

It is considered that the excited state (exciplex) formed in the delayed fluorescent exciplex layer is formed between two molecules that are specially remote from each other, and thereby the exciplex has a smaller difference ΔEst between the singlet excitation energy and the triplet excitation energy than an excited state formed with only one molecule. Accordingly, inverse intersystem crossing from the triplet excited state to the singlet excited state occurs with high probability in the delayed fluorescent exciplex layer.

In the organic electroluminescent device having the delayed fluorescent exciplex layer, on application of an electric current between the anode and the cathode, holes are injected from the anode, whereas electrons are injected from the cathode, and the holes and the electrons are recombined in the delayed fluorescent exciplex layer, resulting in an excited state formed between the donor compound and the acceptor compound. In the excited state, the energy of the singlet excited state is transferred to the light emitting material of the light emitting layer through the Foerster mechanism, and excites the light emitting material to the singlet excited state. On the other hand, the triplet excited state undergoes the inverse intersystem crossing to the singlet excited state with a certain probability determined by the compound species and other conditions, and then excites the light emitting material to the singlet excited state in the light emitting layer through the same mechanism. The light emitting material thus excited to the singlet excited state emits light on returning to the ground state. The fluorescent light emission caused by the inverse intersystem crossing is observed as delayed fluorescence, which is delayed from normal fluorescence (prompt fluorescence).

The formation probability of the excited state formed through the recombination of holes and electrons is larger for the triplet excited state than the singlet excited state, but in the delayed fluorescent exciplex layer, the inverse intersystem crossing from the triplet excited state to the singlet excited state occurs with high probability, and thus a high singlet exciton formation efficiency can be obtained consequently. Accordingly, the light emitting material of the light emitting layer can be made to emit light efficiently through the aforementioned mechanism.

Acceptor Compound

The acceptor compound used in the exciplex layer is preferably a compound that satisfies the conditions shown by the following expressions (3) and (4). Specifically, it is preferred that the triplet excitation energy $(T_1^A)$ of the acceptor compound, which is determined by the peak wavelength on the short wavelength side in the phosphorescence spectrum of the acceptor compound, is larger than the singlet excitation energy $(S_1)$ of the exciplex, which is determined by the peak wavelength of the light emission of the exciplex, and the difference therebetween is larger than 0.2 eV. The difference between the triplet excitation energy $(T_1^A)$ of the acceptor compound and the singlet excitation energy $(S_1)$ of the exciplex is more preferably larger than 0.3 eV, and further preferably larger than 0.4 eV. Furthermore, the LUMO energy level $(|LUMO^A|)$ of the acceptor compound is preferably larger than 2.0 eV, more preferably larger than 2.5 eV, and further preferably larger than 3.0 eV.

$$T_1^A - S_1 > 0.2 \text{ eV} \tag{3}$$

$$|LUMO^A| > 1.9 \text{ eV} \tag{4}$$

Examples of the preferred acceptor compound include compounds represented by the following general formulae (1) to (4).

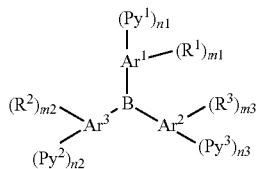

General Formula (1)

In the general formula (1), $Ar^1$, $Ar^2$, and $Ar^3$ each independently represent an aromatic hydrocarbon ring. $Ar^1$, $Ar^2$, and $Ar^3$ may be the same as or different from each other, and are preferably the same as each other. The aromatic hydrocarbon ring that may be represented by $Ar^1$, $Ar^2$, and $Ar^3$ preferably has from 1 to 22 ring skeleton-forming carbon atoms, more preferably from 1 to 14 ring skeleton-forming carbon atoms, and further preferably from 1 to 10 ring skeleton-forming carbon atoms. Examples thereof include a benzene ring, a naphthalene ring, an anthracene ring, and a phenanthrene ring, preferred examples thereof include a benzene ring and a naphthalene ring, and more preferred examples thereof include a benzene ring.

In the general formula (1), $R^1$, $R^2$, and $R^3$ each independently represent a substituted or unsubstituted alkyl group, or a substituted or unsubstituted alkoxy group. $R^1$, $R^2$, and $R^3$ may be the same as or different from each other, and are preferably the same as each other. $R^1$, $R^2$, and $R^3$ are bonded as substituents to the aromatic hydrocarbon rings of $Ar^1$, $Ar^2$ and $Ar^3$, respectively.

The alkyl group that may be represented by $R^1$, $R^2$, and $R^3$ each may be linear, branched, or cyclic, and a linear or branched alkyl group is preferred. The alkyl group preferably has from 1 to 20 carbon atoms, more preferably from 1 to 12 carbon atoms, further preferably from 1 to 6 carbon atoms, still further preferably from 1 to 3 carbon atoms (e.g., a methyl group, an ethyl group, an n-propyl group, and an isopropyl group). Examples of the cyclic alkyl group include a cyclopentyl group, a cyclohexyl group, and a cycloheptyl group. The alkyl group that may be represented by $R^1$, $R^2$, and $R^3$ may be substituted, and examples of the substituent in this case include an alkoxy group, an aryl group, and an aryloxy group. For the description and the preferred ranges of the alkoxy group, reference may be made to the description for the alkoxy group represented by $R^1$, $R^2$, and $R^3$ shown below. The aryl group may have a structure containing only one aromatic ring or a structure containing two or more aromatic rings condensed with each other. The aryl group preferably has from 6 to 22 ring skeleton-forming carbon atoms, more preferably from 6 to 18 ring skeleton-forming carbon atoms, further preferably from 6 to 14 ring skeleton-forming carbon atoms, and still further preferably from 6 to 10 ring skeleton-forming carbon atoms (e.g., a phenyl group, a 1-naphthyl group, and a 2-naphthyl group). The aryloxy group may have a structure containing only one aromatic ring or a structure containing two or more aromatic rings condensed with each other. The aryloxy group preferably has from 6 to 22 ring skeleton-forming carbon atoms, more preferably from 6 to 18 ring skeleton-forming carbon atoms, further preferably from 6 to 14 ring skeleton-forming carbon atoms, and still further preferably from 6 to 10 ring skeleton-forming carbon atoms (e.g., a phenyloxy group, a 1-naphthyloxy group, and a 2-naphthyloxy group).

The alkoxy group that may be represented by $R^1$, $R^2$, and $R^3$ may be linear, branched, or cyclic, and a linear or branched alkoxy group is preferred. The alkoxy group preferably has from 1 to 20 carbon atoms, more preferably from 1 to 12 carbon atoms, further preferably from 1 to 6 carbon atoms, and still further preferably from 1 to 3 (e.g., a methoxy group, an ethoxy group, an n-propoxy group, and an isopropoxy group). Examples of the cyclic alkoxy group include a cyclopentyloxy group, a cyclohexyloxy group, and a cycloheptyloxy group. The alkoxy group that may be represented by $R^1$, $R^2$, and $R^3$ may be substituted, and examples of the substituent in this case include an alkoxy group, an aryl group, and an aryloxy group. For the descriptions and the preferred ranges of the alkoxy group, the aryl group, and the aryloxy group, reference may be made to the above-mentioned descriptions.

In the general formula (1), m1, m2 and m3 each independently represent an integer of from 0 to 4, and preferably an integer of from 0 to 3. For example, in the case where $Ar^1$, $Ar^2$ and $Ar^3$ each represent a benzene ring, examples of the compound include a tri-substituted compound having substituents at the 2-, 4-, and 6-positions thereof, a di-substituted compound having substituents at the 3- and 5-positions thereof, a mono-substituted compound having a substituent at the 2-position thereof, a mono-substituted compound having a substituent at the 3-position thereof, and a mono-substituted compound having a substituent at the 4-position thereof. m1, m2 and m3 may be the same as or different from each other, and are preferably the same as each other. In the case where m1 is 2 or more, plural groups represented by $R^1$ present in the molecule may be the same as or different from each other. The same is applied to m2 and m3.

In the general formula (1), $Py^1$, $Py^2$, and $Py^3$ each independently represent a substituted or unsubstituted pyridyl group. $Py^1$, $Py^2$, and $Py^3$ may be the same as or different from each other, and are preferably the same as each other. $Py^1$, $Py^2$, and $Py^3$ are bonded as substituents to the aromatic hydrocarbon rings of $Ar^1$, $Ar^2$ and $Ar^3$, respectively. Examples of the pyridyl group that may be represented by $Py^1$, $Py^2$, and $Py^3$ include a 2-pyridyl group, a 3-pyridyl group, and a 4-pyridyl group, all of which are preferred, and a 3-pyridyl group is more preferred among these. The pyridyl group may be further substituted or may not be substituted. In the case where the pyridyl group is substituted, examples of the substituent include an alkyl group and an alkoxy group, and for the description and the preferred range of the alkyl group and the alkoxy group, reference may be made the corresponding descriptions for $R^1$, $R^2$, and $R^3$.

In the general formula (1), n1, n2 and n3 each independently represent an integer of from 1 to 3, and preferably 1 or 2. For example, in the case where $Ar^1$, $Ar^2$ and $Ar^3$ each represent a benzene ring, examples of the compound include a mono-substituted compound having a substituent at the 3-position thereof and a di-substituted compound having substituents at the 3- and 5-positions thereof. n1, n2, and n3 may be the same as or different from each other, and are preferably the same as each other. In the case where n1 is 2 or more, plural groups represented by $Py^1$ present in the molecule may be the same as or different from each other. The same is applied to n2 and n3.

General Formula (2)

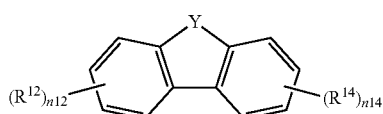

In the general formula (2), Y represents a group represented by the following general formula, S (sulfur atom), or $SO_2$ (sulfonyl group), and * each represent the bonding position.

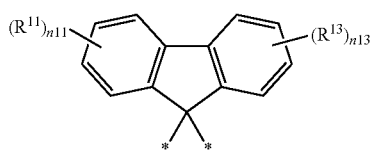

Specifically, the general formula (2) encompasses the three structures represented by the following general formulae (2-1), (2-2), and (2-3), and the structure represented by the general formula (2-2) is preferred.

General Formula (2-1)

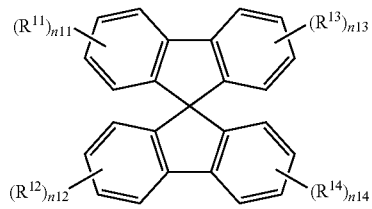

General Formula (2-2)

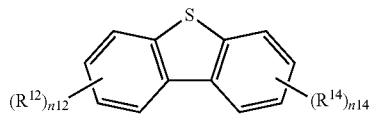

General Formula (2-3)

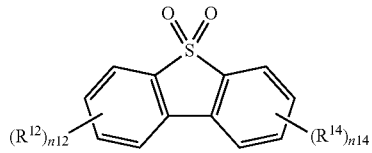

$R^{11}$, $R^{12}$, $R^{13}$, and $R^{14}$ each independently represent a group represented by the following general formula.

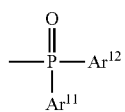

In the general formula, $Ar^{11}$ and $Ar^{12}$ each independently represent a substituted or unsubstituted aryl group. $Ar^{11}$ and $Ar^{12}$ may be the same as or different from each other, and are preferably the same as each other. For the description and the preferred ranges of the substituted or unsubstituted aryl group, reference may be made to the corresponding description in the general formula (1). Preferred examples of $Ar^{11}$ and $Ar^{12}$ include a phenyl group. $R^{11}$, $R^{12}$, $R^{13}$, and $R^{14}$ may be the same as or different from each other, and are preferably the same as each other.

In the general formula (2), n11, n12, n13, and n14 each independently represent an integer of from 0 to 2, and preferably 0 or 1. The sum of n11, n12, n13, and n14 is 1 or more, preferably from 1 to 4, and more preferably 1 or 2. In the case where the sum is 2 or more, plural groups represented by the following general formula:

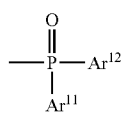

present in the molecule may be the same as or different from each other, and preferably the same as each other.

$$Z^{21}\text{-}(L^{21}\text{-}Py^{21})_{n21}$$ General Formula (3)

In the general formula (3), $Z^{21}$ represents a structure represented by any one of the following formulae.

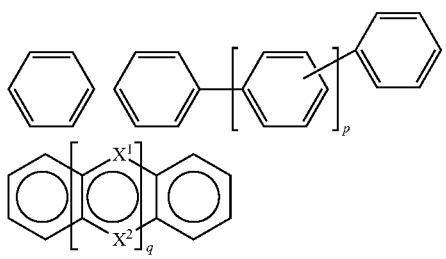

$X^1$ and $X^2$ both represent —CH=, or $X^1$ represents a single bond and $X^2$ represents —CH=CH—, or $X^1$ represents —CH=CH— and $X^2$ represents a single bond. The ring skeleton containing $X^1$ and $X^2$ constitutes the benzene ring. p represents an integer of from 0 to 3, and may be for example 0 or 1. q represents an integer of from 0 to 3, and may be for example 0 or 1.

In the general formula (3), $L^{21}$ represents a substituted or unsubstituted arylene group. The arylene group herein may have a structure containing only one aromatic group or a structure of two or more aromatic groups condensed with each other. The arylene group preferably has from 6 to 22 ring skeleton-forming carbon atoms, more preferably from 6 to 18 ring skeleton-forming carbon atoms, further preferably from 6 to 14 ring skeleton-forming carbon atoms, and still further preferably from 6 to 10 ring skeleton-forming carbon atoms. The arylene group is still further preferably a 1,3-phenylene group, a 1,4-phenylene group, a 1,5-naphthylene group, or a 2,6-naphthylene group, and still further preferably a 1,3-phenylene group or a 1,4-phenylene group. In the case where the arylene group is substituted, examples of the substituent include an alkyl group, an alkoxy group, an aryl group, and an aryloxy group, and for the description and the preferred ranges of these groups, reference may be made to the corresponding description in the general formula (1).

In the general formula (3), $Py^{21}$ represents a substituted or unsubstituted pyridyl group. For the description and the preferred ranges of the substituted or unsubstituted pyridyl group, reference may be made to the corresponding description in the general formula (1).

In the formula (3), n21 represents an integer of from 2 to 6, preferably from 2 to 4, and more preferably 3 or 4. Plural groups represented by ($L^{21}$-$Py^{21}$) present in the molecule may be the same as or different from each other, and are preferably the same as each other.

General Formula (4)

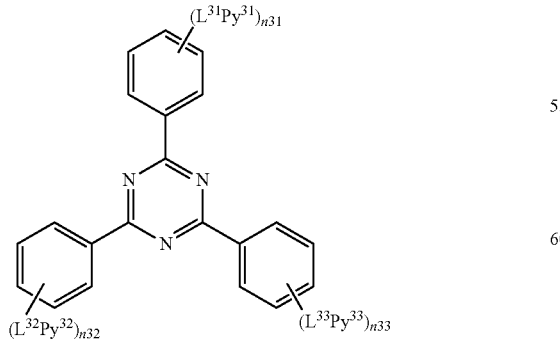

In the general formula (4), $L^{31}$, $L^{32}$, and $L^{33}$ each independently represent a single bond or a substituted or unsubstituted arylene group. $L^{31}$, $L^{32}$ and $L^{33}$ may be the same as or different from each other, and are preferably the same as each other. For the description and the preferred ranges of the substituted or unsubstituted arylene group, reference may be made to the corresponding descriptions in the general formula (3). For example, the arylene group used herein may be a 1,3-phenylene group.

In the general formula (4), $Py^{31}$, $Py^{32}$ and $Py^{33}$ each independently represent a substituted or unsubstituted pyridyl group. $Py^{31}$, $Py^{32}$ and $Py^{33}$ may be the same as or different from each other, and are preferably the same as each other. For the description and the preferred ranges of the substituted or unsubstituted pyridyl group, reference may be made to the corresponding descriptions in the general formula (1).

In the general formula (4), n31, n32 and n33 each independently represent an integer of from 1 to 3, and preferably 1 or 2. Examples of the compound include a tri-substituted compound having substituents at the 2-, 4- and 6-positions thereof, a di-substituted compound having substituents at the 3- and 5-positions thereof, a mono-substituted compound having a substituent at the 3-position thereof, and a mono-substituted compound having a substituent at the 4-position thereof. n31, n32 and n33 may be the same as or different from each other, and are preferably the same as each other. When n31 is 2 or more, plural groups represented by ($L^{31}$-$Py^{31}$) present in the molecule may be the same as or different from each other, and are preferably the same as each other. The same is applied to n32 and n33.

The acceptor compound used in the invention is commercially available or may be produced according to the known methods or a combination thereof depending on necessity.

Specific examples of the compound that is capable of being used as the acceptor compound in the invention are shown below. In the example compounds, the compound 1, the compound 2, the compound 3, the compound 3', the compound 4, the compound 7, and the compound 8 are preferred, the compound 1, the compound 2, the compound 3, and the compound 3' are more preferred, the compound 1, the compound 3, and the compound 3' are further preferred, and the compound 3' is the most preferred. The range of the acceptor compound that is capable of being used in the invention is not construed as being limited to the following specific examples.

1.

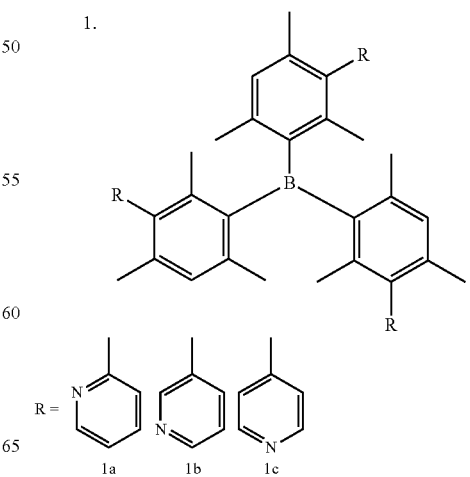

2. 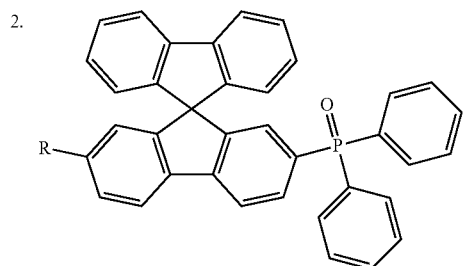
R = H 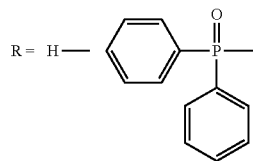
2a  2b
3. 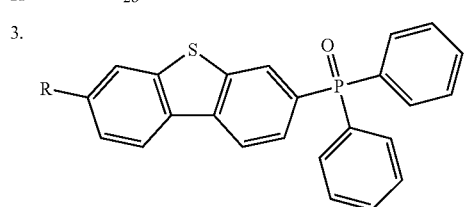
R = H 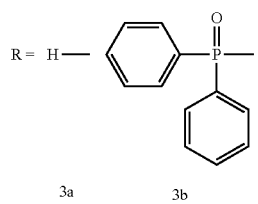
3a  3b
3'. 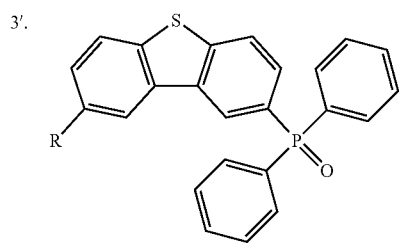
R = H 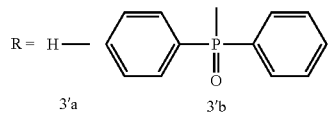
3'a  3'b
4. 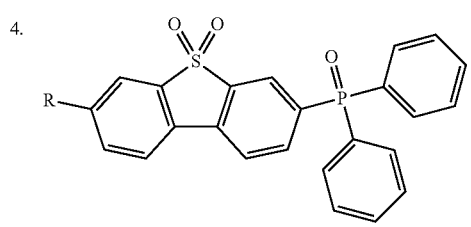
R = H 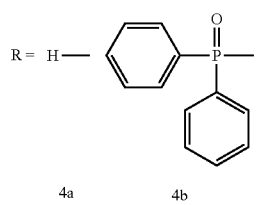
4a  4b
5. 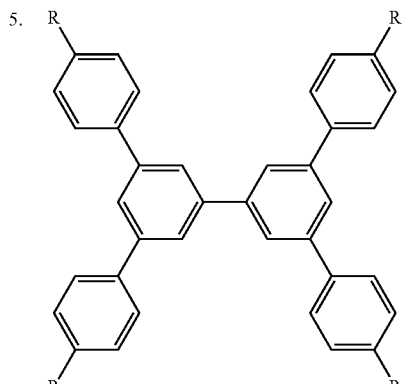
R = 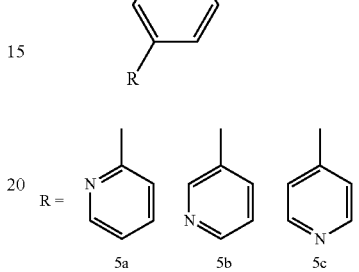
5a  5b  5c
6. 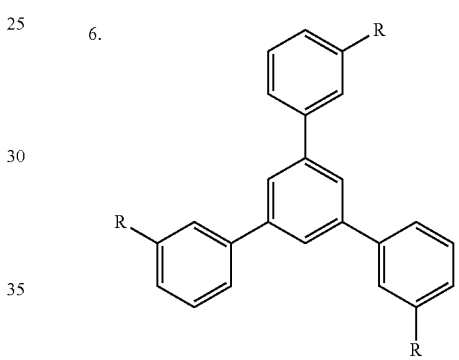
R = 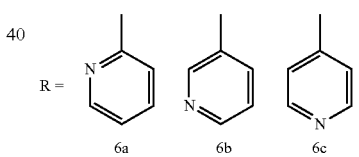
6a  6b  6c
7. 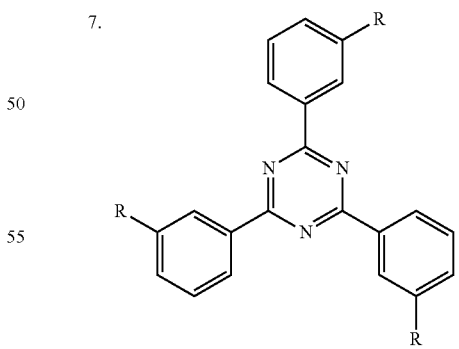
R = 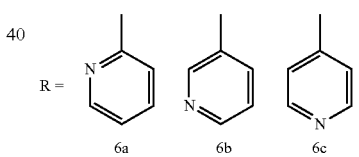
7a  7b  7c

8.

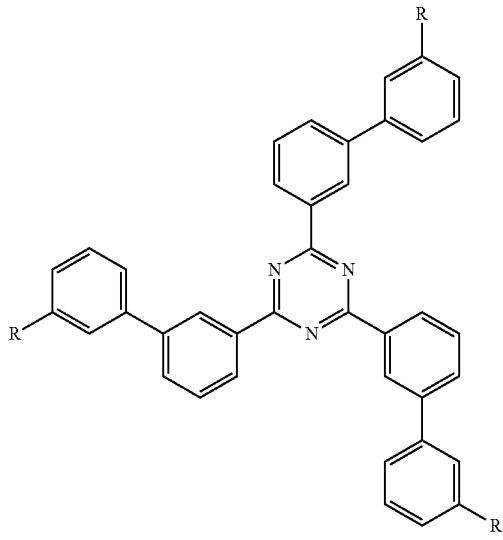

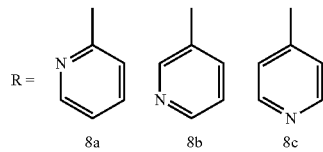

Donor Compound

The donor compound used in the exciplex layer is preferably a compound that satisfies the conditions shown by the following expressions (5) and (6). Specifically, it is preferred that the triplet excitation energy ($T_1^D$) of the donor compound, which is determined by the peak wavelength on the short wavelength side in the phosphorescence spectrum of the donor compound, is larger than the singlet excitation energy ($S_1$) of the exciplex, which is determined by the peak wavelength of the light emission of the exciplex, and the difference therebetween is 0.2 eV or more. The difference between the triplet excitation energy ($T_1^D$) of the donor compound and the singlet excitation energy ($S_1$) of the exciplex is more preferably larger than 0.3 eV, and further preferably larger than 0.4 eV. Furthermore, the HOMO energy level ($|HOMO^D|$) of the donor compound is preferably 5.3 eV or less, more preferably less than 5.2 eV, and further preferably less than 5.1 eV.

$$T_1^D - S_1 \geq 0.2 \text{ eV} \qquad (5)$$

$$|HOMO^D| \leq 5.3 \text{ eV} \qquad (6)$$

Examples of the preferred donor compound include compounds represented by the following general formulae (11) to (15).

General Formula (11)

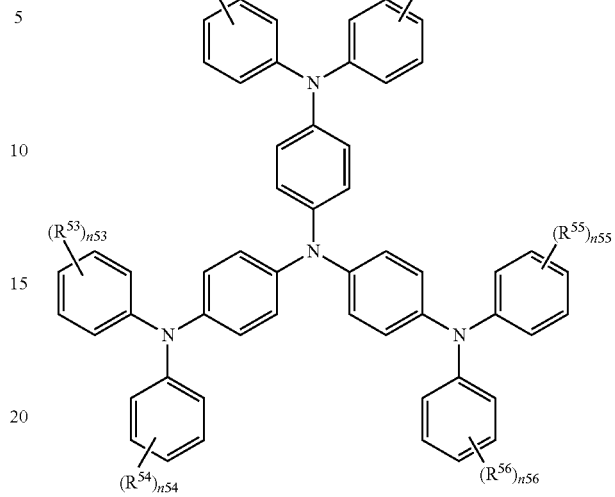

In the general formula (11), $R^{51}$, $R^{52}$, $R^{53}$, $R^{54}$, $R^{55}$, and $R^{56}$ each independently represent a substituted or unsubstituted alkyl group or a substituted or unsubstituted alkoxy group. $R^{51}$, $R^{52}$, $R^{53}$, $R^{54}$, $R^{55}$, and $R^{56}$ may be the same as or different from each other, and are preferably the same as each other. For the descriptions and the preferred ranges of the substituted or unsubstituted alkyl group and the substituted or unsubstituted alkoxy group, reference may be made to the corresponding descriptions in the general formula (1).

In the general formula (11), n51, n52, n53, n54, n55, and n56 each independently represent an integer of from 0 to 5, preferably from 0 to 3, and more preferably from 0 to 2. n51, n52, n53, n54, n55, and n56 may be the same as or different from each other, and it is preferred that n51, n53, and n55 are the same as each other, and n52, n54, and n56 are the same as each other. Preferred examples of the case include the case where n51, n53, and n55 are 1 or 2, and n52, n54, and n56 are 0. Examples of the mode of substitution include a tri-substituted compound having substituents at the 2-, 4- and 6-positions thereof, a di-substituted compound having substituents at the 3- and 5-positions thereof, a mono-substituted compound having a substituent at the 2-position thereof, a mono-substituted compound having a substituent at the 3-position thereof, and a mono-substituted compound having a substituent at the 4-position thereof. In case where n51 is 2 or more, plural groups represented by $R^{51}$ present in the molecule may be the same as or different from each other, and are preferably the same as each other. In case where two groups among the plural groups represented by $R^{51}$ present in the molecule are bonded to the adjacent carbon atoms of the benzene ring, the two groups represented by $R^{51}$ may be bonded to each other to form a linking group. The two groups represented by $R^{51}$ bonded to each other to form a linking group constitute a ring that is condensed with the benzene ring. The linking group formed by bonding the two groups represented by $R^{51}$ to each other preferably has from 3 to 5 linking chain-forming carbon atoms, and more preferably 3 or 4 linking chain-forming carbon atoms. Examples of the linking group include an alkylene group and an alkenylene group. Preferred examples of the linking group include a group represented by —CH=CH—CH=CH—, and the group, in which at least one of the four hydrogen atoms is substituted by a substituted or unsubstituted alkyl group or a substituted or unsubstituted alkoxy group. For the descriptions and the preferred ranges of the substituted or unsubstituted alkyl group and the substituted or unsubstituted alkoxy group, reference may be made to the corresponding descriptions in the general formula (1). The aforementioned description for n51 is similarly applied to n52, n53, n54, n55, and n56.

In the general formula (12), n61, n62, n63, n64, n65, and n66 each independently represent an integer of from 0 to 5, preferably from 0 to 3, and more preferably from 0 to 2. Examples of the compound include a tri-substituted compound having substituents at the 2-, 4- and 6-positions thereof, a di-substituted compound having substituents at the 3- and 5-positions thereof, a mono-substituted compound

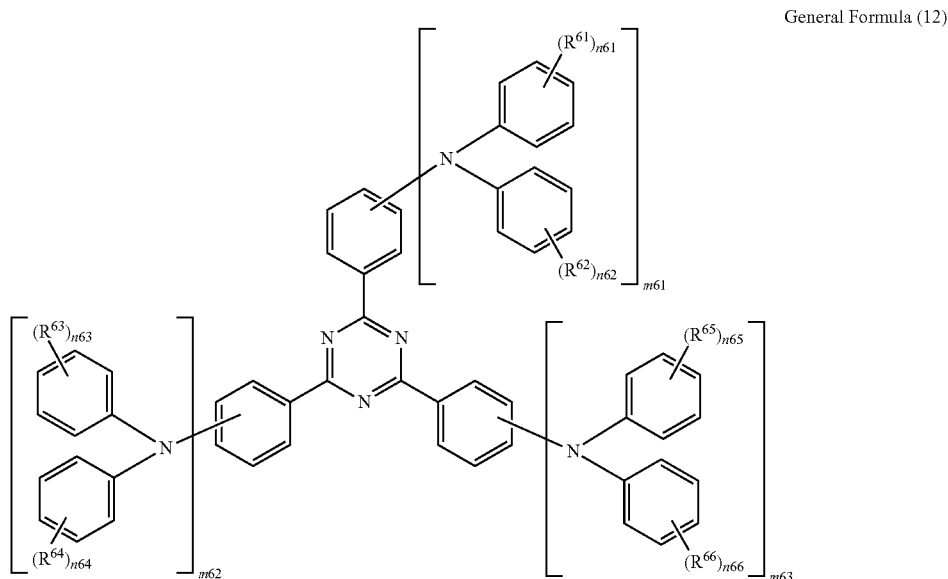

General Formula (12)

In the general formula (12), $R^{61}$, $R^{62}$, $R^{63}$, $R^{64}$, $R^{65}$, and $R^{66}$ each independently represent a substituted or unsubstituted alkyl group or a substituted or unsubstituted alkoxy group. $R^{61}$, $R^{62}$, $R^{63}$, $R^{64}$, $R^{65}$, and $R^{66}$ may be the same as or different from each other, and are preferably the same as each other. For the descriptions and the preferred ranges of the substituted or unsubstituted alkyl group and the substituted or unsubstituted alkoxy group, reference may be made to the corresponding descriptions in the general formula (1).

In the general formula (12), m61, m62, and m63 each independently represent 1 or 2. Examples of the compound include a di-substituted compound having substituents at the 3- and 5-positions thereof, a mono-substituted compound having a substituent at the 3-position thereof, and a mono-substituted compound having a substituent at the 4-position thereof. In case where m61 is 2 or more, plural groups represented by the following formula present in the molecule may be the same as or different from each other, and are preferably the same as each other.

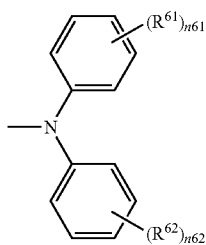

The same is applied to m62 and m63. m61, m62, and m63 may be the same as or different from each other, and are preferably the same as each other.

having a substituent at the 2-position thereof, a mono-substituted compound having a substituent at the 3-position thereof, and a mono-substituted compound having a substituent at the 4-position thereof. In case where n61 is 2 or more, plural groups represented by $R^{61}$ present in the molecule may be the same as or different from each other, and are preferably the same as each other. In case where two groups among the plural groups represented by $R^{61}$ present in the molecule are bonded to the adjacent carbon atoms of the benzene ring, the two groups represented by $R^{61}$ may be bonded to each other to form a linking group. The two groups represented by $R^{61}$ bonded to each other to form a linking group constitute a ring that is condensed with the benzene ring. The linking group formed by bonding the two groups represented by $R^{61}$ to each other preferably has from 3 to 5 linking chain-forming carbon atoms, and more preferably 3 or 4 linking chain-forming carbon atoms. Examples of the linking group include an alkylene group and an alkenylene group. Preferred examples of the linking group include a group represented by —CH=CH—CH=CH—, and the group, in which at least one of the four hydrogen atoms is substituted by a substituted or unsubstituted alkyl group or a substituted or unsubstituted alkoxy group. For the descriptions and the preferred ranges of the substituted or unsubstituted alkyl group and the substituted or unsubstituted alkoxy group, reference may be made to the corresponding descriptions in the general formula (1). The aforementioned description for n61 is similarly applied to n62, n63, n64, n65, and n66. n61, n62, n63, n64, n65, and n66 may be the same as or different from each other, and are preferably the same as each other.

General Formula (13)

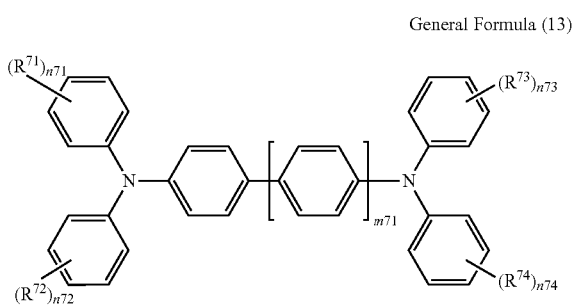

In the general formula (13), $R^{71}$, $R^{72}$, $R^{73}$, and $R^{74}$ each independently represent a substituted or unsubstituted alkyl group, a substituted or unsubstituted alkoxy group, or a group represented by the following formula.

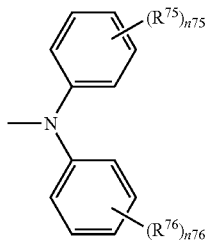

$R^{75}$ and $R^{76}$ each independently represent a substituted or unsubstituted alkyl group or a substituted or unsubstituted alkoxy group. For the descriptions and the preferred ranges of the substituted or unsubstituted alkyl group and the substituted or unsubstituted alkoxy group that may be represented by $R^{71}$, $R^{72}$, $R^{73}$, $R^{74}$, $R^{75}$, and $R^{76}$, reference may be made to the corresponding descriptions in the general formula (1). $R^{71}$, $R^{72}$, $R^{73}$, and $R^{74}$ may be the same as or different from each other, and are preferably the same as each other.

In the general formula (13), m71 represents 0 or 1, both of which are preferred.

In the general formula (13), n71, n72, n73, n74, n75, and n76 each independently represent an integer of from 0 to 5, preferably from 0 to 3, and more preferably from 0 to 2. Examples of the compound include a tri-substituted compound having substituents at the 2-, 4- and 6-positions thereof, a di-substituted compound having substituents at the 3- and 5-positions thereof, a mono-substituted compound having a substituent at the 2-position thereof, a mono-substituted compound having a substituent at the 3-position thereof, and a mono-substituted compound having a substituent at the 4-position thereof. In case where n71 is 2 or more, plural groups represented by $R^{71}$ present in the molecule may be the same as or different from each other, and are preferably the same as each other. In case where two groups among the plural groups represented by $R^{71}$ present in the molecule are bonded to the adjacent carbon atoms of the benzene ring, the two groups represented by $R^{71}$ may be bonded to each other to form a linking group. The two groups represented by $R^{71}$ bonded to each other to form a linking group constitute a ring that is condensed with the benzene ring. The linking group formed by bonding the two groups represented by $R^{71}$ to each other preferably has from 3 to 5 linking chain-forming carbon atoms, and more preferably 3 or 4 linking chain-forming carbon atoms. Examples of the linking group include an alkylene group and an alkenylene group. Preferred examples of the linking group include a group represented by —CH=CH—CH=CH—, and the group, in which at least one of the four hydrogen atoms is substituted by a substituted or unsubstituted alkyl group or a substituted or unsubstituted alkoxy group. For the descriptions and the preferred ranges of the substituted or unsubstituted alkyl group and the substituted or unsubstituted alkoxy group, reference may be made to the corresponding descriptions in the general formula (1). The aforementioned description for n71 is similarly applied to n72, n73, n74, n75, and n76. n71, n72, n73, and n74 may be the same as or different from each other, and are preferably the same as each other. n75 and n76 may be the same as or different from each other, and are preferably the same as each other.

General Formula (14)

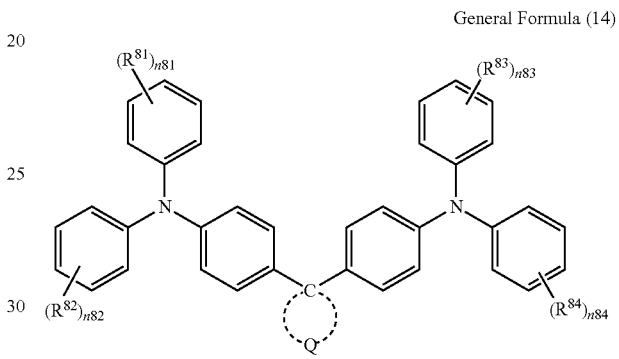

In the general formula (14), Q represents an atomic group that is required for forming a cyclic structure. Q preferably represents a substituted or unsubstituted alkylene group, a substituted or unsubstituted alkenylene group, or a substituted or unsubstituted alkynylene group, more preferably a substituted or unsubstituted alkylene group or a substituted or unsubstituted alkenylene group, and further preferably a substituted or unsubstituted alkylene group. The atomic group represented by Q preferably has from 4 to 10 ring skeleton-forming carbon atoms, more preferably from 5 to 8 ring skeleton-forming carbon atoms, and further preferably from 5 to 7 ring skeleton-forming carbon atoms. Specific examples of the group represented by Q include a butylene group, a penthylene group, a hexylene group, and a butadienylene group. Examples of the substituent that may be substituted on the alkylene group, the alkenylene group, or the alkynylene group that may be represented by Q include an alkyl group, an alkoxy group, an aryl group, and an aryloxy group. For the descriptions and the preferred ranges of these substituents, reference may be made to the corresponding descriptions for $R^1$, $R^2$, and $R^3$. The alkylene group, the alkenylene group, and the alkynylene group that may be represented by Q are preferably unsubstituted.

In the general formula (14), $R^{81}$, $R^{82}$, $R^{83}$, and $R^{84}$ each independently represent a substituted or unsubstituted alkyl group or a substituted or unsubstituted alkoxy group. For the descriptions and the preferred ranges of the substituted or unsubstituted alkyl group and the substituted or unsubstituted alkoxy group that may be represented by $R^{81}$, $R^{82}$, $R^{83}$, and $R^{84}$, reference may be made to the corresponding descriptions in the general formula (1).

In the general formula (14), n81, n82, n83, and n84 each independently represent an integer of from 0 to 5, preferably from 0 to 3, and more preferably from 0 to 2. Examples of the compound include a tri-substituted compound having substituents at the 2-, 4- and 6-positions thereof, a di-substituted compound having substituents at the 3- and 5-positions thereof, a mono-substituted compound having a substituent at the 2-position thereof, a mono-substituted compound having a substituent at the 3-position thereof, and a mono-substituted compound having a substituent at the 4-position thereof. In case where n81 is 2 or more, plural groups represented by $R^{81}$ present in the molecule may be the same as or different from each other, and are preferably the same as each other. In case where two groups among the plural groups represented by $R^{81}$ present in the molecule are bonded to the adjacent carbon atoms of the benzene ring, the two groups represented by $R^{81}$ may be bonded to each other to form a linking group. The two groups represented by $R^{81}$ bonded to each other to form a linking group constitute a ring that is condensed with the benzene ring. The linking group formed by bonding the two groups represented by $R^{81}$ to each other preferably has from 3 to 5 linking chain-forming carbon atoms, and more preferably 3 or 4 linking chain-forming carbon atoms. Examples of the linking group include an alkylene group and an alkenylene group. Preferred examples of the linking group include a group represented by —CH=CH—CH=CH—, and the group, in which at least one of the four hydrogen atoms is substituted by a substituted or unsubstituted alkyl group or a substituted or unsubstituted alkoxy group. For the descriptions and the preferred ranges of the substituted or unsubstituted alkyl group and the substituted or unsubstituted alkoxy group, reference may be made to the corresponding descriptions in the general formula (1). The aforementioned description for n81 is similarly applied to n82, n83, and n84. n81, n82, n83, and n84 may be the same as or different from each other, and are preferably the same as each other.

General Formula (15)

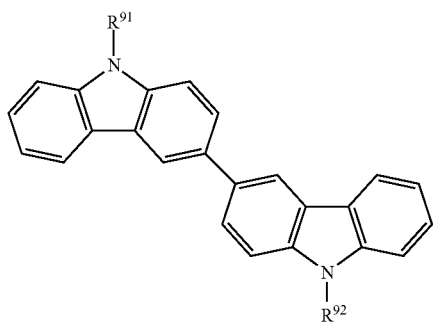

In the general formula (15), $R^{91}$ and $R^{92}$ each independently represent a substituted or unsubstituted alkyl group or a substituted or unsubstituted aryl group. For the descriptions and the preferred ranges of the alkyl group and the aryl group that may be represented by $R^{91}$ and $R^{92}$, reference may be made to the corresponding descriptions in the general formula (1).

The donor compound used in the invention is commercially available or may be produced according to the known methods or a combination thereof depending on necessity.

Specific examples of the compound that is capable of being used as the donor compound in the invention are shown below (in which Me represents a methyl group, and Et represents an ethyl group). In the example compounds, the compound 11, the compound 12, and the compound 13 are preferred, the compound 11 and the compound 12 are more preferred, and the compound 12 is further preferred. The range of the donor compound that is capable of being used in the invention is not construed as being limited to the following specific examples.

11.

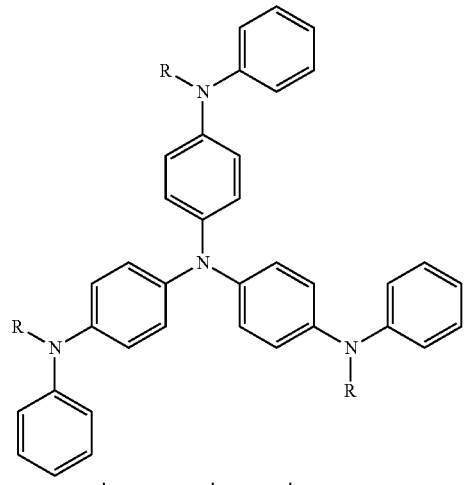

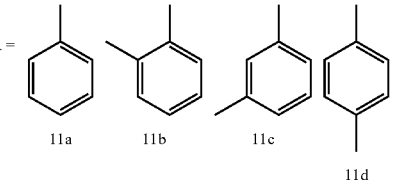

12.

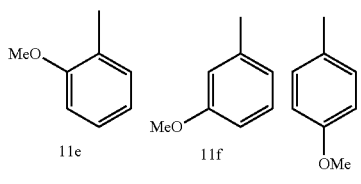

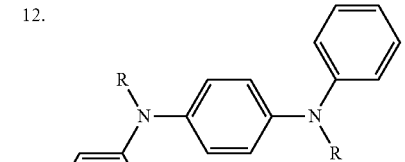

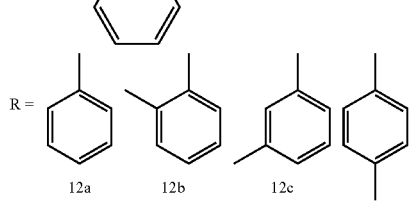

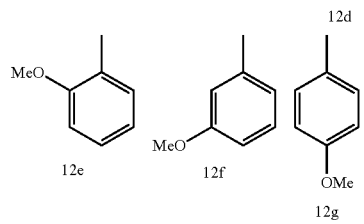

-continued
13.
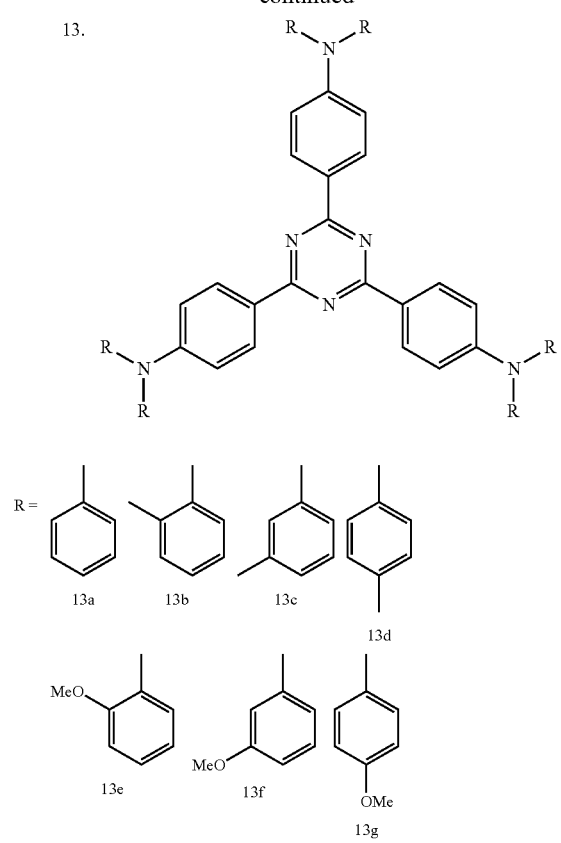
14.
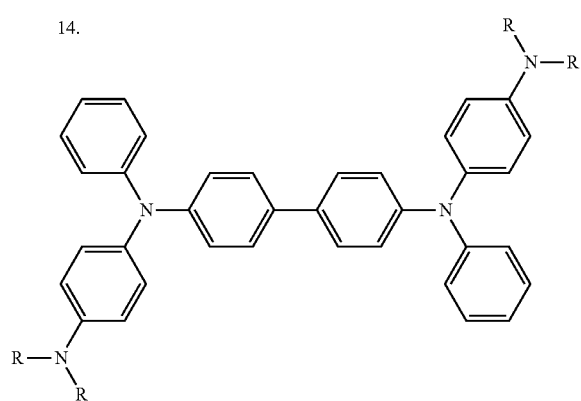
15.
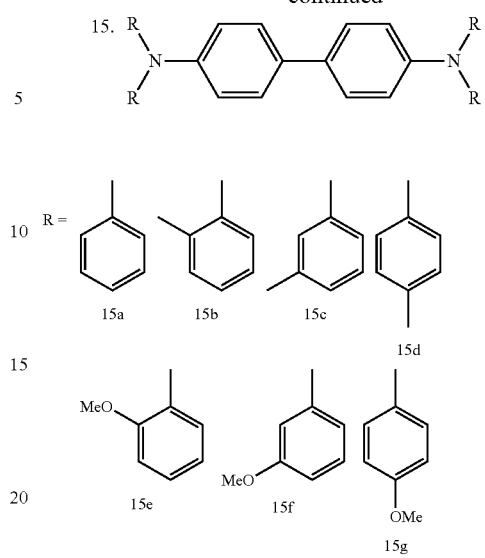
16.
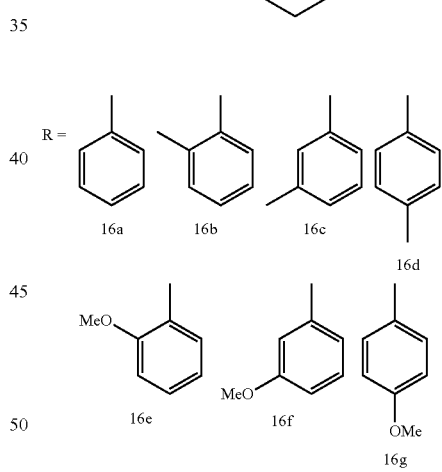
17.
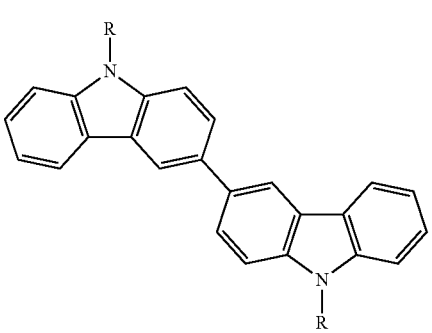

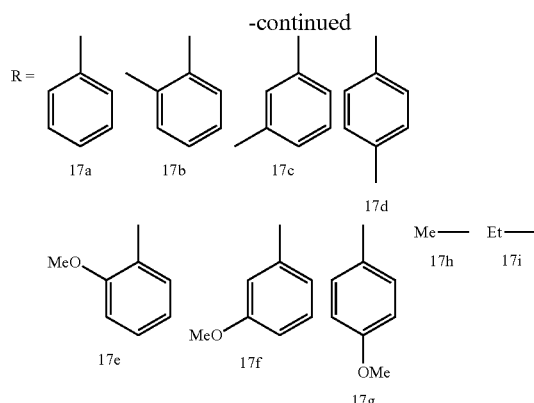

The following compound may also be preferably used as the donor compound, in addition to the compounds represented by the general formulae (11) to (15).

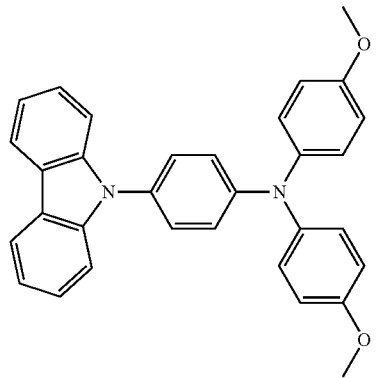

CzTTP1

Mixture of Acceptor Compound and Donor Compound

In the invention, the acceptor compound and the donor compound are mixed to provide a mixture. The molar content of the donor compound in the mixture (donor compound/sum of acceptor compound and donor compound) is preferably more than 0.2 and less than 0.6, more preferably more than 0.3 and less than 0.6, and further preferably more than 0.4 and less than 0.6.

The combination of the acceptor compound and the donor compound is not particularly limited, as far as the combination is capable of forming an exciplex. Examples of the preferred combination of the acceptor compound and the donor compound are shown in the following table. Examples of the particularly preferred combination include the exciplexes Nos. 1, 3, 8, 11, 18, 37, and 38, and examples of the more preferred combination include No. 37 (donor compound: TTP, acceptor compound: PPT) and No. 38 (donor compound: dPTBdA, acceptor compound: PPT). Furthermore, a combination CzTTP1 as the donor compound and PPT as the acceptor compound is also preferably used. The delayed fluorescent exciplex layer of the combination No. 31 has a high singlet exciton formation efficiency of from 65 to 100% and can make the light emitting material of the light emitting layer to emit light efficiently. The delayed fluorescent exciplex layers of the combination No. 31 and the combination of CzTTP1 and PPT are difficult to undergo the Dexter transfer of the triplet excitation energy, and thus do not require the triplet exciton blocking layer described later, which provides an effect of simplifying the structure of the organic electroluminescent device.

The method for forming the delayed fluorescent exciplex layer is not particularly limited, and examples of the method include a vapor co-deposition method.

TABLE 1

| No. of exciplex | Acceptor compound | Donor compound |
|---|---|---|
| 1 | 1b | 11a |
| 2 | 1b | 11b |
| 3 | 1b | 11c |
| 4 | 1b | 11d |
| 5 | 1b | 11e |
| 6 | 1b | 11f |
| 7 | 1b | 12a |
| 8 | 1b | 12c |
| 9 | 1b | 12d |
| 10 | 1b | 12f |
| 11 | 1b | 12g |
| 12 | 1b | 14c |
| 13 | 1b | 15g |
| 14 | 1a | 11c |
| 15 | 1c | 11c |
| 16 | 2a | 11a |
| 17 | 2a | 11b |
| 18 | 2a | 11c |
| 19 | 2a | 11d |
| 20 | 2a | 11e |
| 21 | 2a | 12c |
| 22 | 2a | 14c |
| 23 | 2a | 15g |
| 24 | 3b | 11a |
| 25 | 3b | 11b |
| 26 | 3b | 11c |
| 27 | 3b | 11d |
| 28 | 3b | 11e |
| 29 | 3b | 11f |
| 30 | 3b | 12a |
| 31 | 3b | 12c |
| 32 | 3b | 12d |
| 33 | 3b | 12f |
| 34 | 3b | 12g |
| 35 | 3b | 14c |
| 36 | 3b | 15g |
| 37 | 3'b | 12c |
| 38 | 3'b | 12d |

Thickness of Delayed Fluorescent Exciplex Layer

The thickness of the delayed fluorescent exciplex layer is not particularly limited, and is preferably from 10 to 120 nm, more preferably from 10 to 60 nm, and further preferably from 10 to 30 nm. By selecting the thickness of the delayed fluorescent exciplex layer from the range, a delayed fluorescent exciplex layer that has a high singlet exciton formation efficiency may be obtained.

Light Emitting Layer

The light emitting layer contains a light emitting material, and in the layer, the light emitting material is excited through the energy transfer from the delayed fluorescent exciplex layer, and then emits light on returning to the ground level. In the invention, the recombination of holes and electrons may possibly occur in the light emitting layer. Apart of the light emitting material contained in the light emitting layer may be excited by the recombination of holes and electrons, and may emit light on returning to the ground level.

As for the positional relationship of the light emitting layer and the delayed fluorescent exciplex layer, the delayed fluorescent exciplex layer may be on the side of the cathode or may be on the side of the anode, with respect to the light emitting layer.

Light Emitting Material

The light emitting material used in the light emitting layer is preferably a fluorescent material, and thereby the singlet excitons formed efficiently in the delayed fluorescent exciplex layer can be efficiently made to contribute to the light emission of the light emitting material, thereby achieving an organic electroluminescent device having a high light emission efficiency. A delayed fluorescent material may be used as the fluorescent material. A delayed fluorescent material is such a fluorescent light emitting material that the material is excited to a singlet excited state and a triplet excited state through recombination of carriers, and at least apart of the material that is excited to a triplet excited state is transferred to a singlet excited state through inverse intersystem crossing. In this case, the light emission of the light emitting layer contains both normal fluorescent light emission (prompt fluorescent light emission) and delayed fluorescent light emission.

Specific examples of the preferred compound that is capable of being used as the light emitting material in the invention are shown below. C545T shown below has a PL quantum yield in a toluene solution of 91.3% and can provide a considerably high light emission efficiency. The range of the light emitting material that is capable of being used in the invention is not construed as being limited to the following specific examples.

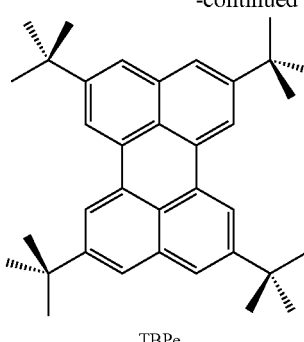

TBPe

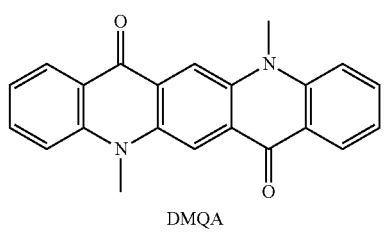

DMQA

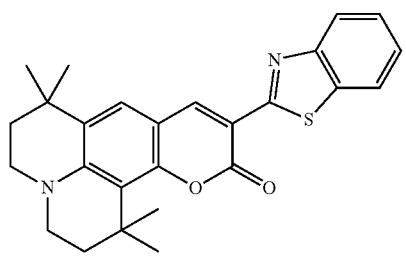

DCM

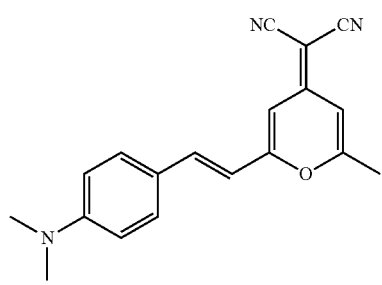

DCM2

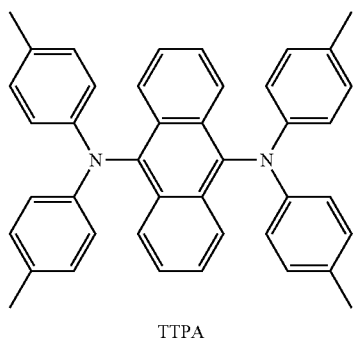

TTPA

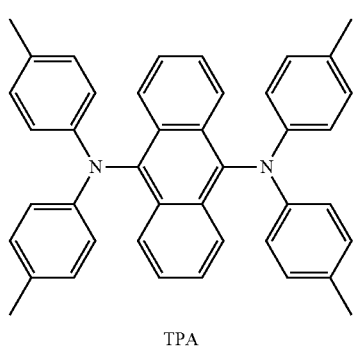

TPA

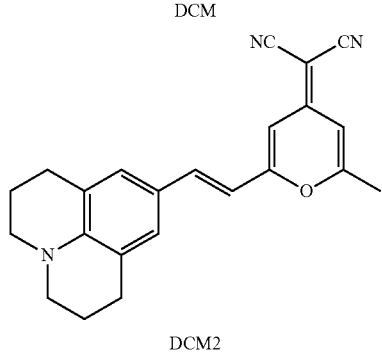

DCJT

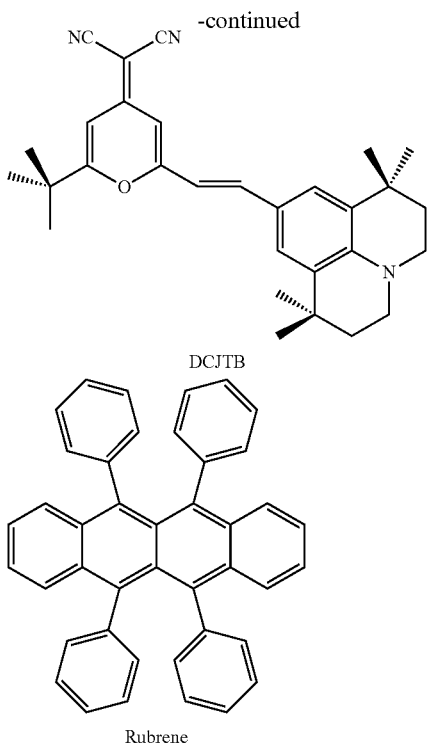

DCJTB

Rubrene

Host Compound

The light emitting layer may be constituted only by the light emitting material, and preferably contains a host compound with the light emitting material as a guest compound. The host compound used may be an organic compound that satisfies the condition shown by the following expression (1) with respect to the donor compound and the acceptor compound contained in the delayed fluorescent exciplex layer and the guest compound as the light emitting material.

$$ES_1 > ES_1^G \text{ and } ES_1^H > ES_1^G \qquad (1)$$

In the expression (1), $ES_1$ represents the lowest singlet excitation energy level of an exciplex formed with the donor compound and the acceptor compound; $ES_1^H$ represents the lowest singlet excitation energy level of the host compound; and $ES_1^G$ represents the lowest singlet excitation energy level of the guest compound.

In the invention, the lowest singlet excitation energy level may be measured in the following manner. In the following method, the case using the compound to be measured and mCBP is described.

The compound to be measured and mCBP are vapor-co-deposited to a thickness of 100 nm on a Si substrate to make a concentration of the compound to be measured of 6% by weight, which is designated as a specimen. The specimen is measured for a fluorescence spectrum at ordinary temperature (300 K). The light emission is accumulated from immediately after the incidence of excitation light to after 100 nsec from the incidence, thereby providing a fluorescence spectrum with the fluorescence intensity as the ordinate and the wavelength as the abscissa. In the fluorescence spectrum, the ordinate is the light emission, and the abscissa is the wavelength. The wavelength λ of the peak on the short wavelength side of the light emission spectrum is converted to an energy value according to the following conversion expression to provide the lowest singlet excitation energy level $ES_1$.

$$ES_1 \text{ (eV)} = 1{,}239.85/\lambda_{edge} \qquad \text{Conversion Expression}$$

The light emission spectrum is measured with a nitrogen laser (MNL200, produced by Lasertechnik Berlin GmbH) as an excitation light source and a streak camera (C4334, produced by Hamamatsu Photonics K.K.) as a detector.

As shown in the expression (1), the lowest singlet excitation energy level of the guest compound $ES_1^G$ is lower than the lowest singlet excitation energy level of the exciplex formed with the donor compound and the acceptor compound $ES_1$, and thereby the singlet excitation energy of the exciplex can be efficiently transferred to the guest compound. Furthermore, the lowest singlet excitation energy level of the guest compound $ES_1^G$ is lower than the lowest singlet excitation energy level of the host compound $ES_1^H$, and thereby the singlet excitation energy of the host compound can be efficiently transferred to the guest compound. Moreover, the singlet excitation energy of the guest compound can be reliably confined within the guest compound. According to the mechanism, the singlet excitation energy formed in the delayed fluorescent exciplex layer and the like can be efficiently converted to light emission of the light emitting material, thereby achieving an organic electroluminescent device having a high light emission efficiency. Any one of the lowest singlet excitation energy level of the exciplex $ES_1$ and the lowest singlet excitation energy level of the host compound $ES_1^H$ may be lower than the other, and when the relationship, $ES_1 > ES_1^H$, is satisfied, the singlet excitation energy of the exciplex can be transferred to the host compound more efficiently. A part of the light emission of the light emitting layer may be light emission from the host compound.

The lowest singlet excitation energy level of the exciplex formed with the donor compound and the acceptor compound $ES_1$ is preferably from 1.9 to 3.1 eV, more preferably from 2.1 to 2.9 eV, and further preferably from 2.3 to 2.7 eV. The lowest singlet excitation energy level of the host compound $ES_1^H$ is preferably from 1.9 to 3.3 eV, more preferably from 2.1 to 3.1 eV, and further preferably from 2.3 to 2.8 eV. The lowest singlet excitation energy level of the guest compound $ES_1^G$ is preferably from 1.9 to 3.1 eV, more preferably from 2.0 to 2.9 eV, and further preferably from 2.1 to 2.7 eV.

In the case where the host compound is used, the amount of the light emitting material contained in the light emitting layer is preferably 0.1% by weight or more, and more preferably 1% by weight or more, and is preferably 50% by weight or less, more preferably 20% by weight or less, and further preferably 10% by weight or less.

The host compound in the light emitting layer is more preferably such an organic compound that satisfies the condition shown by the expression (1), has a hole transporting function and an electron transporting function, prevents the emitted light from being increased in wavelength, and has a high glass transition temperature. Specific examples of the preferred compound that is capable of being used as the host material in the invention are shown below. The range of the host material that is capable of being used in the invention is not construed as being limited to the following specific examples.

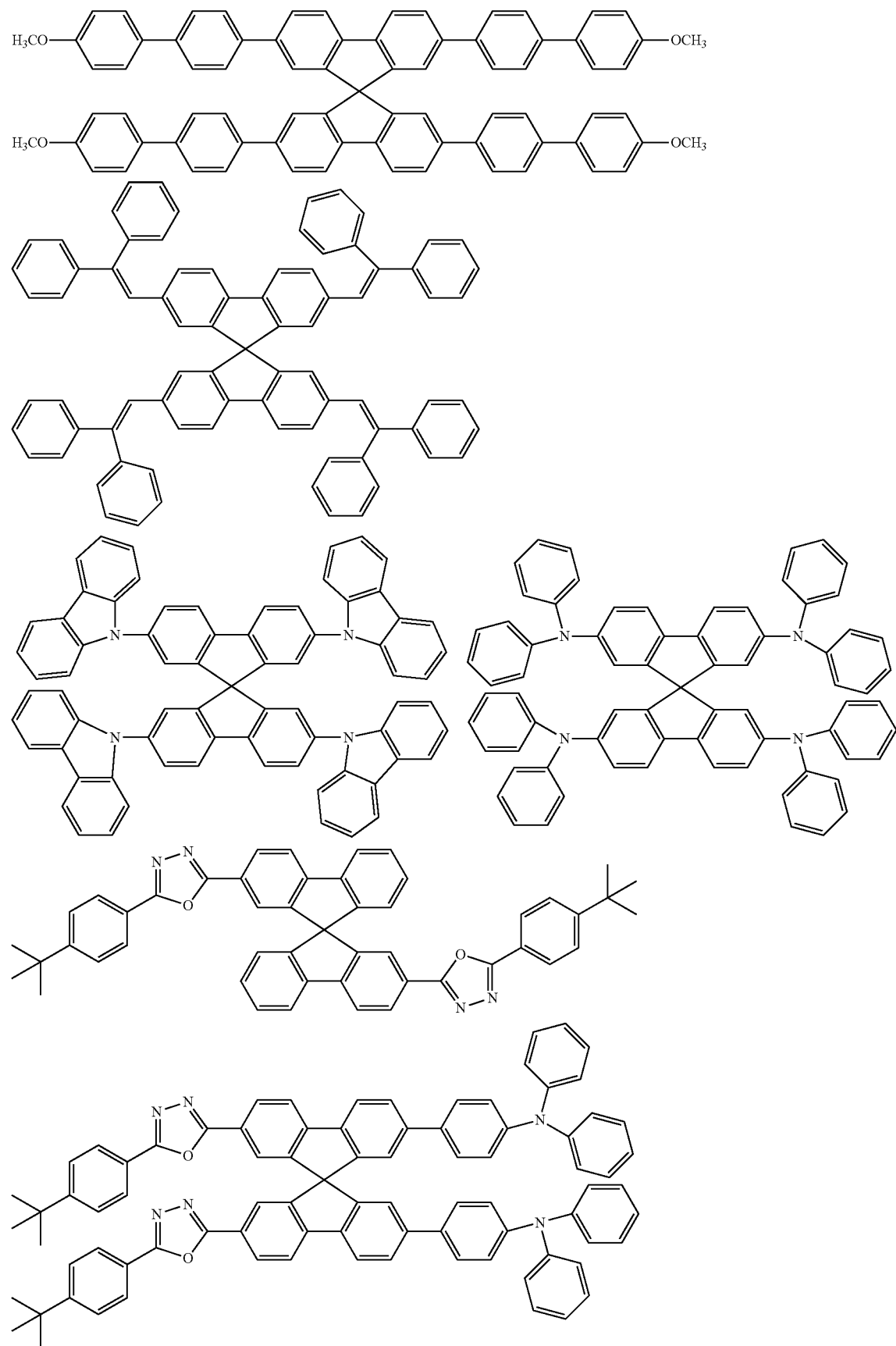

-continued
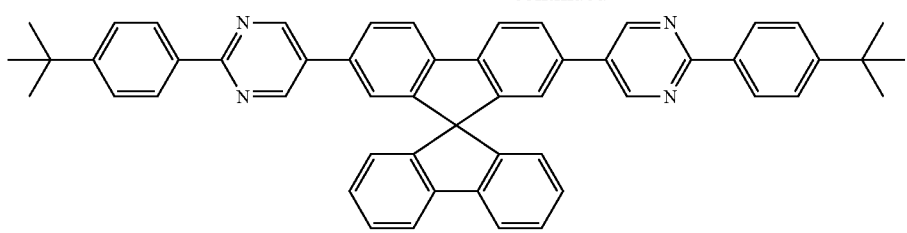
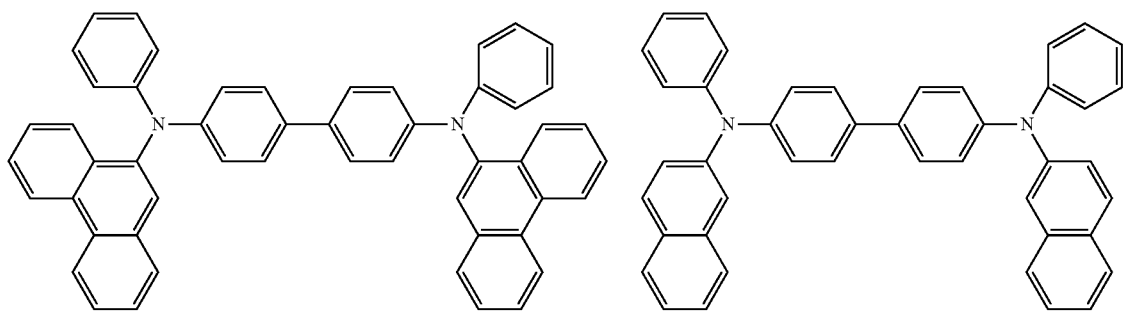
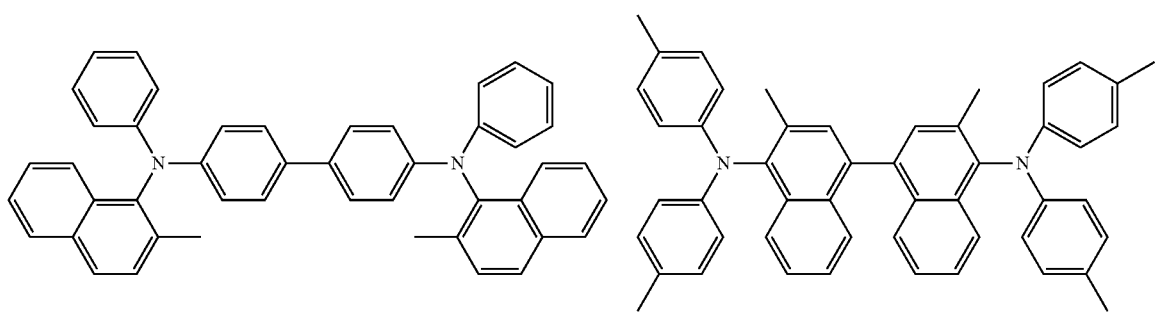
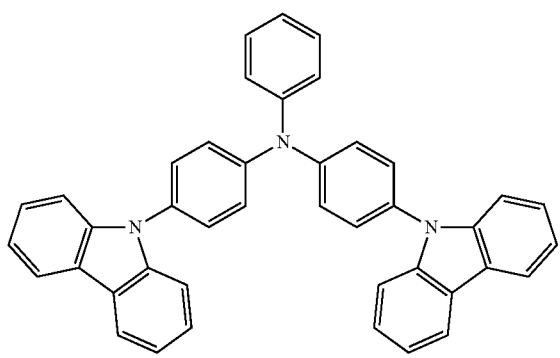

-continued
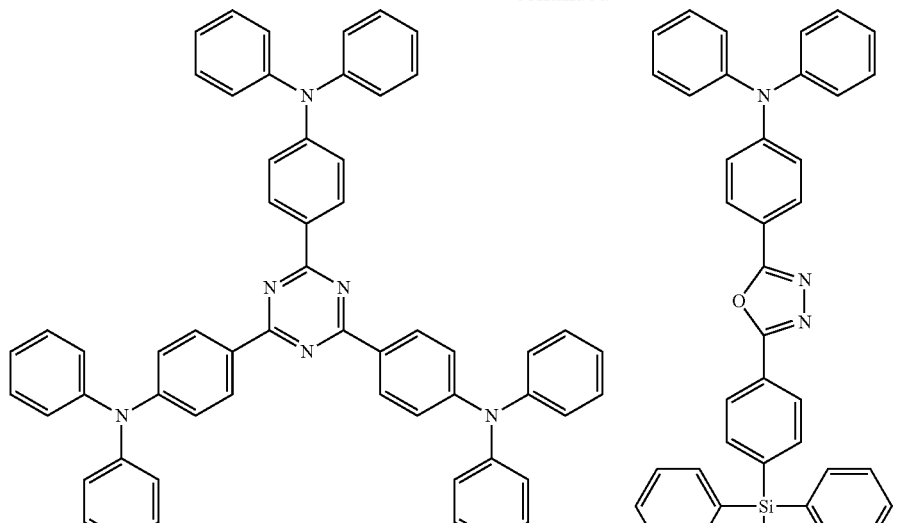
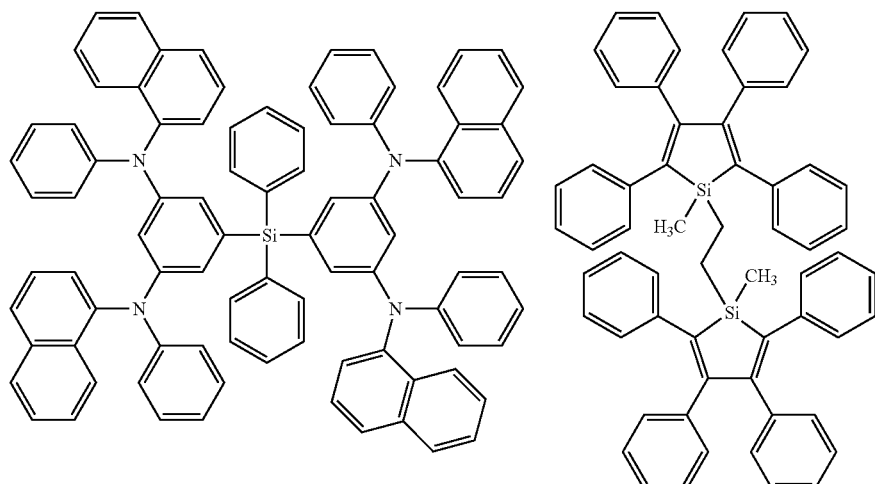
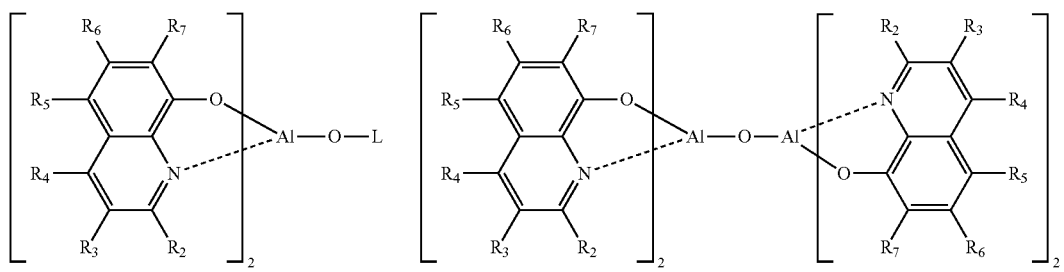
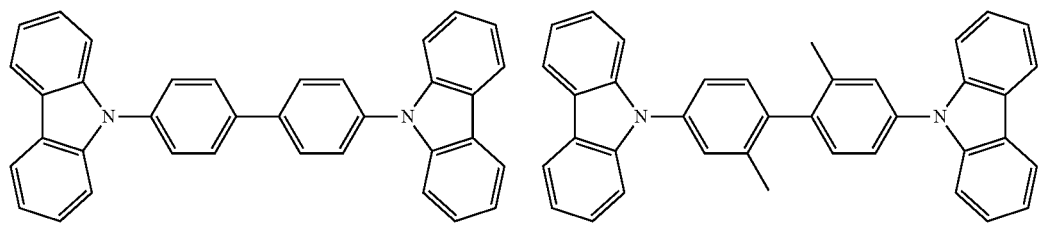

-continued
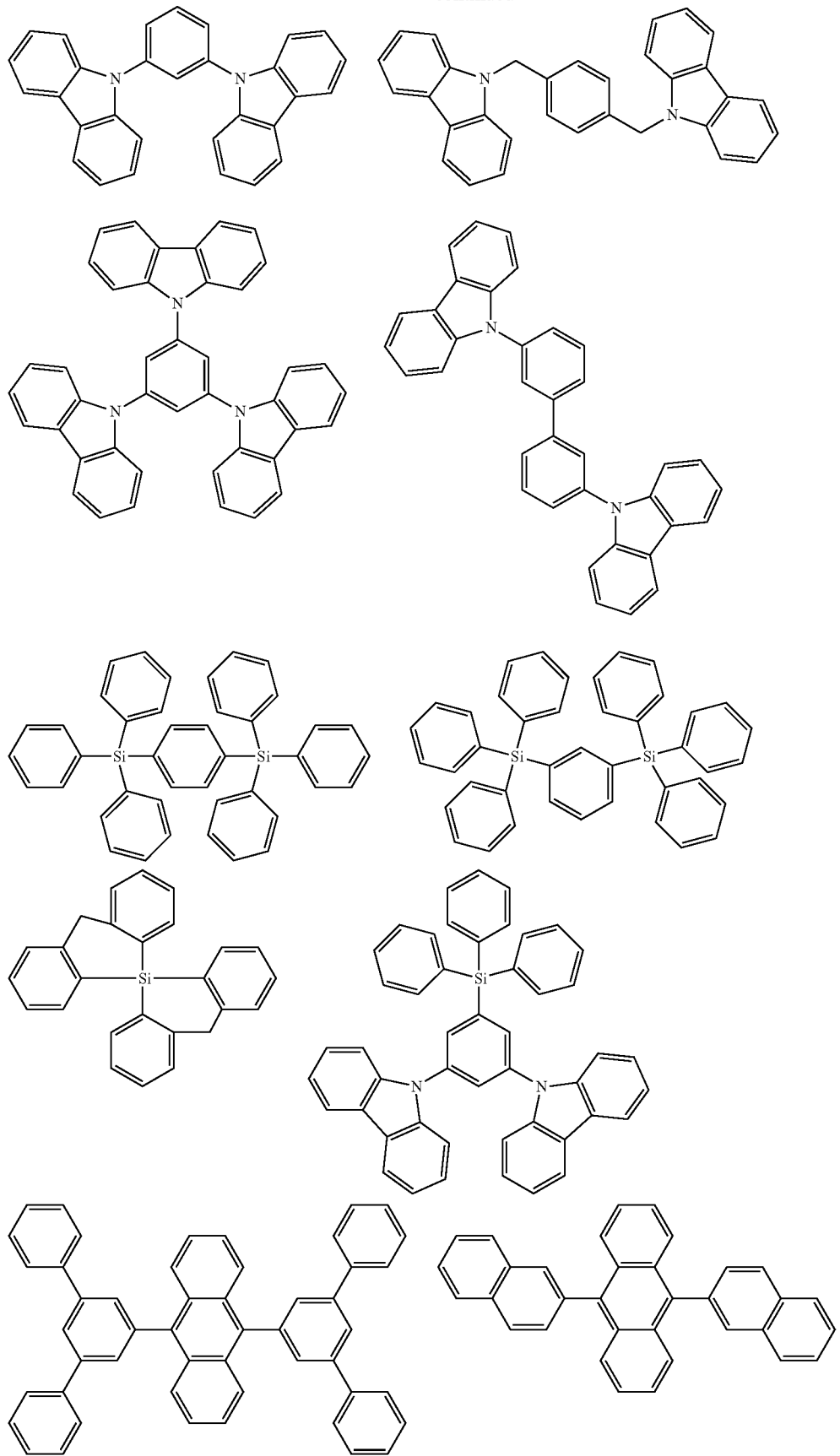

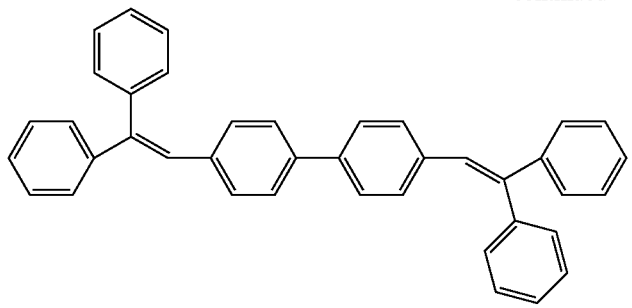
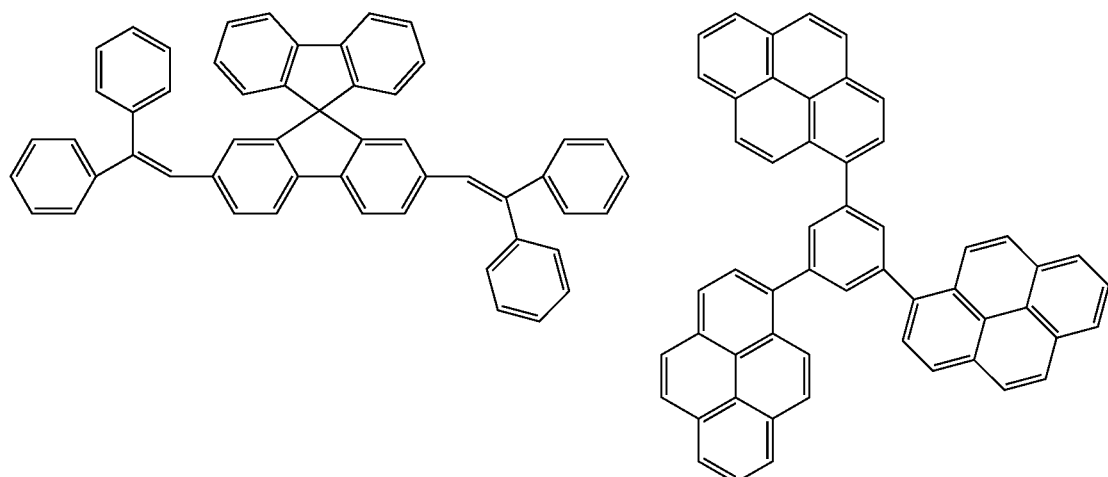
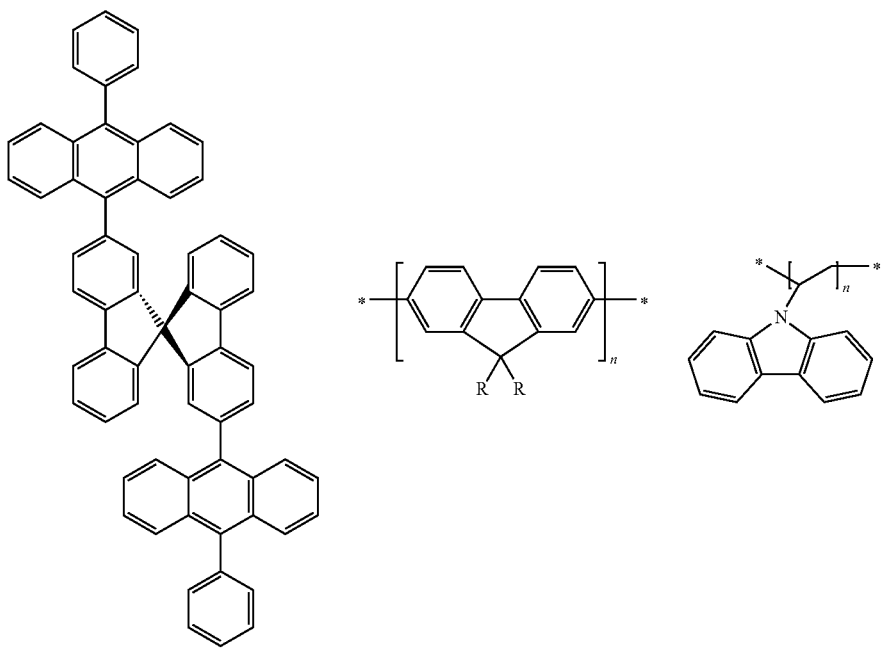

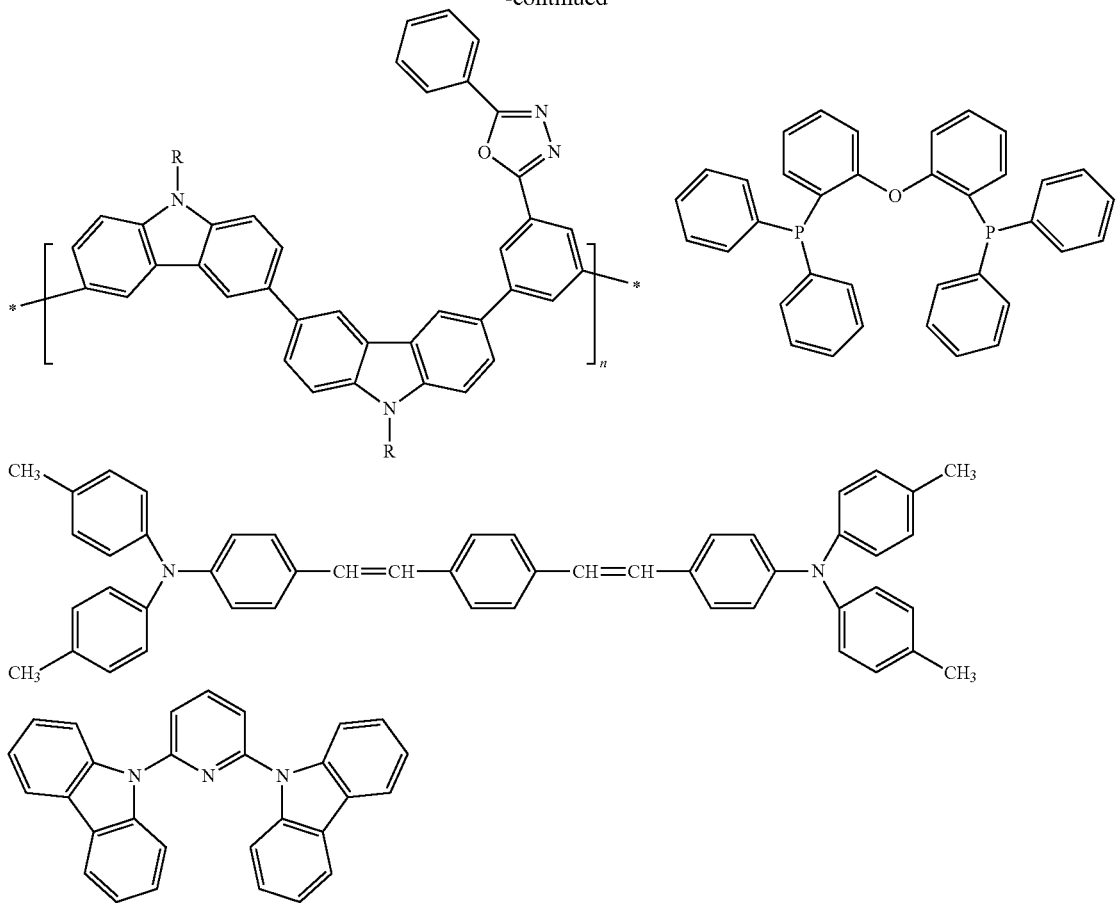

Triplet Exciton Blocking Layer

In the case where the organic electroluminescent device of the invention employs a system shown, for example, in Example 4, in which the Dexter transfer of the triplet excitation energy from the delayed fluorescent exciplex layer to the light emitting layer frequently occurs, the organic electroluminescent device preferably has a triplet exciton blocking layer provided between the light emitting layer and the delayed fluorescent exciplex layer. The triplet exciton blocking layer has a function of suppressing transfer of the triplet excitation energy from the delayed fluorescent exciplex layer to the light emitting layer. The triplet exciton blocking layer provided may enhance the light emission efficiency of the organic electroluminescent device due to the following factors.

Specifically, while the inverse intersystem crossing from the triplet excited state to the singlet excited state occurs in the delayed fluorescent exciplex layer, there may be a case where the energy transfer of the triplet excited state occurs to the adjacent organic layer, before the inverse intersystem crossing. In this case, when the light emitting material in the light emitting layer receives the triplet excitation energy from the delayed fluorescent exciplex layer, the light emitting material is thermally deactivated without light emission, and thus the energy is wasted. In the case where the triplet exciton blocking layer is provided between the light emitting layer and the delayed fluorescent exciplex layer, on the other hand, the transfer of the triplet excitation energy from the delayed fluorescent exciplex layer to the light emitting layer is suppressed, and thereby the triplet excited state formed in the delayed fluorescent exciplex layer can be reliably subjected to the inverse intersystem crossing and made to contribute to the fluorescent light emission. Consequently, the light emission efficiency of the organic electroluminescent device can be enhanced.

In the case where the organic electroluminescent device employs a system, in which the Dexter transfer of the triplet excitation energy from the delayed fluorescent exciplex layer to the light emitting layer does not frequently occur, the triplet exciton blocking layer may not be formed to simplify the structure of the organic electroluminescent device. Examples of the delayed fluorescent exciplex layer of this type include a combination of CzTTP1 and PPT and a combination of dBTBdA and PPT.

Blocking Compound

The material constituting the triplet exciton blocking layer is preferably an organic compound (blocking compound) that satisfies the condition shown by the following expression (2) with respect to the donor compound and the acceptor compound contained in the delayed fluorescent exciplex layer and the host compound and the guest compound contained in the light emitting layer.

$$ET_1^B > ET_1 > ET_1^H > ET_1^G \qquad (2)$$

In the expression (2), $ET_1^B$ represents the lowest triplet excitation energy level of the blocking compound; $ET_1$ represents the lowest triplet excitation energy level of the exciplex formed with the donor compound and the acceptor compound; $ET_1^H$ represents the lowest triplet excitation energy level of the host compound; and $ET_1^G$ represents the lowest triplet excitation energy level of the guest compound.

In the invention, the lowest triplet excitation energy level may be measured in the following manner. In the following method, the case using the compound to be measured and mCBP is described.

The same specimen as used for the measurement of the singlet energy $ES_1$ is cooled to 5 K, the specimen for measuring phosphorescent light is irradiated with excitation light (337 nm), and the phosphorescence intensity is measured with a streak camera. The light emission is accumulated from immediately after 1 msec from the incidence of excitation light to after 10 msec from the incidence, thereby providing a phosphorescence spectrum with the phosphorescence intensity as the ordinate and the wavelength as the abscissa. The wavelength λ of the peak on the short wavelength side of the light emission spectrum is converted to an energy value according to the following conversion expression to provide the lowest triplet excitation energy level $ET_1$.

$$ET_1 \text{ (eV)}=1{,}239.85/\lambda_{edge} \quad \text{Conversion Expression}$$

In the structure having no triplet exciton blocking layer, when the lowest triplet excitation energy level of the exciplex $ET_1$, the lowest triplet excitation energy level of the host compound $ET_1^H$, and the lowest triplet excitation energy level of the guest compound $ET_1^G$ are in the relationship, $ET_1 > ET_2^H > ET_1^G$, the triplet excited state formed in the delayed fluorescent exciplex layer easily undergoes energy transfer to the guest compound through the host compound. On the other hand, in the case where the organic compound layer having such a lowest triplet excitation energy level $ET_1^B$ that is larger than the lowest triplet excitation energy level of the exciplex $ET_1$ as shown by the expression (2) is provided between the light emitting layer and the delayed fluorescent exciplex layer, the organic compound layer functions as the triplet exciton blocking layer, and thereby the transfer of the triplet excitation energy from the delayed fluorescent exciplex layer to the light emitting layer can be suppressed.

The lowest triplet excitation energy level $ET_1^B$ of the blocking compound is preferably from 2.0 to 3.2 eV, more preferably from 2.2 to 3.0 eV, and further preferably from 2.4 to 2.9 eV. The lowest triplet excitation energy level $ET_1$ of the exciplex formed with the donor compound and the acceptor compound is preferably from 1.9 to 3.1 eV, more preferably from 2.1 to 2.9 eV, and further preferably from 2.3 to 2.8 eV. The lowest triplet excitation energy level $ET_1^H$ of the host compound is preferably from 1.9 to 3.1 eV, more preferably from 2.1 to 2.9 eV, and further preferably from 2.3 to 2.8 eV.

Specific examples of the preferred compound that is capable of being used as the blocking compound in the invention are shown below. mCP shown below is preferably used as a constitutional material of the triplet exciton blocking layer due to the high lowest triplet excitation energy level $ET_1^B$ thereof.

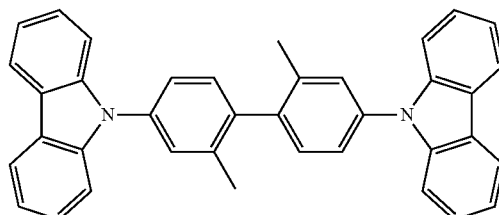

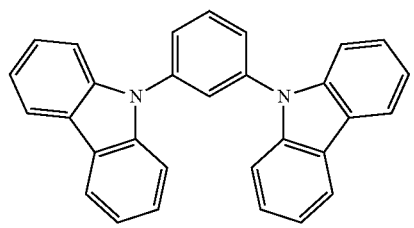

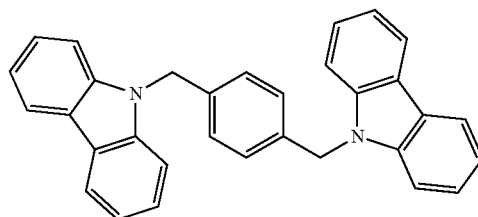

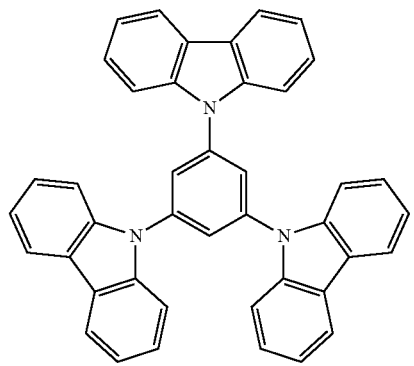

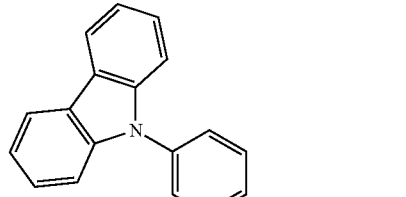

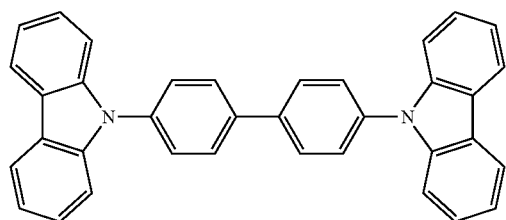

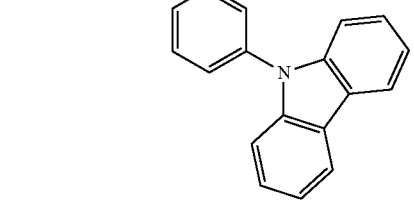

-continued

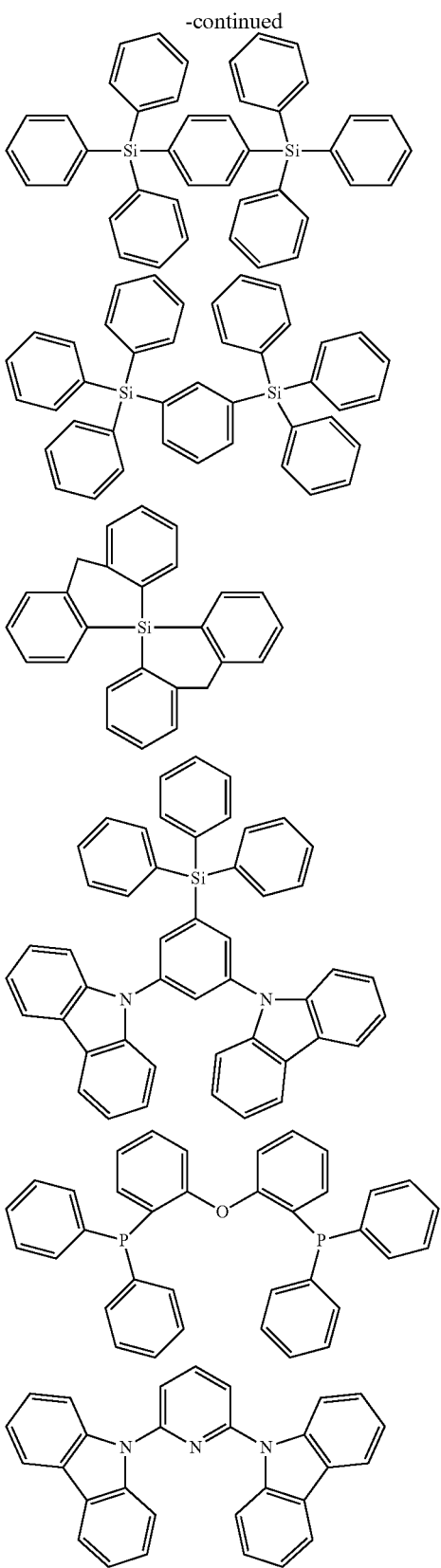

Thickness of Triplet Exciton Blocking Layer

The thickness of the triplet exciton blocking layer is preferably selected in consideration of the Foerster energy transfer radius $R_0$ between the exciplex in the delayed fluorescent exciplex layer and the light emitting material in the light emitting layer. Specifically, it is preferred that the thickness of the triplet exciton blocking layer is sufficiently larger than 2 nm, which is the ordinary Dexter energy transfer distance, and is smaller than the Foerster energy transfer radius.

The Foerster energy transfer radius herein is measured with the molar absorbance coefficient of the guest compound and the light emission spectrum of the delayed fluorescent exciplex.

By selecting the thickness of the triplet exciton blocking layer from the aforementioned range, the distance between the light emitting layer and the delayed fluorescent exciplex layer can be regulated to such a range that the energy transfer through the Foerster mechanism can be performed, while enjoying the function of the triplet excitation blocking layer, and thus the singlet excitation energy formed in the delayed fluorescent exciplex layer can be efficiently transferred to the light emitting layer.

For example, the Foerster energy transfer radius $R_0$ is 3.5 nm in the case where C545T is used as the light emitting material, TTP is used as the donor compound in the delayed fluorescent exciplex layer, and PPT is used as the acceptor compound in the delayed fluorescent exciplex layer. In the case where mCP is used as the blocking compound in combination with these compounds, the thickness of the triplet exciton blocking layer is preferably from 2 to 8 nm, more preferably from 3 to 5 nm, and further preferably from 3.5 to 4.5 nm.

Additional Organic Layers

The organic electroluminescent device of the invention may have organic layers shown below, in addition to the delayed fluorescent exciplex layer, the light emitting layer, and the triplet exciton blocking layer.

Injection Layer

The injection layer is a layer that is provided between the electrode and the organic layer, for decreasing the driving voltage and enhancing the light emission luminance, and includes a hole injection layer and an electron injection layer, which may be provided between the anode and the light emitting layer or the hole transporting layer and between the cathode and the light emitting layer or the electron transporting layer. The injection layer may be provided depending on necessity.

Barrier Layer

The barrier layer is a layer that is capable of inhibiting charges (electrons or holes) and/or excitons present in the light emitting layer from being diffused outside the light emitting layer. The electron barrier layer may be disposed between the light emitting layer and the hole transporting layer, and inhibits electrons from passing through the light emitting layer toward the hole transporting layer. Similarly, the hole barrier layer may be disposed between the light emitting layer and the electron transporting layer, and inhibits holes from passing through the light emitting layer toward the electron transporting layer. The barrier layer may also be used for inhibiting excitons from being diffused outside the light emitting layer. Thus, the electron barrier layer and the hole barrier layer each may also have a function as an exciton barrier layer. The term "the electron barrier layer" or "the exciton barrier layer" referred herein is intended to include a layer that has both the functions of an electron barrier layer and an exciton barrier layer by one layer.

Hole Barrier Layer

The hole barrier layer has the function of an electron transporting layer in a broad sense. The hole barrier layer has a function of inhibiting holes from reaching the electron transporting layer while transporting electrons, and thereby enhances the recombination probability of electrons and holes in the light emitting layer. As the material for the hole barrier layer, the materials for the electron transporting layer described later may be used depending on necessity.

Electron Barrier Layer

The electron barrier layer has the function of transporting holes in a broad sense. The electron barrier layer has a function of inhibiting electrons from reaching the hole transporting layer while transporting holes, and thereby enhances the recombination probability of electrons and holes in the light emitting layer.

Exciton Barrier Layer

The exciton barrier layer is a layer for inhibiting excitons generated through recombination of holes and electrons in the light emitting layer from being diffused to the charge transporting layer, and the use of the layer inserted enables effective confinement of excitons in the light emitting layer, and thereby enhances the light emission efficiency of the device. The exciton barrier layer may be inserted adjacent to the light emitting layer on any of the side of the anode and the side of the cathode, and on both the sides. Specifically, in the case where the exciton barrier layer is present on the side of the anode, the layer may be inserted between the hole transporting layer and the light emitting layer and adjacent to the light emitting layer, and in the case where the layer is inserted on the side of the cathode, the layer may be inserted between the light emitting layer and the cathode and adjacent to the light emitting layer. Between the anode and the exciton barrier layer that is adjacent to the light emitting layer on the side of the anode, a hole injection layer, an electron barrier layer and the like may be provided, and between the cathode and the exciton barrier layer that is adjacent to the light emitting layer on the side of the cathode, an electron injection layer, an electron transporting layer, a hole barrier layer and the like may be provided. In the case where the barrier layer is provided, the material used for the barrier layer preferably has excited singlet energy and excited triplet energy, at least one of which is higher than the excited singlet energy and the excited triplet energy of the light emitting material, respectively.

Hole Transporting Layer

The hole transporting layer is formed of a hole transporting material having a function of transporting holes, and the hole transporting layer may be provided as a single layer or plural layers.

The hole transporting material has one of injection or transporting property of holes and barrier property of electrons, and may be any of an organic material and an inorganic material. Examples of known hole transporting materials that may be used herein include a triazole derivative, an oxadiazole derivative, an imidazole derivative, a carbazole derivative, an indolocarbazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer and an electroconductive polymer oligomer, particularly a thiophene oligomer. Among these, a porphyrin compound, an aromatic tertiary amine compound and a styrylamine compound are preferably used, and an aromatic tertiary amine compound is more preferably used.

Electron Transporting Layer

The electron transporting layer is formed of a material having a function of transporting electrons, and the electron transporting layer may be provided as a single layer or plural layers.

The electron transporting material (which may also function as a hole barrier material in some cases) needs only to have a function of transporting electrons, which are injected from the cathode, to the light emitting layer. Examples of the electron transporting layer that may be used herein include a nitro-substituted fluorene derivative, a diphenylquinone derivative, a thiopyran dioxide derivative, carbodiimide, a fluorenylidene methane derivative, anthraquinodimethane and anthrone derivatives, and an oxadiazole derivative. The electron transporting material used may be a thiadiazole derivative obtained by replacing the oxygen atom of the oxadiazole ring of the oxadiazole derivative by a sulfur atom, or a quinoxaline derivative having a quinoxaline ring, which is known as an electron attracting group. Furthermore, polymer materials having these materials introduced to the polymer chain or having these materials used as the main chain of the polymer may also be used.

Specific examples of preferred materials that may be used in the organic electroluminescent device are shown below, but the materials that may be used in the invention are not construed as being limited to the example compounds. The compound that is shown as a material having a particular function may also be used as a material having another function. In the structural formulae of the example compounds, R, R', and $R_1$ to $R_{10}$ each independently represent a hydrogen atom or a substituent; X represents a carbon atom or a hetero atom constituting the ring skeleton, n represents an integer of from 3 to 5; Y represents a substituent; and m represents an integer of 0 or more.

Preferred examples of a compound that may be used as the hole injection material are shown below.

47 48
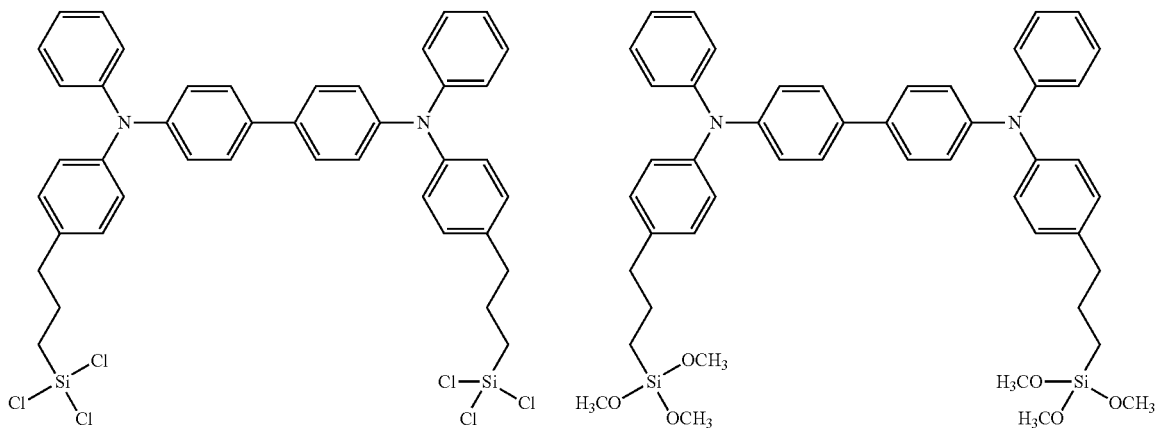
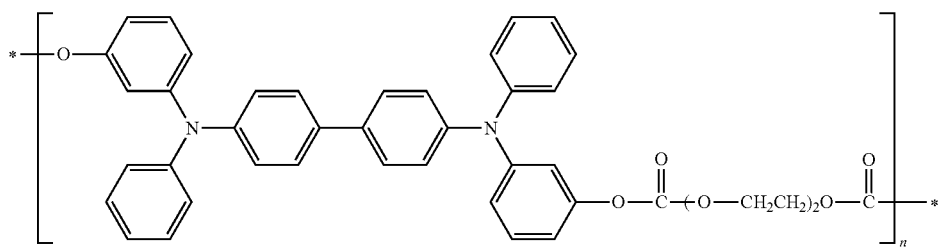
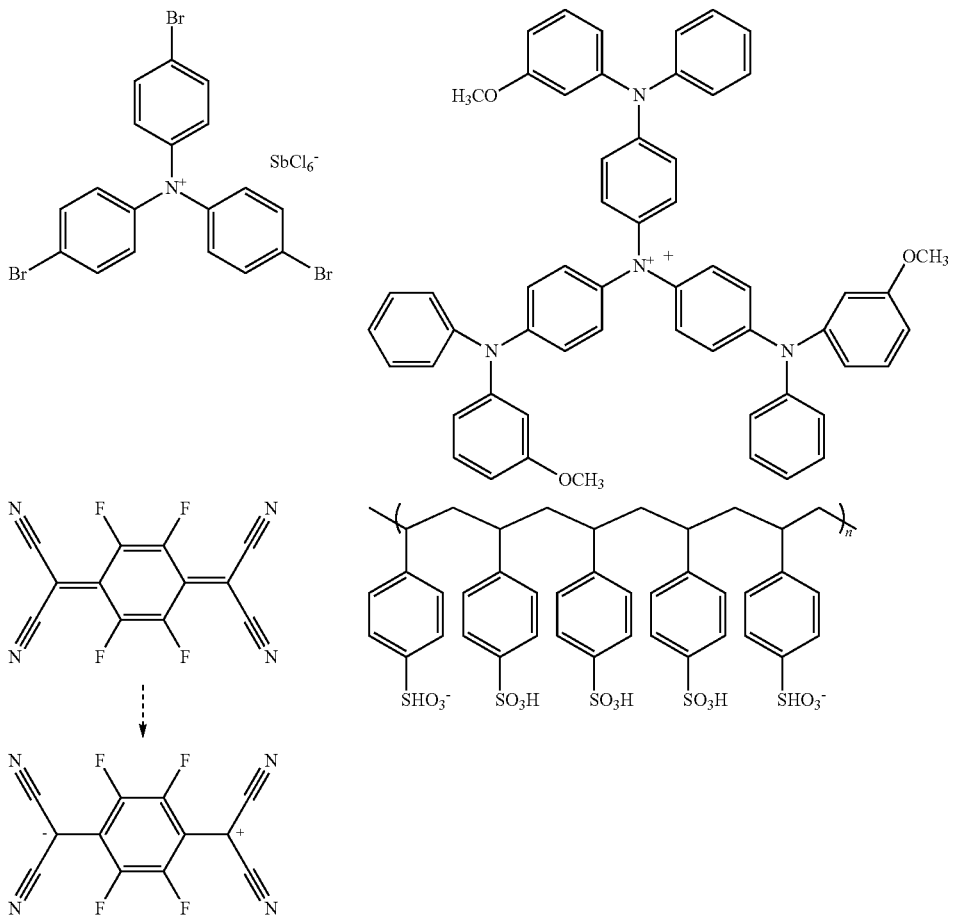

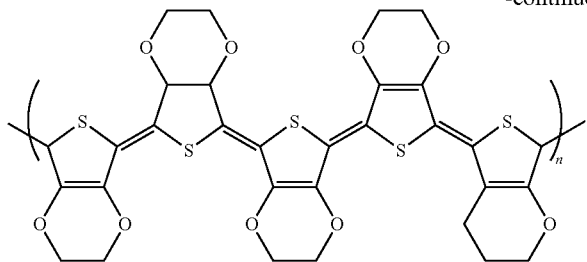
Preferred examples of a compound that may be used as the hole transporting material are shown below.
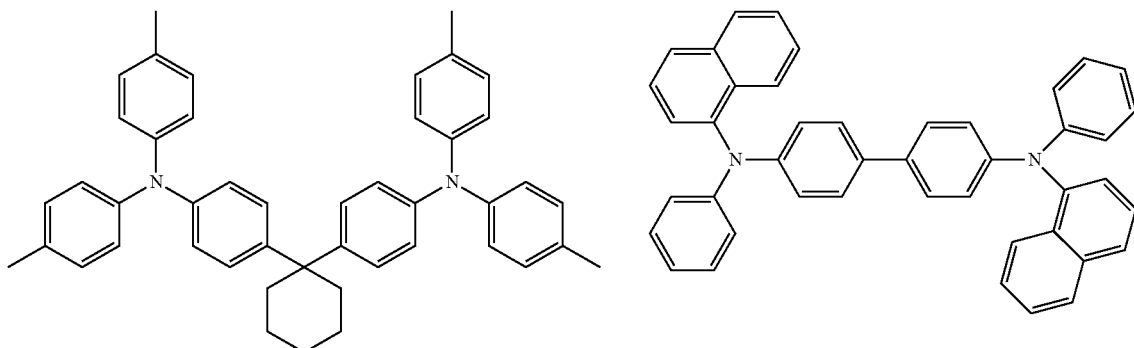
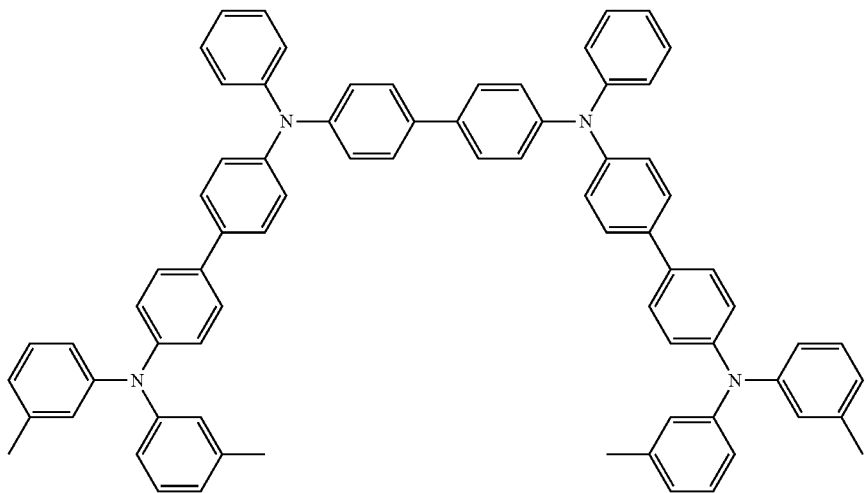
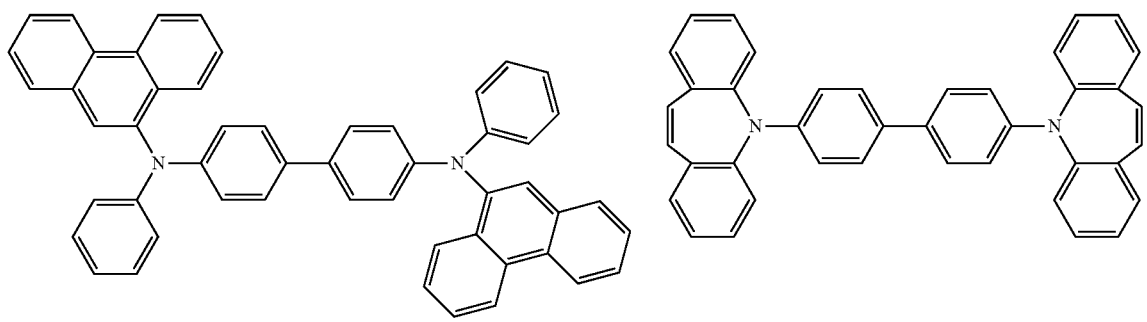

51
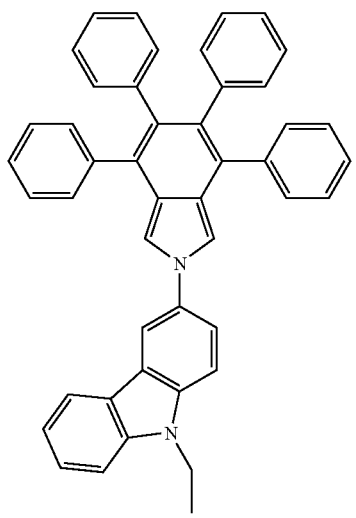
-continued
52
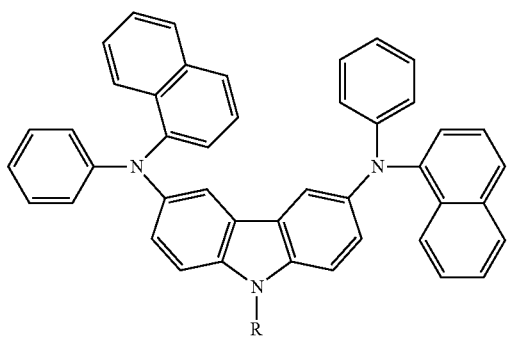
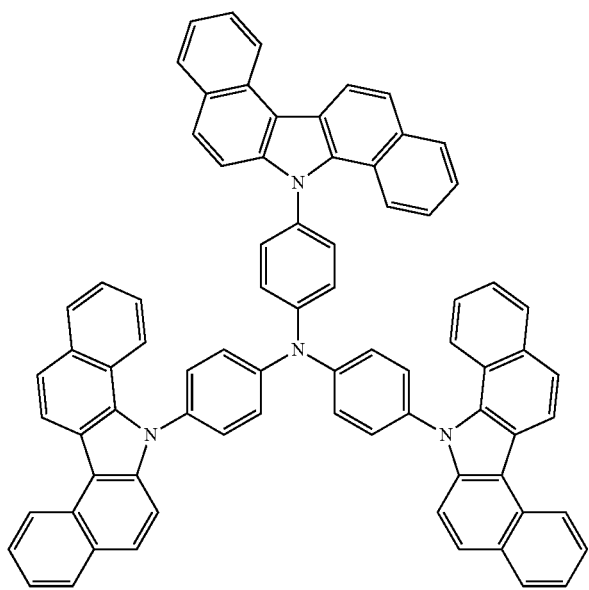
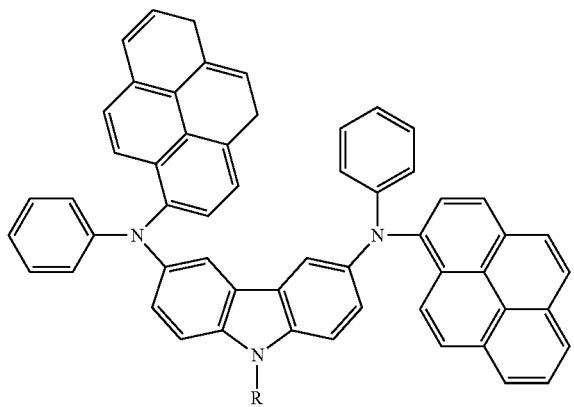

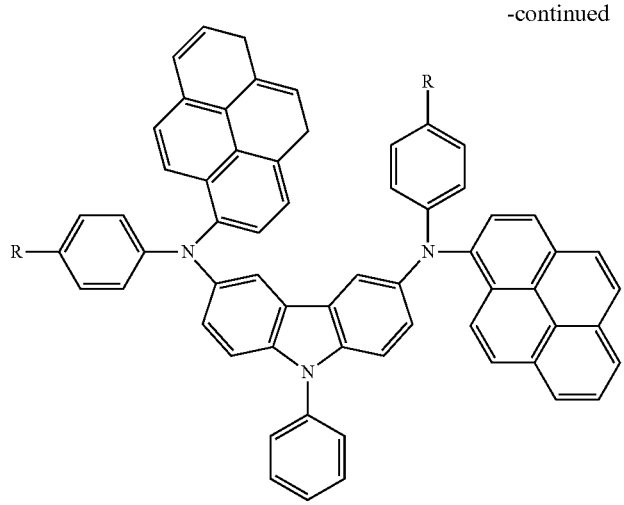
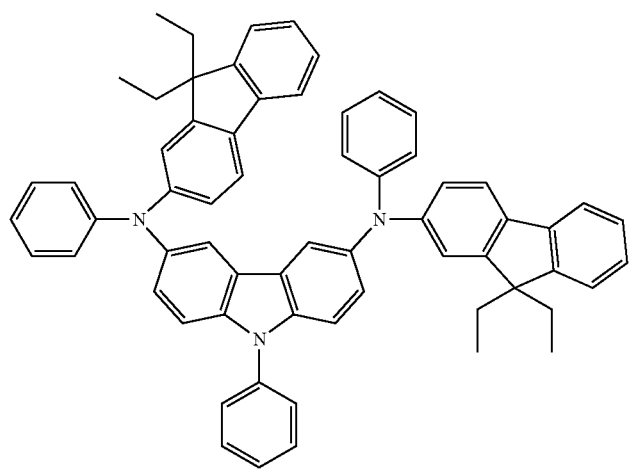
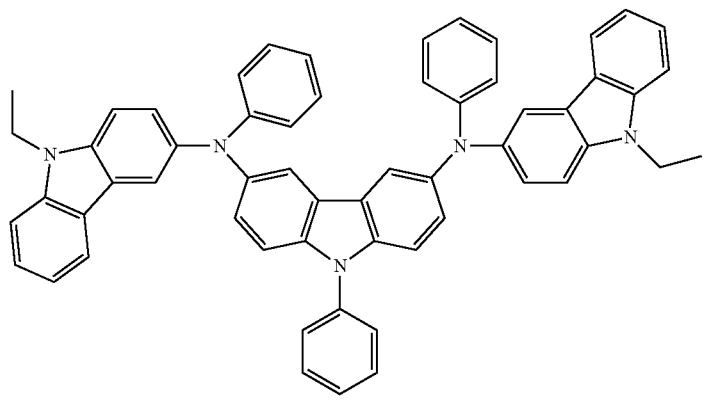

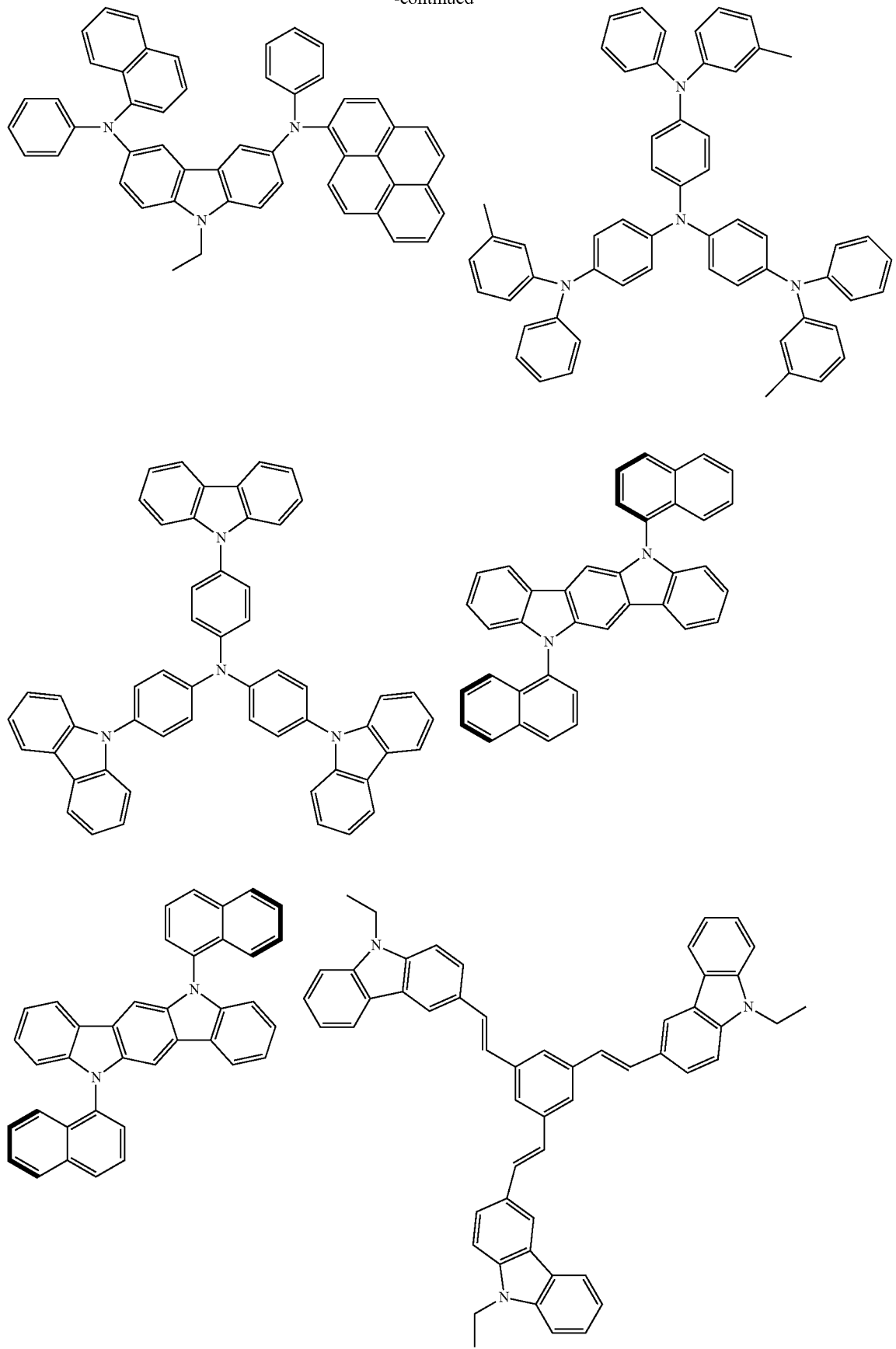

-continued
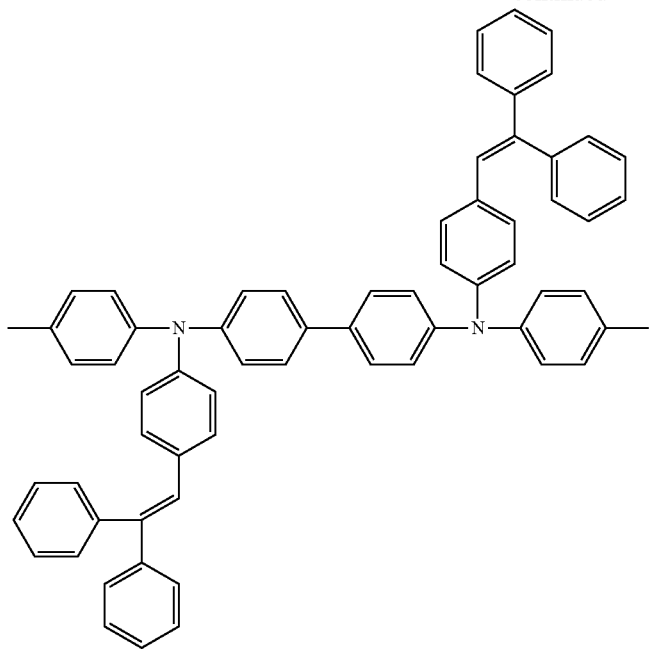
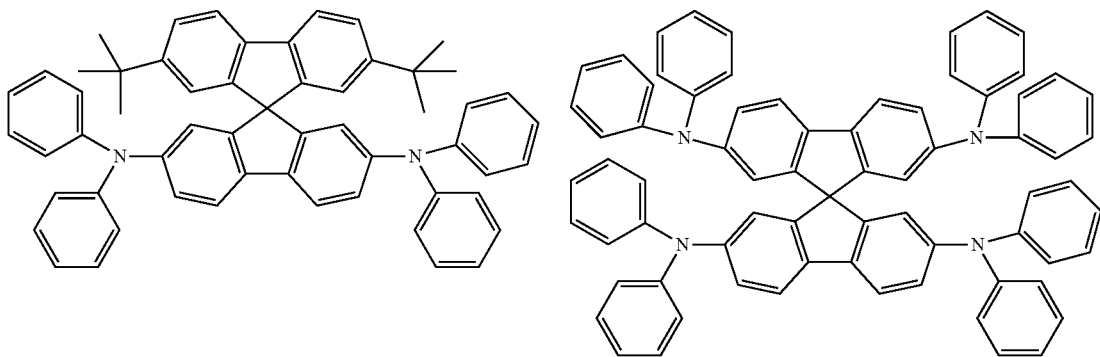
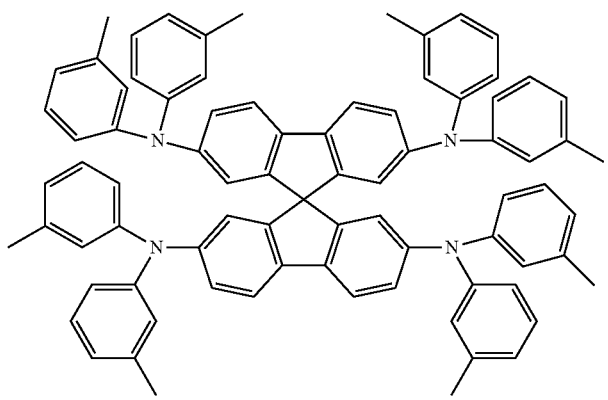

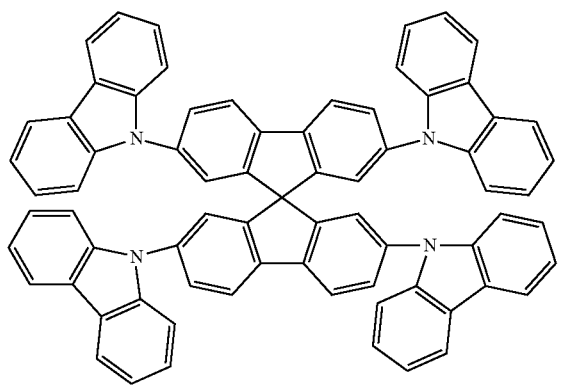
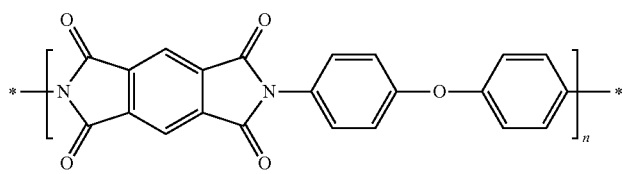
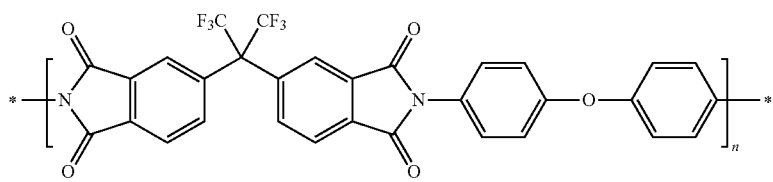
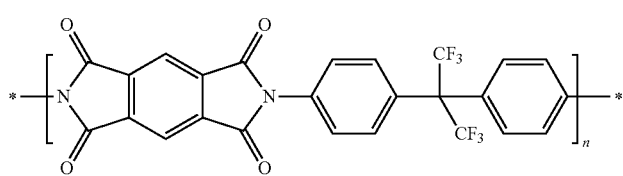

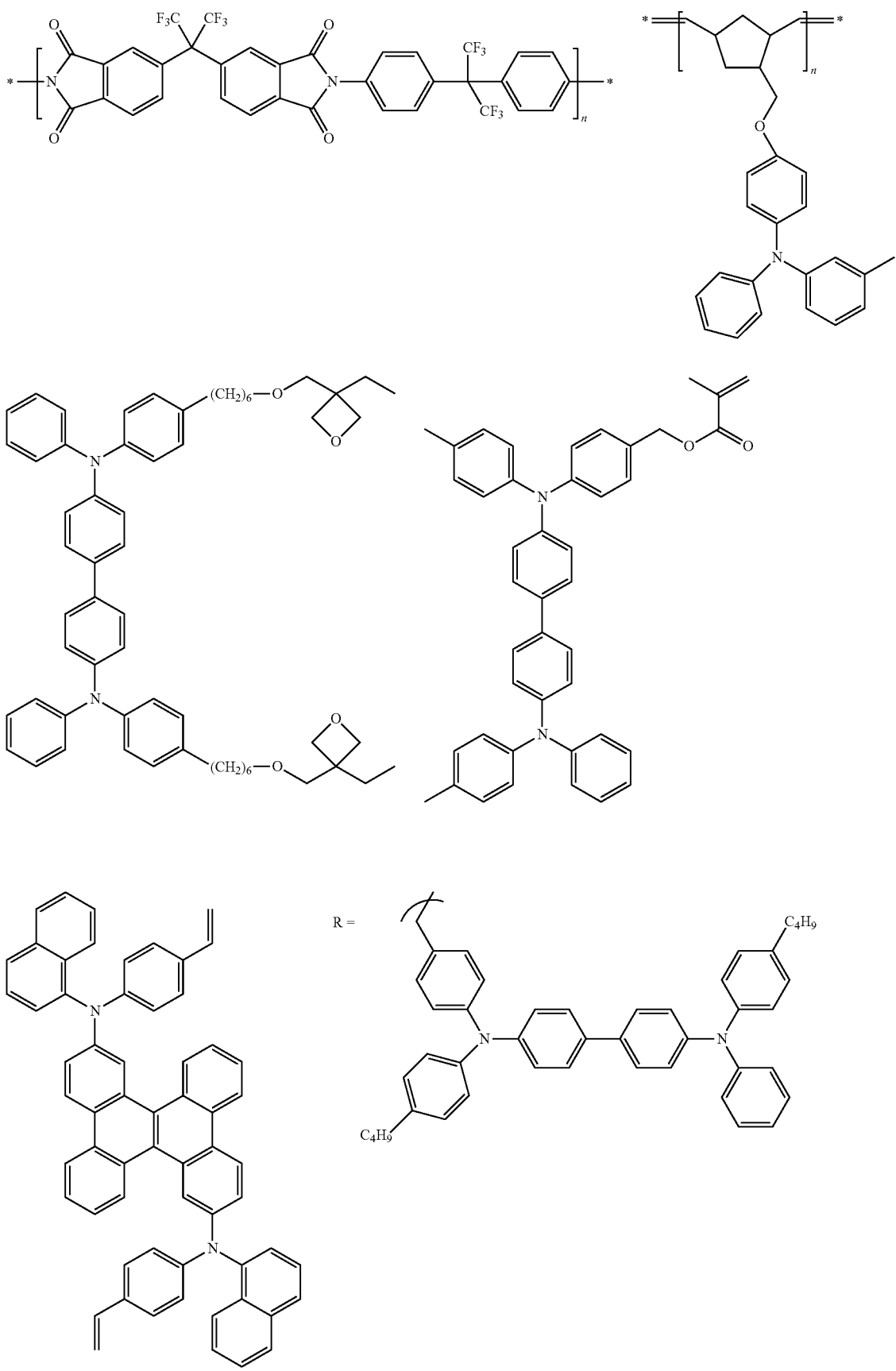

-continued
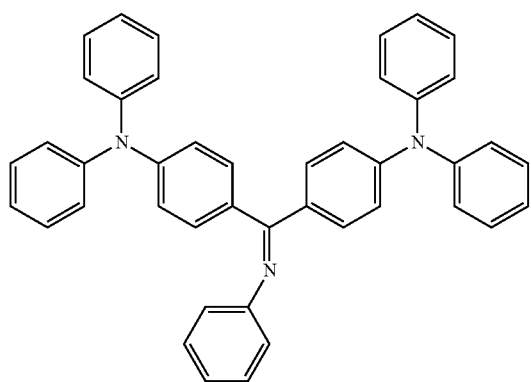
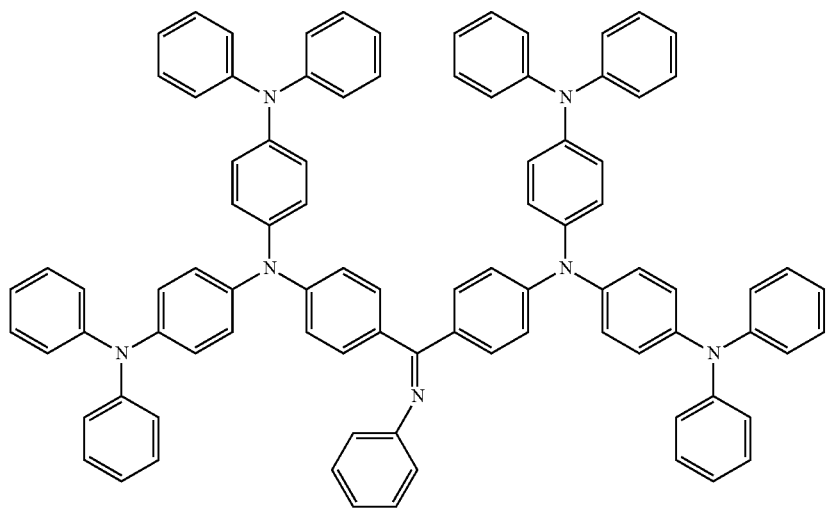
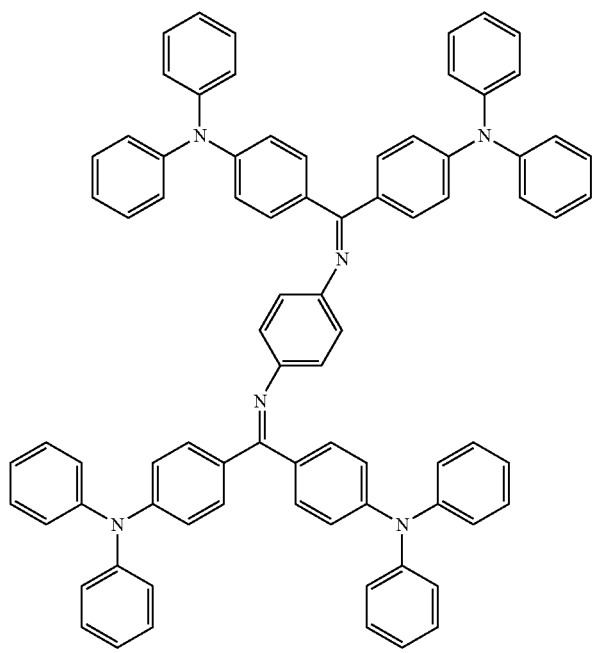

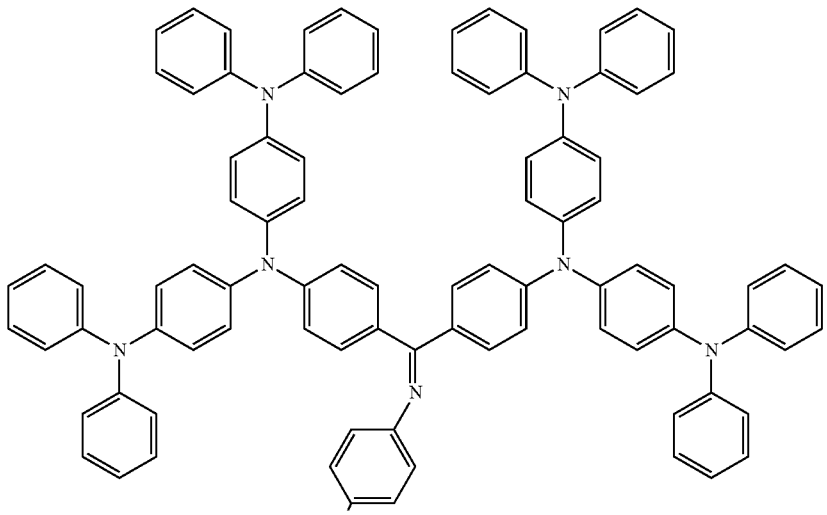
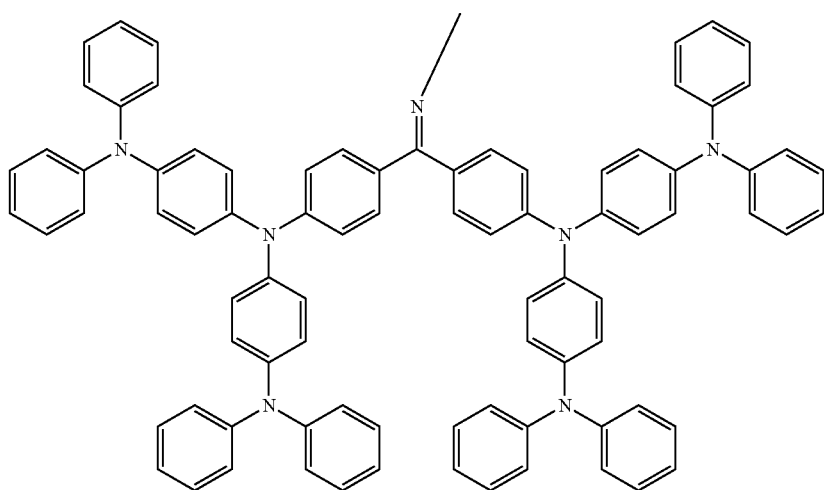
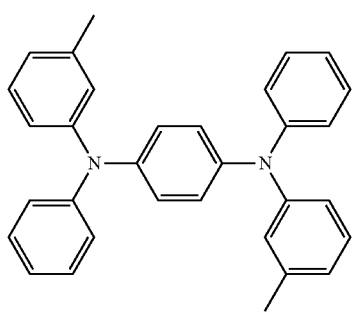

Preferred examples of a compound that may be used as the electron barrier material are shown below.
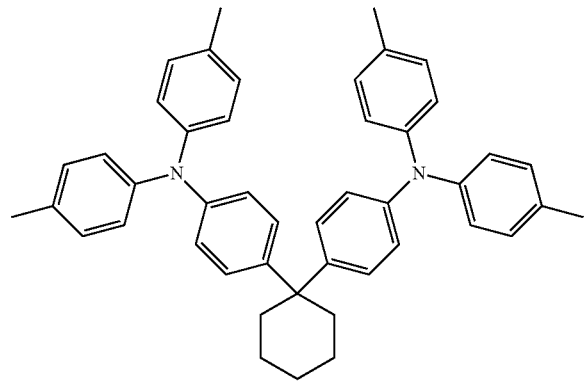
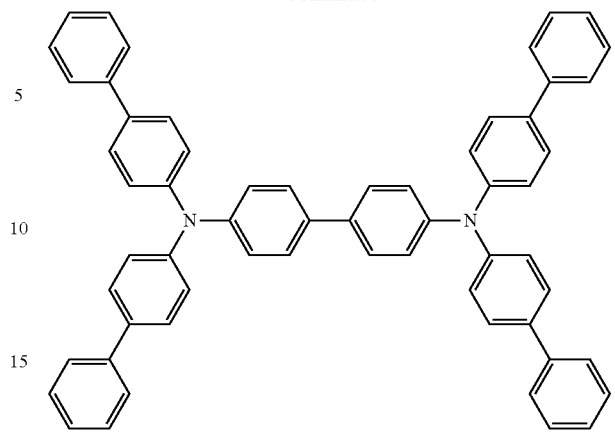
Preferred examples of a compound that may be used as the hole barrier material are shown below.
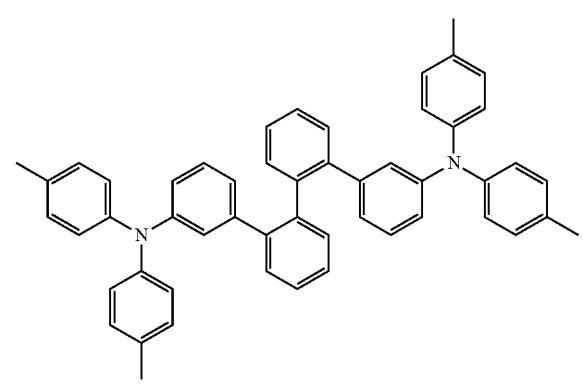
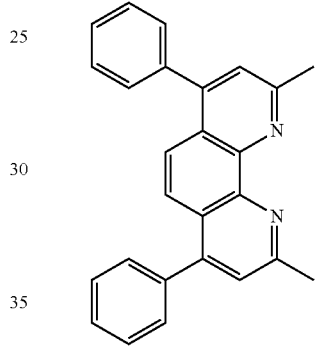
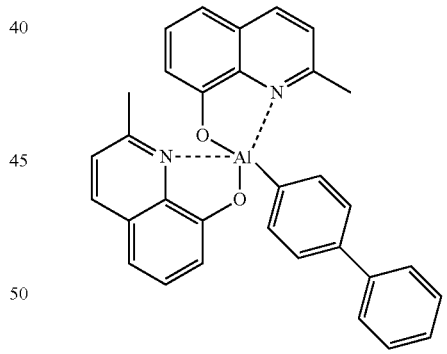
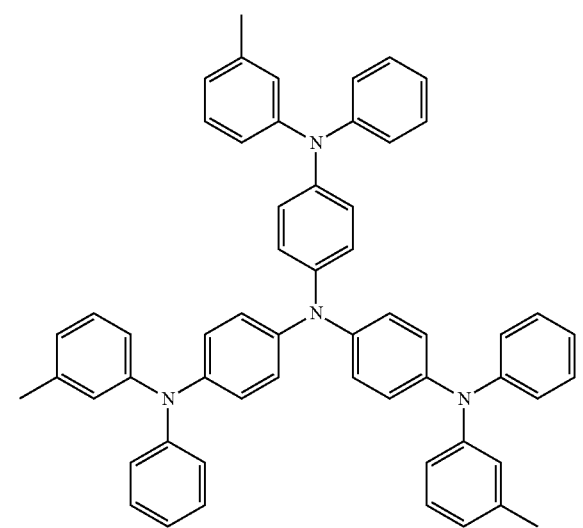
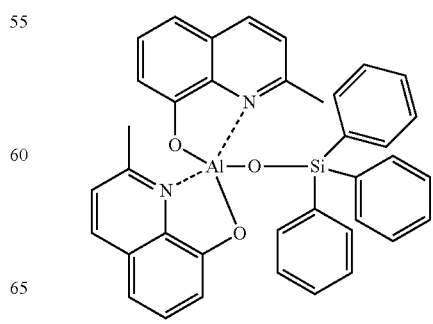

69
-continued
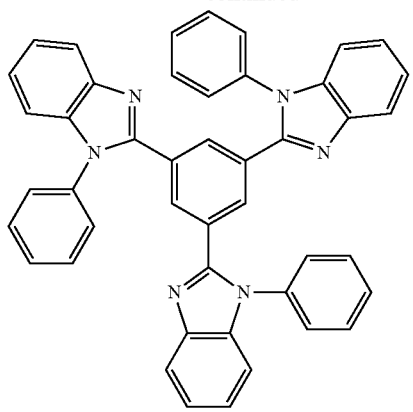
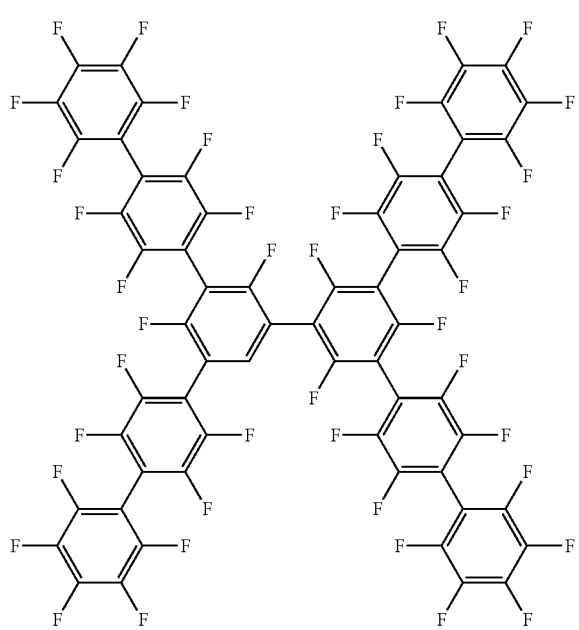
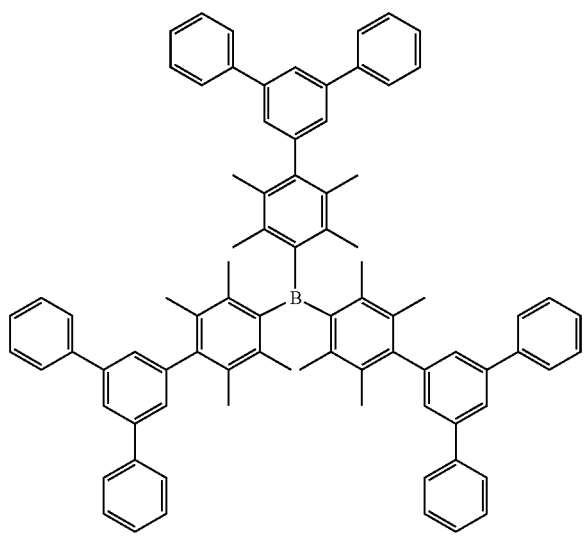
70
-continued
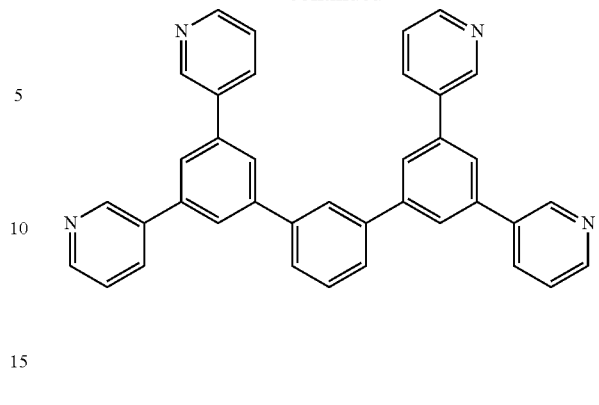
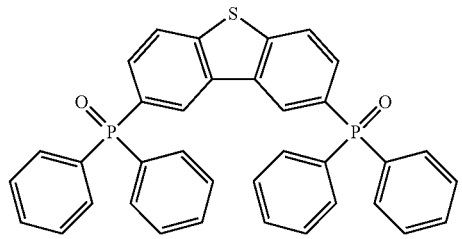
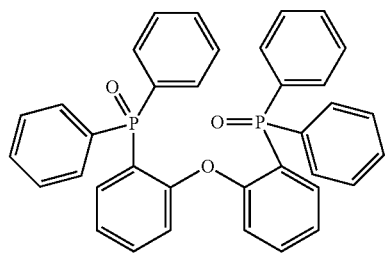
Preferred examples of a compound that may be used as the electron transporting material are shown below.

71 72
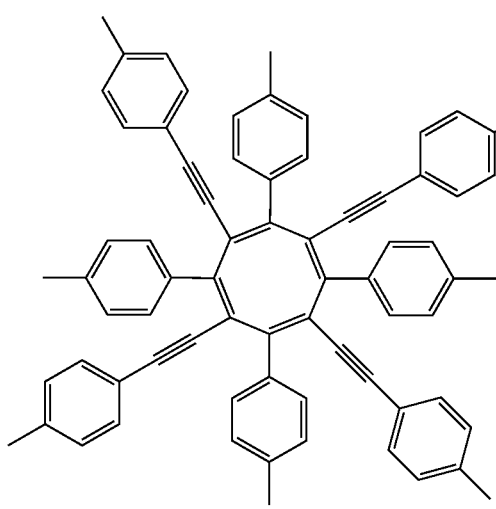
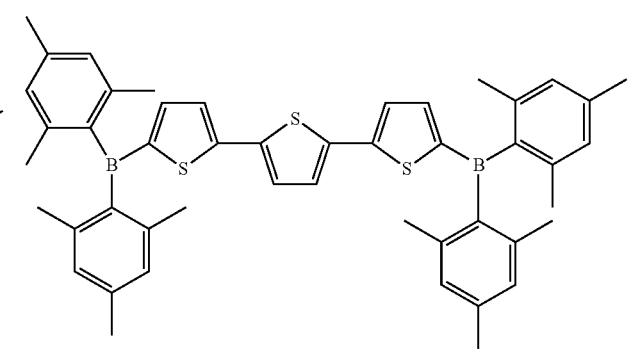
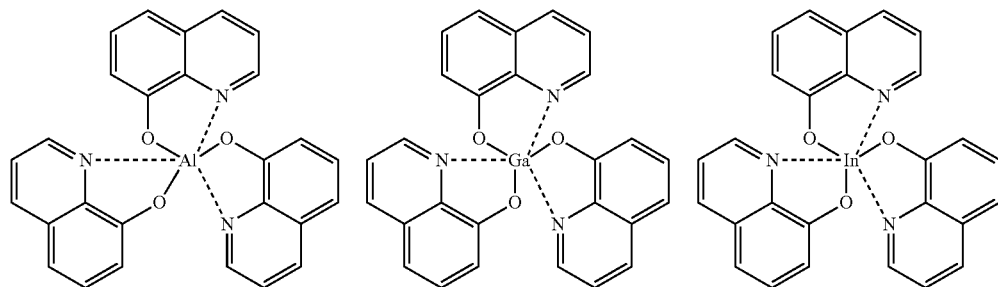
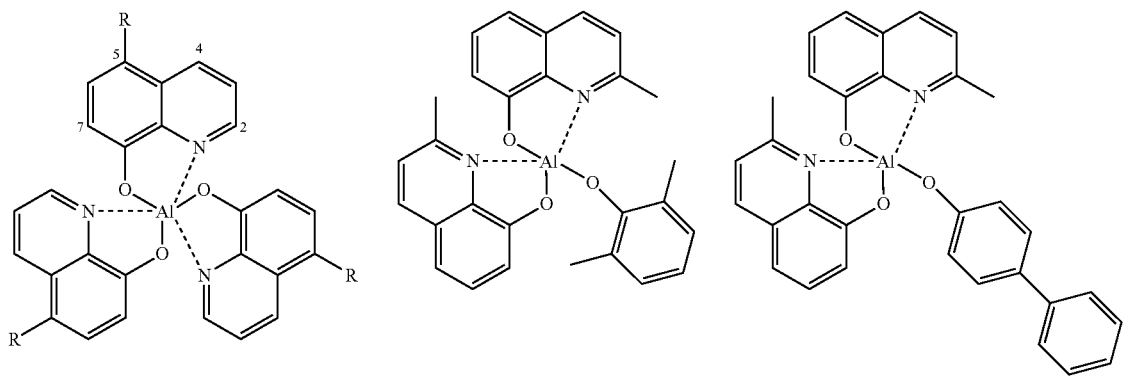
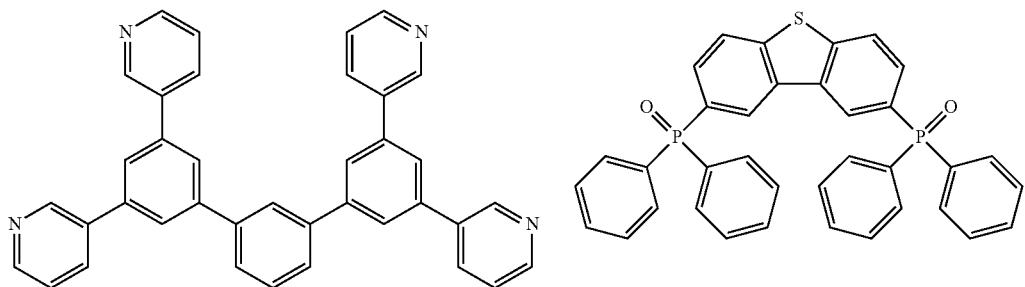

73
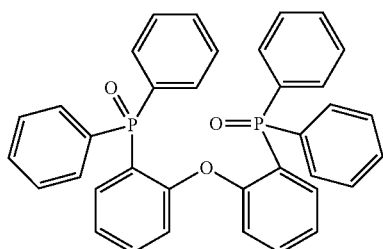
-continued
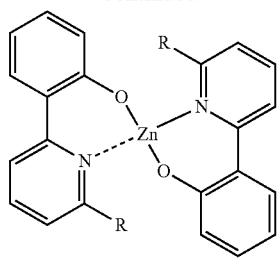
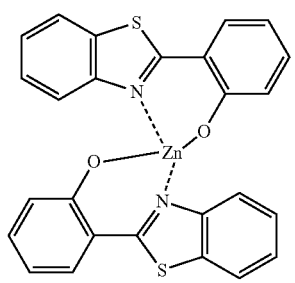
74
R = H
R = : 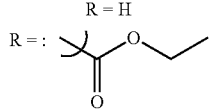
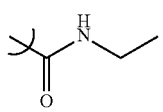
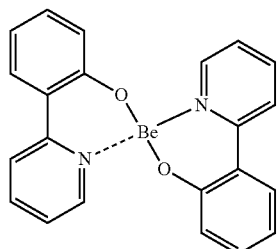
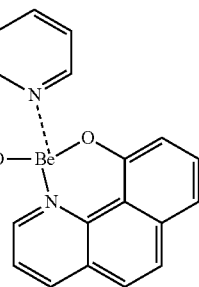
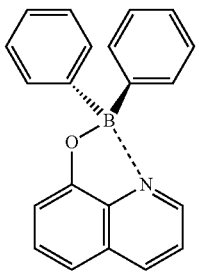
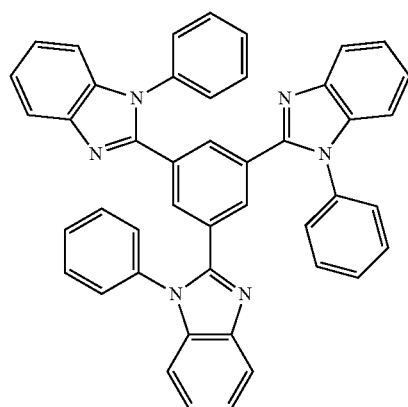
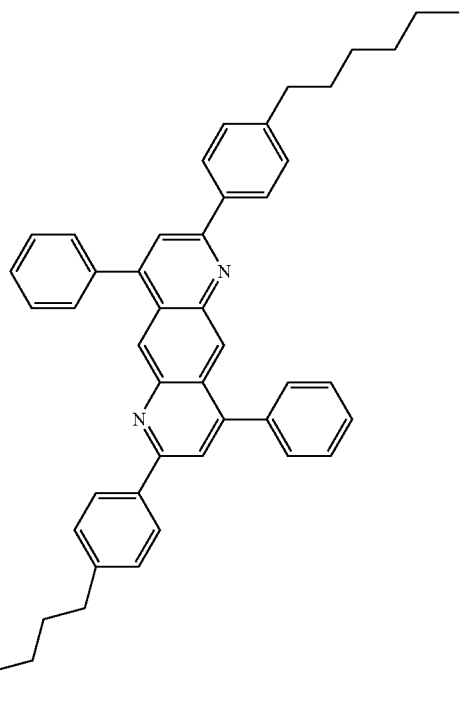

75 76
-continued
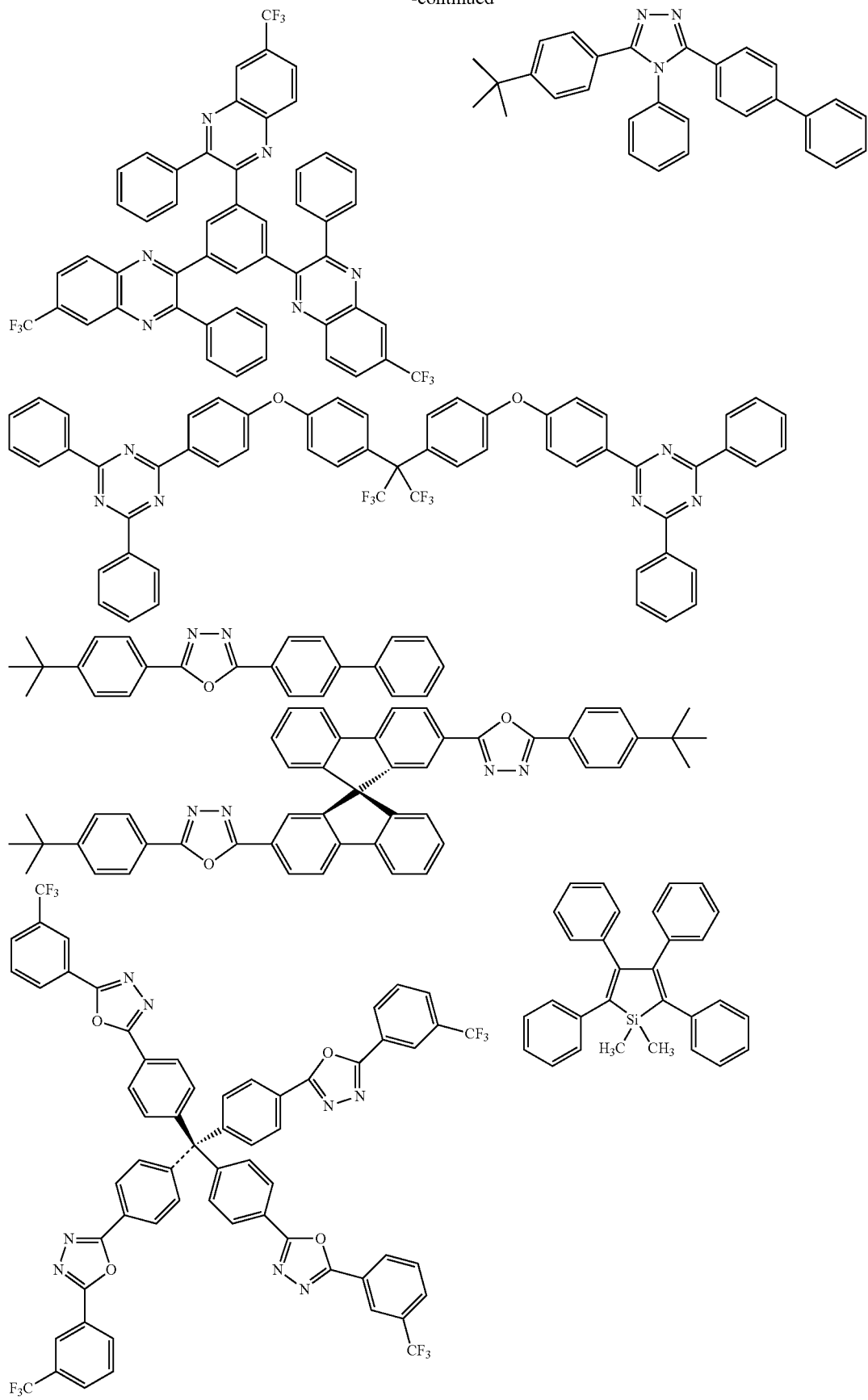

-continued
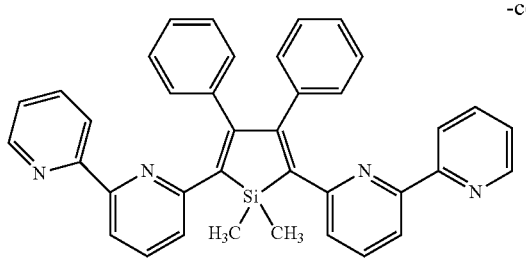
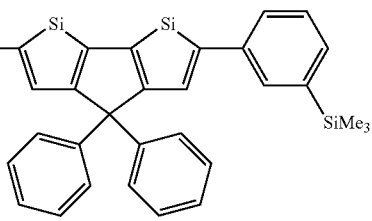
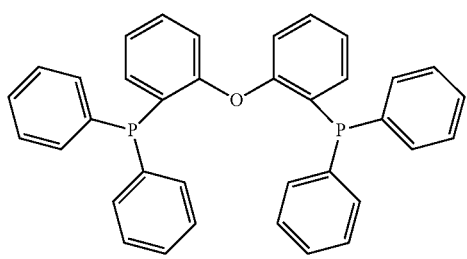
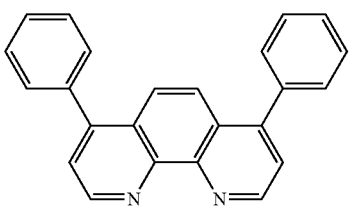
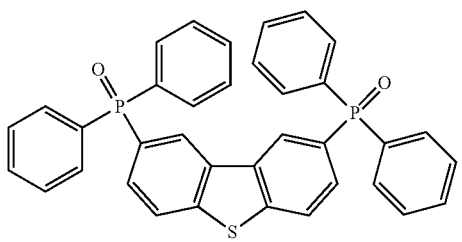
Preferred examples of a compound that may be used as the electron injection material are shown below.
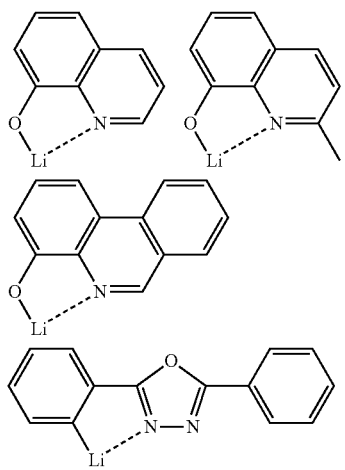
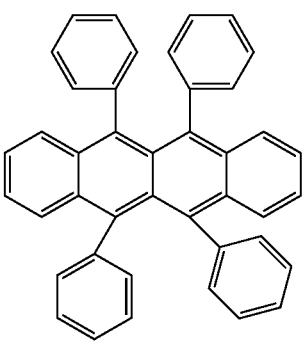
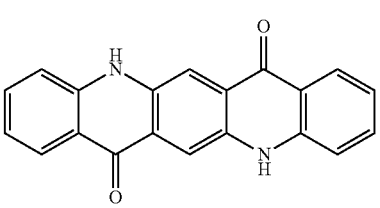
Preferred examples of a compound as a material that may be added are shown below. For example, the compound may be added as a stabilizing material.

-continued

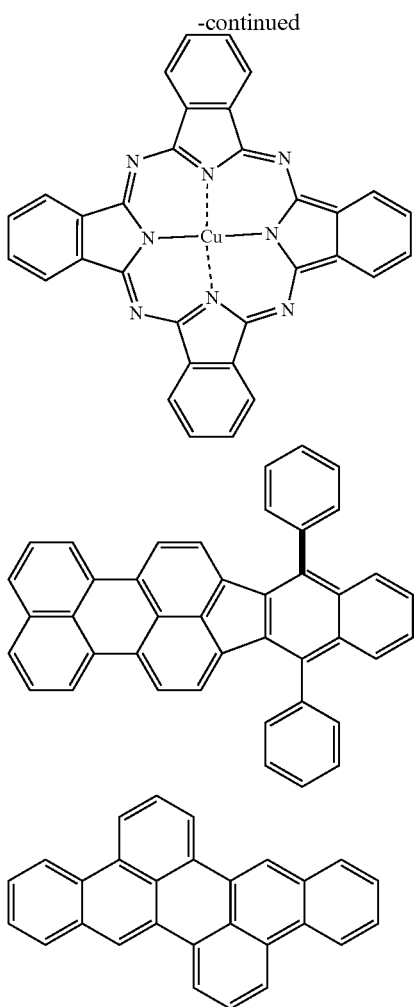

The film forming methods of the organic layers described above are not particularly limited, and the layers may be produced by any of a dry process and a wet process.

Substrate

The organic electroluminescent device of the invention is preferably supported by a substrate. The substrate is not particularly limited and may be those that have been commonly used in an organic electroluminescent device, and examples thereof used include those formed of glass, transparent plastics, quartz and silicon.

Anode

The anode of the organic electroluminescent device used is preferably formed of as an electrode material a metal, an alloy or an electroconductive compound each having a large work function (4 eV or more), or a mixture thereof. Specific examples of the electrode material include a metal, such as Au, and an electroconductive transparent material, such as CuI, indium tin oxide (ITO), $SnO_2$ and ZnO. A material that is amorphous and is capable of forming a transparent electroconductive film, such as IDIXO ($In_2O_3$—ZnO), may also be used. The anode may be formed in such a manner that the electrode material is formed into a thin film by such a method as vapor deposition or sputtering, and the film is patterned into a desired pattern by a photolithography method, or in the case where the pattern may not require high accuracy (for example, approximately 100 μm or more), the pattern may be formed with a mask having a desired shape on vapor deposition or sputtering of the electrode material. In alternative, in the case where a material capable of being applied as a coating, such as an organic electroconductive compound, is used, a wet film forming method, such as a printing method and a coating method, may be used. In the case where emitted light is to be taken out through the anode, the anode preferably has a transmittance of more than 10%, and the anode preferably has a sheet resistance of several hundred ohm per square or less. The thickness thereof may be generally selected from a range of from 10 to 1,000 nm, and preferably from 10 to 200 nm, while depending on the material used.

Cathode

The cathode is preferably formed of as an electrode material a metal having a small work function (4 eV or less) (referred to as an electron injection metal), an alloy or an electroconductive compound each having a small work function (4 eV or less), or a mixture thereof. Specific examples of the electrode material include sodium, a sodium-potassium alloy, magnesium, lithium, a magnesium-cupper mixture, a magnesium-silver mixture, a magnesium-aluminum mixture, a magnesium-indium mixture, an aluminum-aluminum oxide ($Al_2O_3$) mixture, indium, a lithium-aluminum mixture, and a rare earth metal. Among these, a mixture of an electron injection metal and a second metal that is a stable metal having a larger work function than the electron injection metal, for example, a magnesium-silver mixture, a magnesium-aluminum mixture, a magnesium-indium mixture, an aluminum-aluminum oxide ($Al_2O_3$) mixture, a lithium-aluminum mixture, and aluminum, are preferred from the standpoint of the electron injection property and the durability against oxidation and the like. The cathode may be produced by forming the electrode material into a thin film by such a method as vapor deposition or sputtering. The cathode preferably has a sheet resistance of several hundred ohm per square or less, and the thickness thereof may be generally selected from a range of from 10 nm to 5 μm, and preferably from 50 to 200 nm. For transmitting the emitted light, any one of the anode and the cathode of the organic electroluminescent device is preferably transparent or translucent, thereby enhancing the light emission luminance.

The cathode may be formed with the electroconductive transparent materials described for the anode, thereby forming a transparent or translucent cathode, and by applying the cathode, a device having an anode and a cathode, both of which have transmittance, may be produced.

The organic electroluminescent device of the invention has the aforementioned structure, and emits light on application of an electric field between the anode and the cathode of the device. At this time, in the organic electroluminescent device having the delayed fluorescent exciplex layer, the singlet excited state is efficiently formed in the delayed fluorescent exciplex layer, and the energy of the singlet excited state is transferred to the light emitting material in the light emitting layer, by which the light emitting material efficiently emits fluorescent light. According to the mechanism, the organic electroluminescent device of the invention achieves a high light emission efficiency.

The organic electroluminescent device of the invention may be applied to any of a single device, a structure with plural devices disposed in an array, and a structure having anodes and cathodes disposed in an X-Y matrix. According to the invention, an organic light emitting device that is largely improved in light emission efficiency may be obtained by adding the compound represented by the general formula (1) in the light emitting layer. The organic light emitting device, such as the organic electroluminescent device, of the invention may be applied to a further wide range of purposes. For example, an organic electroluminescent display apparatus may be produced with the organic electroluminescent device of the invention, and for the details thereof, reference may be made to S. Tokito, C. Adachi and H. Murata, "Yuki EL Display" (Organic EL Display) (Ohmsha, Ltd.). In particular, the organic electroluminescent device of the invention may be applied to organic electroluminescent illumination and backlight which are highly demanded.

EXAMPLES

The features of the invention will be described more specifically with reference to synthesis examples and working examples below. The materials, processes, procedures and the like shown below may be appropriately modified unless they deviate from the substance of the invention. Accordingly, the scope of the invention is not construed as being limited to the specific examples shown below. The light emission characteristics were evaluated by using Spectrophotometer (FluoroMax-4, produced by Horiba, Ltd.), UV-VIS Spectrophotometer (UV-2550, produced by Shimadzu Corporation), Absolute PL Quantum Yield Measurement System (produced by Hamamatsu Photonics K.K.), Fluorescence Lifetime Spectrometer (Quantaurus-tau, produced by Hamamatsu Photonics K.K.), and Streak Camera (Model C4334, produced by Hamamatsu Photonics K.K.). The organic layers were formed by a vacuum vapor deposition method under a vacuum degree of from $1.0\times10^{-4}$ to $1.0\times10^{-3}$ Pa. The values of the lowest singlet excitation energy levels and the lowest triplet excitation energy levels of the materials used in Examples and Comparative Examples are shown in Table 2 described later.

Example 1

A glass substrate having formed thereon an anode formed of indium tin oxide (ITO) having a thickness of 100 nm was prepared. On the anode of the glass substrate, CzTTP1 was formed to a thickness of 35 mm to provide a hole transporting layer. CzTTP1 and PPT were then vapor-co-deposited from separate vapor deposition sources to form a layer having a thickness of 30 nm, which was designated as a delayed fluorescent exciplex layer. At this time, the concentration of CzTTP1 was 30% by mol. C545T and PPT were then vapor-co-deposited from separate vapor deposition sources to form a layer having a thickness of 10 nm, which was designated as a light emitting layer. At this time, the concentration of C545T was 1% by weight. PPT was then formed to a thickness of 25 nm to provide an electron transporting layer. Furthermore, lithium fluoride (LiF) was vacuum vapor-deposited to a thickness of 0.8 nm, and then aluminum (Al) was vapor-deposited to a thickness of 80 nm to form a cathode, thereby completing an organic electroluminescent device.

Example 2

An organic electroluminescent device was produced in the same manner as in Example 1 except that dPTBdA was used instead of CzTTP1 as the material for the hole transporting layer and the donor compound of the delayed fluorescent exciplex layer.

Example 3

An organic electroluminescent device was produced in the same manner as in Example 2 except that the concentration of dPTBdA in the delayed fluorescent exciplex layer was changed to 50% by mol.

Example 4

Study on Thickness of Triplet Exciton Blocking Layer

Figure 2:
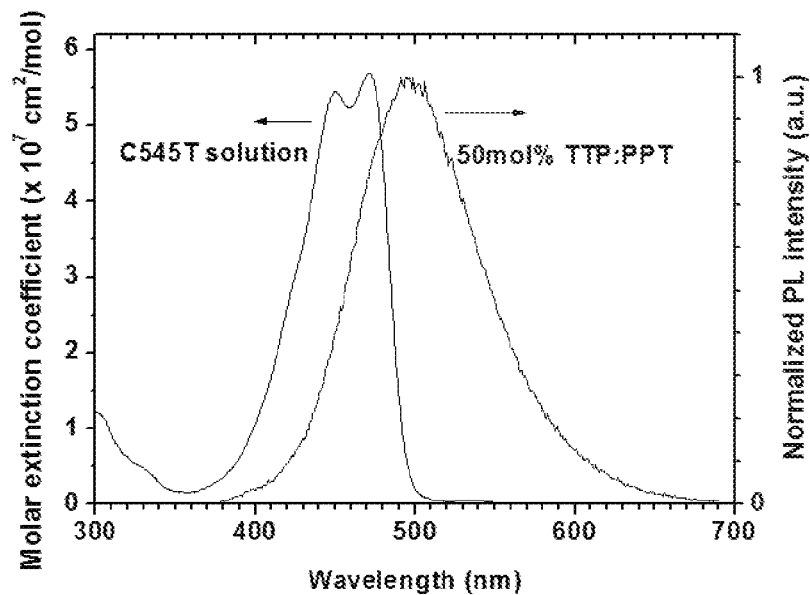
FIG. 2 shows the light emission spectrum of the TTP-PPT vapor deposition film and the absorption spectrum of the toluene solution of C545T.

In this example, for forming a triplet exciton blocking layer (mCP vapor deposition film) between a light emitting layer (C545T-CBP vapor deposition film) and a delayed fluorescent exciplex layer (TTP-PPT vapor deposition film), the thickness of the triplet exciton blocking layer was studied as a preliminary experiment.
(1) Foerster Energy Transfer Radius $R_0$ of Delayed Fluorescent Exciplex Layer and Light Emitting Layer FIG. 2 shows the light emission spectrum of a TTP-PPT vapor deposition film obtained by vapor co-deposition of TTP and PPT each at a concentration of 50% by mol, and the absorption spectrum of a toluene solution of C545T. It was expected from FIG. 2 that the Foerster energy transfer radius $R_0$ of the TTP-PPT vapor deposition film and C454T was 3.5 nm, and the upper limit of the thickness of the triplet exciton blocking layer was approximately (3.5+1) nm.
(2) Study from PL Quantum Yield On a glass substrate, α-NPD was formed to a thickness of 10 nm. C545T and CBP were then vapor-co-deposited from separate vapor deposition sources to form a layer having a thickness of 10 nm, which was designated as a light emitting layer. At this time, the concentration of C545T was 2.5% by weight. mCP was then formed to a thickness selected from a range of from 0 to nm to provide an mCP film. TTP and PPT were then vapor-co-deposited from separate vapor deposition sources to form a layer having a thickness of 10 nm, which was designated as a delayed fluorescent exciplex layer. At this time, the concentrations of TTP and PPT each were 50% by mol. According to the procedures, specimens having different thicknesses for the mCP film were produced.

Figure 3:
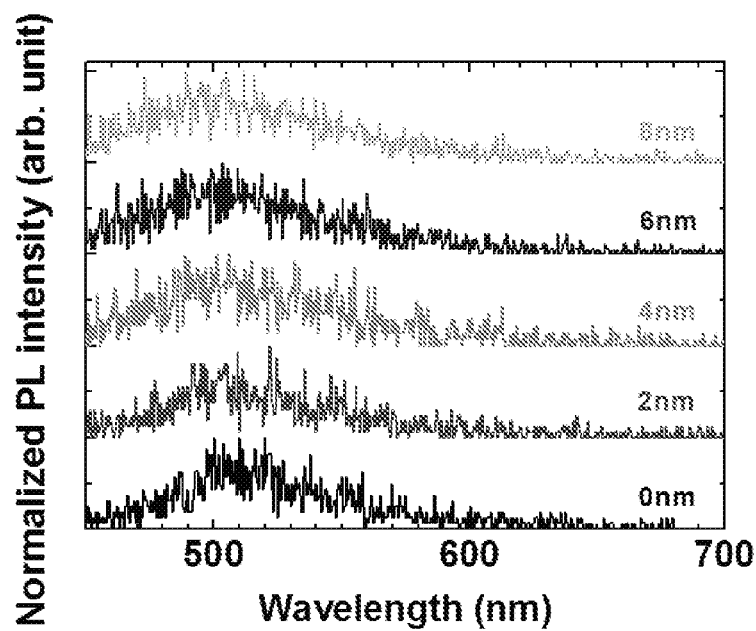
FIG. 3 shows the delayed fluorescence spectra of the specimens having an mCP film formed to a thickness of from 0 to 8 nm.
Figure 4:
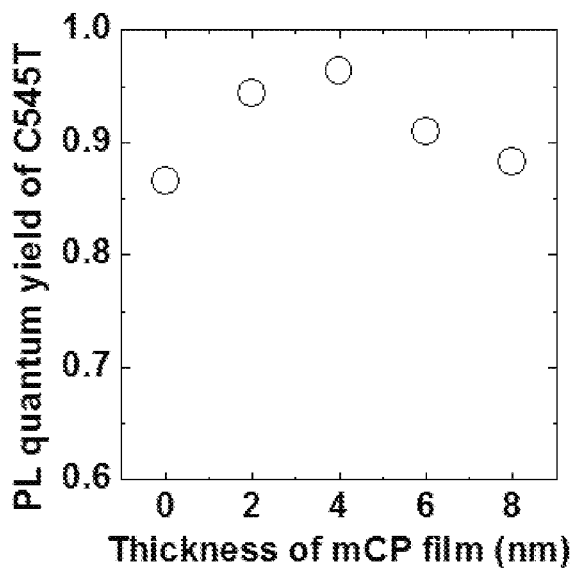
FIG. 4 is a graph of the PL quantum yield plotted on the thickness of the mCP film.

For the specimens thus produced, FIG. 3 shows the delayed fluorescence spectra, and FIG. 4 shows the result obtained by plotting the PL quantum yield on the thickness of the mCP film.

In FIG. 3, the peaks observed in a range of from 450 to 490 nm are derived from delayed fluorescence from the delayed fluorescent exciplex layer, and the presence of the peaks observed means that the Dexter transfer of the triplet excitation energy from the delayed fluorescent exciplex layer to the light emitting layer is suppressed. In this point of view, peaks derived from delayed fluorescence were observed on the short wavelength side for the specimens having the mCP film to a thickness of from 2 to 8 nm, but in the specimen having no mCP film formed, the peak derived from delayed fluorescence disappeared. It was understood therefrom that the mCP film had a function of suppressing the Dexter transfer of the triplet excitation energy from the delayed fluorescent exciplex layer to the light emitting layer.

It was found from FIG. 4 that the PL quantum yield was the highest for the specimen having the mCP film having a thickness of 4 nm, and the specimens having the mCP film having a thickness of 2 nm, 6 nm, and 8 nm provided values that were higher than the specimen having no mCP film formed, but were lower than the specimen having the mCP film having a thickness of 4 nm. It was understood therefrom that the thickness of the mCP film was preferably from 2 to 8 nm, and was optimally 4 nm.

(3) Production of Organic Electroluminescent Device

An organic electroluminescent device having an mCP film having a thickness of 4 nm as a triplet exciton blocking layer was produced in the following manner.

A glass substrate was prepared that had an anode formed of an indium tin oxide film (ITO film) having a thickness of 100 nm and a $MoO_x$ film having a thickness of 1 nm. On the anode of the glass substrate, α-NPD was formed to a thickness of 40 nm to provide a hole transporting layer. C545T and CBP were then vapor-co-deposited from separate vapor deposition sources to form a layer having a thickness of 10 nm, which was designated as a light emitting layer. At this time, the concentration of C545T was 2.5% by weight. mCP was then formed to a thickness of 4 nm to provide a triplet exciton blocking layer. TTP and PPT were then vapor-co-deposited from separate vapor deposition sources to form a layer having a thickness of 30 nm, which was designated as a delayed fluorescent exciplex layer. At this time, the concentration of TTP was 50% by mol. PPT was then formed to a thickness of 40 nm to provide an electron transporting layer. Furthermore, lithium fluoride (LiF) was vapor-deposited to a thickness of 0.75 nm, and then aluminum (Al) was vapor-deposited to a thickness of 70 nm to form a cathode, thereby completing an organic electroluminescent device.

Comparative Example 1

A glass substrate was prepared that had an anode formed of an indium tin oxide film (ITO film) having a thickness of 100 nm. On the anode of the glass substrate, TTP was formed to a thickness of 20 nm to provide a hole transporting layer. TTP and PPT were then vapor-co-deposited from separate vapor deposition sources to form a layer having a thickness of 60 nm, which was designated as a light emitting layer. At this time, the concentration of TTP was 50% by mol. PPT was then formed to a thickness of 20 nm to provide an electron transporting layer. Furthermore, lithium fluoride (LiF) was vapor-deposited to a thickness of 0.75 nm, and then aluminum (Al) was vapor-deposited to a thickness of 70 nm to form a cathode, thereby completing an organic electroluminescent device.

Evaluation (1) Light Emission Characteristics of Light Emitting Material

Figure 5:
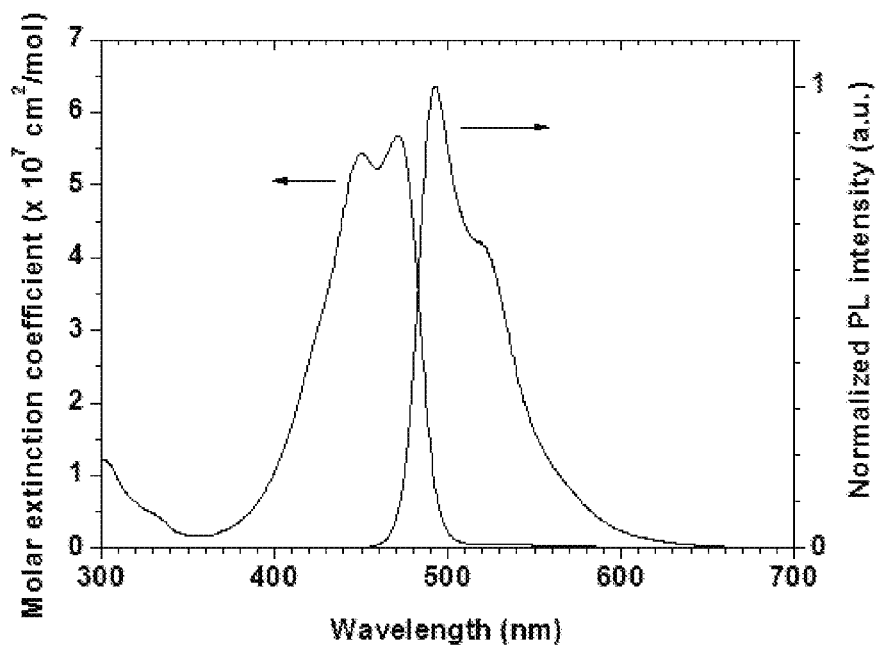
FIG. 5 shows the light emission spectrum and the absorption spectrum of the toluene solution of C545T.

FIG. 5 shows the light emission spectrum and the absorption spectrum of the toluene solution of C545T. The toluene solution of C545T had a PL quantum yield of 91.3%.

(2) Light Emission Characteristics of Delayed Fluorescent Exciplex Layer

Figure 6:
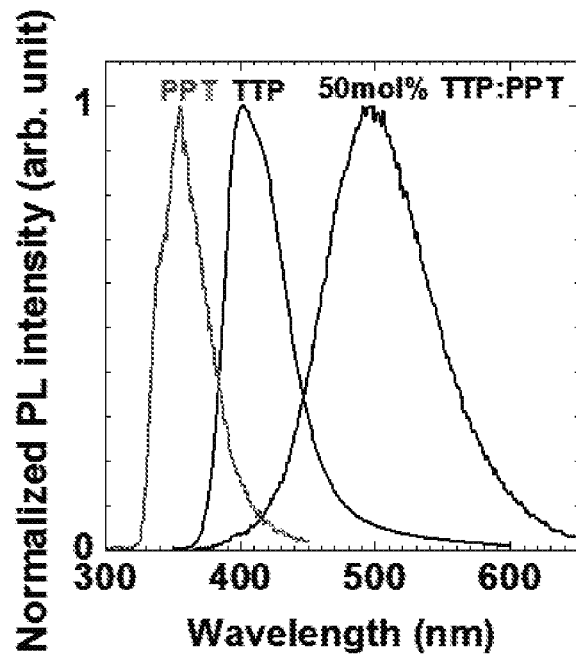
FIG. 6 shows the light emission spectra of the TTP-PPT vapor deposition film, the TTP vapor deposition film, and the PPT vapor deposition film.
Figure 7:
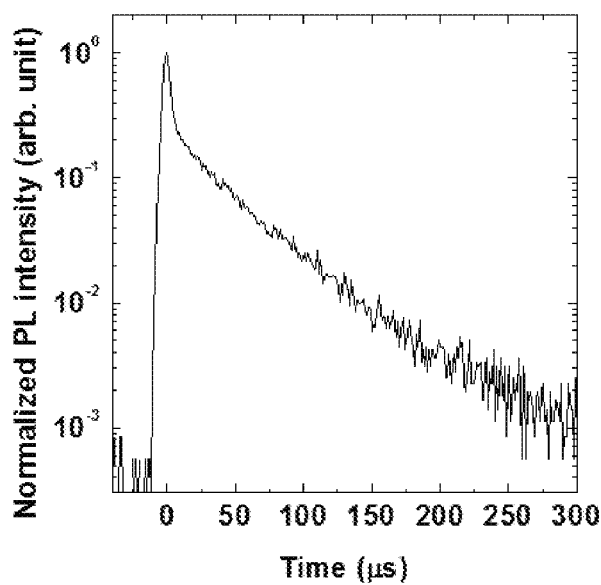
FIG. 7 shows the transient decay curve of the TTP-PPT vapor deposition film.
Figure 8:
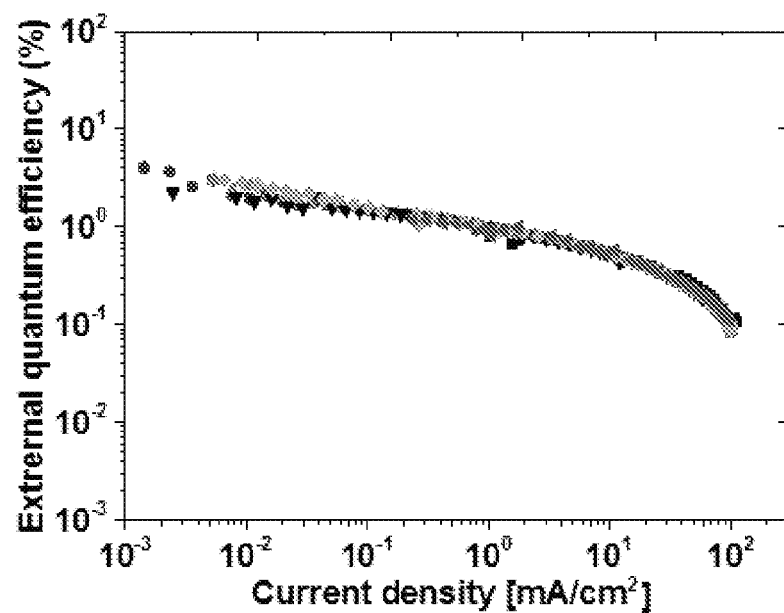
FIG. 8 is a graph showing the current density-external quantum efficiency characteristics of the organic electroluminescent device produced in Example 1.
Figure 9:
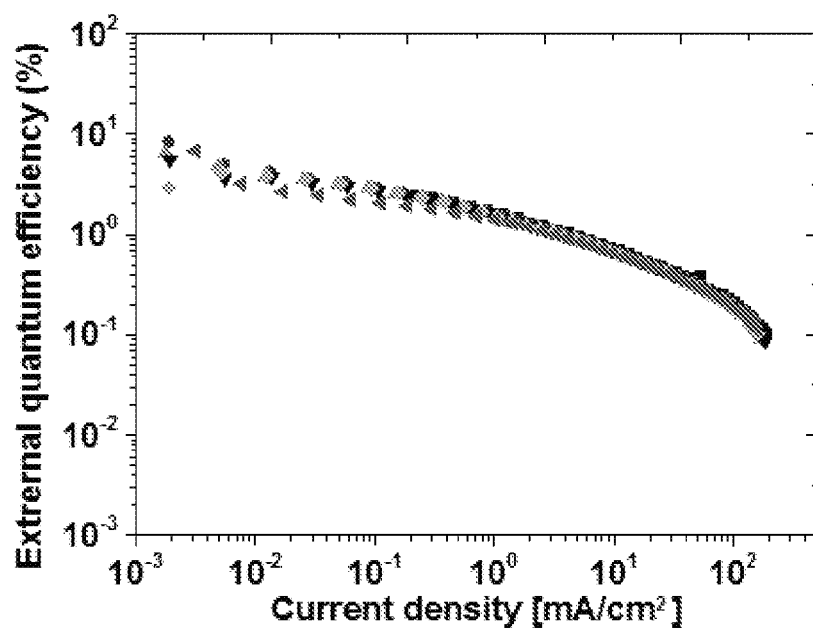
FIG. 9 is a graph showing the current density-external quantum efficiency characteristics of the organic electroluminescent device produced in Example 2.
Figure 10:
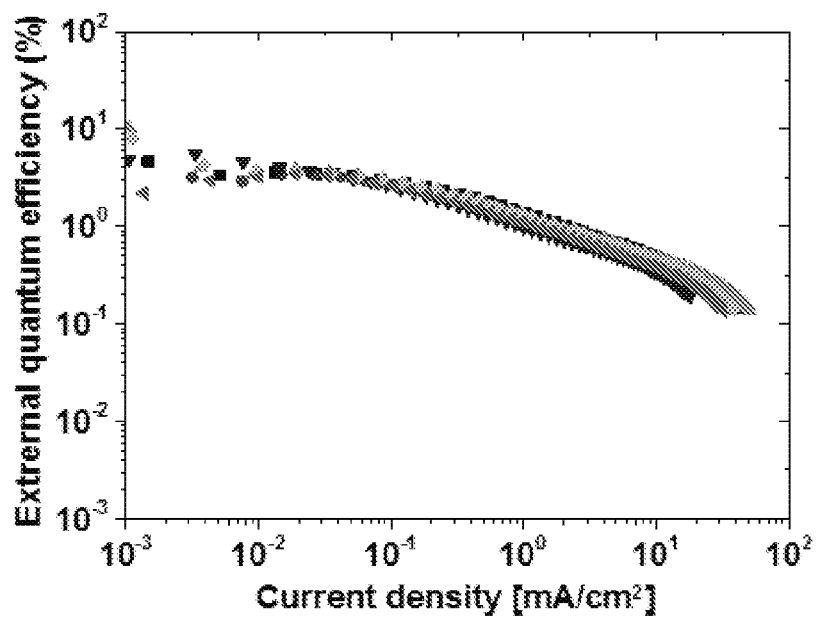
FIG. 10 is a graph showing the current density-external quantum efficiency characteristics of the organic electroluminescent device produced in Example 3.

As a representative example, FIG. 6 shows the light emission spectra of the TTP-PPT vapor deposition film obtained by vapor co-deposition of TTP and PPT each at a concentration of 50% by mol, the TTP vapor deposition film, and the PPT vapor deposition film, and FIG. 7 shows the transient decay curve of the TTP-PPT vapor deposition film. The TTP-PPT vapor deposition film had a PL quantum yield of 15.6%, and the PL quantum yield of the delayed fluorescent component therein was 12.3%. The TTP-PPT vapor deposition film had a singlet exciton formation efficiency of from 65 to 100%, which was obtained from the measurement result of the external quantum efficiency of Comparative Example 1 described later.

(3) External Quantum Efficiency of Organic Electroluminescent Devices

Figure 11:
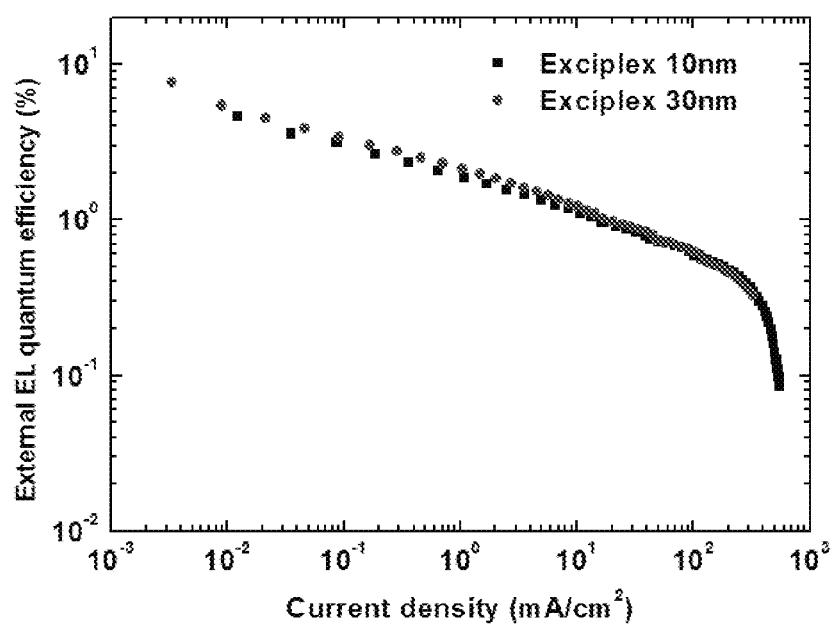
FIG. 11 is a graph showing the current density-external quantum efficiency characteristics of the organic electroluminescent device produced in Example 4.
Figure 12:
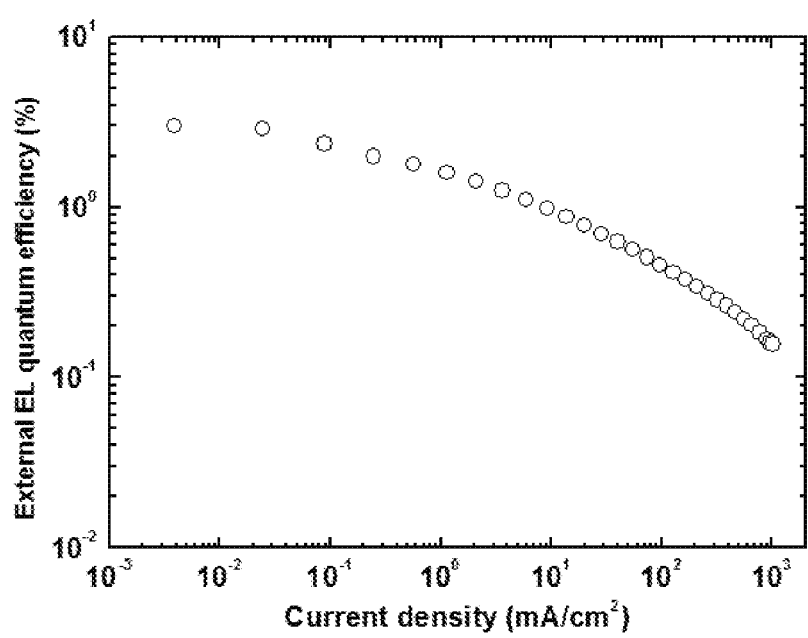
FIG. 12 is a graph showing the current density-external quantum efficiency characteristics of the organic electroluminescent device produced in Comparative Example 1.

For the organic electroluminescent devices thus produced, the current density-external quantum efficiency characteristics are shown in FIGS. 8 to 12, and the external quantum efficiencies are shown in Table 3. FIG. 11 also shows the measurement result of the device, in which the thickness of the delayed fluorescent exciplex layer was changed to 10 nm.

TABLE 2

| | Lowest singlet excitation energy level (eV) | Lowest triplet excitation energy level (eV) |
|---|---|---|
| CBP (host for light emitting layer) | 3.2 | 2.6 |
| PPT (host for light emitting layer) | 3.5 | 2.8 |
| C545T (guest for light emitting layer) | 2.4 | — |
| CzTTP1 (donor) | 3.2 | 2.8 |
| dPTBdA (donor) | 3.1 | 2.7 |
| TTP (donor) | 3.1 | 2.7 |
| PPT (acceptor) | 3.5 | 2.8 |
| mCP (exciton blocking layer) | 3.6 | 2.8 |

TABLE 3

| | Light emitting layer | | Delayed fluorescent exciplex layer | | | Presence of triplet exciton blocking layer | Maximum external quantum efficiency (%) |
|---|---|---|---|---|---|---|---|
| | Materials for light emitting layer | Concertation of C545T (% by weight) | Donor compound | Acceptor compound | Concentration of donor compound (% by mol) | | |
| Example 1 | C545T + PPT | 1 | CzTTP1 | PPT | 30 | no | 4.0 |
| Example 2 | C545T + PPT | 1 | dPTBdA | PPT | 30 | no | 8.4 |
| Example 3 | C545T + PPT | 1 | dPTBdA | PPT | 50 | no | 5.6 |
| Example 4 | C545T + CBP | 2.5 | TTP | PPT | 50 | yes | 7.7 |
| Comparative Example 1 | TTP + PPT | — | — | — | — | — | 3.0 |

As shown in Table 3, the electroluminescent devices of Examples 1 to 4 each provided a higher maximum external quantum efficiency than the organic electroluminescent device of Comparative Example 1. In particular, the organic electroluminescent device of Example 2 provided a considerably high maximum external quantum efficiency of 8.4% irrespective of the simple structure thereof having no triplet exciton blocking layer.

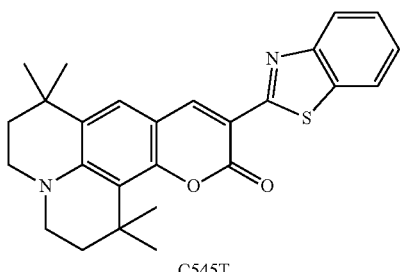

C545T

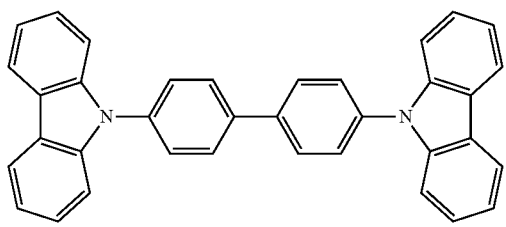

CBP

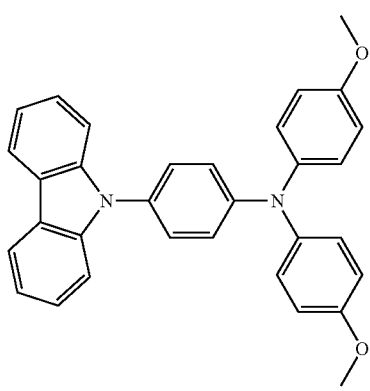

CzTTP1

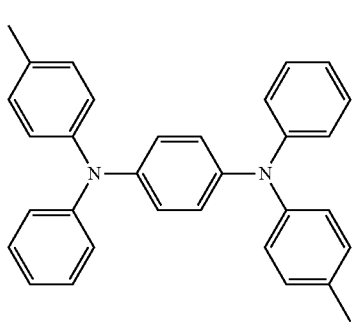

dPTBdA

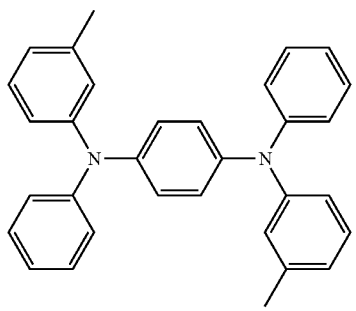

TTP

-continued

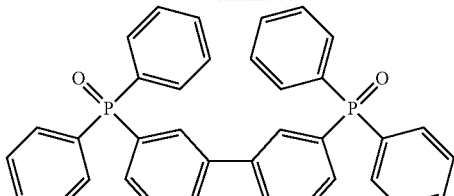

PPT

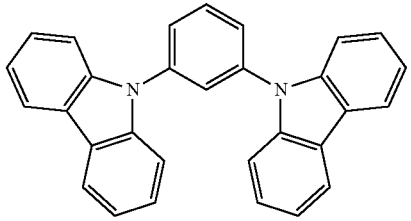

mCP

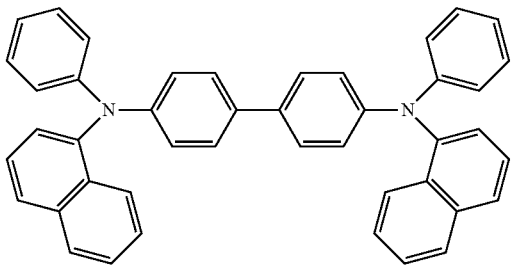

α-NPD

INDUSTRIAL APPLICABILITY

The organic electroluminescent device of the invention provides a high light emission efficiency, and thus can be applied as an image display device to various equipments. Accordingly, the invention has high industrial applicability.

REFERENCE SIGN LIST

1 substrate
2 anode
3 hole injection layer
4 hole transporting layer
5 light emitting layer
6 triplet exciton blocking layer
7 delayed fluorescent exciplex layer
8 electron transporting layer
9 cathode

The invention claimed is:

1. An organic electroluminescent device comprising organic layers including a light emitting layer and a delayed fluorescent exciplex layer containing a donor compound and an acceptor compound, between a pair of electrodes, the delayed fluorescent exciplex layer being distinct from the light emitting layer.

2. The organic electroluminescent device according to claim 1, wherein
the light emitting layer contains a host compound and a guest compound as a light emitting material, and
the host compound, the guest compound, the donor compound, and the acceptor compound satisfy the condition shown by the following expression (1):

$$ES_1 > ES_1^G \text{ and } ES_1^H > ES_1^G \qquad (1)$$

wherein in the expression (1), $ES_1$ represents a lowest singlet excitation energy level of an exciplex formed with the donor compound and the acceptor compound; $ES_1^H$ represents a lowest singlet excitation energy level of the host compound; and $ES_1^G$ represents a lowest singlet excitation energy level of the guest compound.

3. The organic electroluminescent device according to claim 1, wherein the organic layers include a triplet exciton blocking layer that suppresses transfer of triplet excitation energy from the delayed fluorescent exciplex layer to the light emitting layer, between the light emitting layer and the delayed fluorescent exciplex layer.

4. The organic electroluminescent device according to claim 2, wherein the guest compound contained in the light emitting layer is a fluorescent material.

5. The organic electroluminescent device according to claim 3, wherein the triplet exciton blocking layer contains a blocking compound that satisfies the condition shown by the following expression (2) with respect to the host compound, the guest compound, the donor compound, and the acceptor compound:

$$ET_1^B > ET_1 > ET_1^H > ET_1^G \quad (2)$$

wherein in the expression (2), $ET_1^B$ represents a lowest triplet excitation energy level of the blocking compound; $ET_1$ represents a lowest triplet excitation energy level of an exciplex formed with the donor compound and the acceptor compound; $ET_1^H$ represents a lowest triplet excitation energy level of the host compound; and $ET_1^G$ represents a lowest triplet excitation energy level of the guest compound.

6. The organic electroluminescent device according to claim 3, wherein the triplet exciton blocking layer has a thickness of 2 nm or more.

7. An organic electroluminescent device comprising organic layers including a light emitting layer and a delayed fluorescent exciplex layer containing a donor compound and an acceptor compound, between a pair of electrodes, wherein the organic layers include a triplet exciton blocking layer that suppresses transfer of triplet excitation energy from the delayed fluorescent exciplex layer to the light emitting layer, between the light emitting layer and the delayed fluorescent exciplex layer, and wherein the triplet exciton blocking layer has a thickness of from 2 to 8 nm.

8. An organic electroluminescent device comprising organic layers including a light emitting layer and a delayed fluorescent exciplex layer containing a donor compound and an acceptor compound, between a pair of electrodes, wherein the organic layers include a triplet exciton blocking layer that suppresses transfer of triplet excitation energy from the delayed fluorescent exciplex layer to the light emitting layer, between the light emitting layer and the delayed fluorescent exciplex layer, and wherein the triplet exciton blocking layer has a thickness of from 3.5 to 4.5 nm.

\* \* \* \* \*